US010913758B2

(12) United States Patent
Choi et al.

(10) Patent No.: US 10,913,758 B2
(45) Date of Patent: Feb. 9, 2021

(54) ORGANOMETALLIC COMPOUND, ORGANIC LIGHT-EMITTING DEVICE INCLUDING THE ORGANOMETALLIC COMPOUND, AND DIAGNOSTIC COMPOUND INCLUDING THE ORGANOMETALLIC COMPOUND

(71) Applicant: Samsung Electronics Co., Ltd., Suwon-si (KR)

(72) Inventors: Whail Choi, Seoul (KR); Seungyeon Kwak, Suwon-si (KR); Hyun Koo, Seongnam-si (KR); Sungjun Kim, Seongnam-si (KR); Jiwhan Kim, Seoul (KR); Hyeonho Choi, Seoul (KR); Seokhwan Hong, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 366 days.

(21) Appl. No.: 15/937,024

(22) Filed: Mar. 27, 2018

(65) Prior Publication Data

US 2018/0273562 A1 Sep. 27, 2018

(30) Foreign Application Priority Data

Mar. 27, 2017 (KR) .................. 10-2017-0038713

(51) Int. Cl.
*C07F 15/00* (2006.01)
*C09K 11/06* (2006.01)
*H01L 51/50* (2006.01)
*H01L 51/00* (2006.01)

(52) U.S. Cl.
CPC ........ *C07F 15/002* (2013.01); *C07F 15/0026* (2013.01); *C07F 15/0086* (2013.01); *C09K 11/06* (2013.01); *H01L 51/0087* (2013.01); *H01L 51/0088* (2013.01); *H01L 51/5012* (2013.01); *C09K 2211/104* (2013.01); *C09K 2211/1033* (2013.01); *C09K 2211/1055* (2013.01); *C09K 2211/185* (2013.01); *H01L 51/0081* (2013.01); *H01L 51/5016* (2013.01)

(58) Field of Classification Search
CPC ............. H01L 51/5012; H01L 51/0087; H01L 51/0088; H01L 51/5016; H01L 51/0081; H01L 51/0032; C07F 15/002; C07F 15/0026; C07F 15/0086; C07F 15/00; C09K 11/06; C09K 2211/1055; C09K 2211/185; C09K 2211/104; C09K 2211/1033
See application file for complete search history.

(56) References Cited

U.S. PATENT DOCUMENTS 9,634,268 B2   4/2017 Stoessel et al.
10,023,598 B2  7/2018 Choi et al.

2007/0001166 A1   1/2007 Tao et al.
2007/0224447 A1*  9/2007 Sotoyama ............ C07D 217/14
                                                        428/690
2009/0001875 A1   1/2009 Chi et al.
2009/0039767 A1*  2/2009 Haga .................... H01L 51/5016
                                                        313/504
2015/0076454 A1   3/2015 Tsai
(Continued)

FOREIGN PATENT DOCUMENTS

DE   10-2012-020167 A1   4/2014
EP         3130595 A1    2/2017
(Continued)

OTHER PUBLICATIONS

Extended European Search Report issued by the European Patent Office dated Jun. 6, 2018 in examination of the European Patent Application No. 18164177.0-1109.

*Primary Examiner* — Robert S Jones, Jr.
(74) *Attorney, Agent, or Firm* — Cantor Colburn LLP

(57) ABSTRACT

An organometallic compound represented by Formula 1:

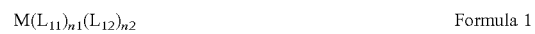

$M(L_{11})_{n1}(L_{12})_{n2}$  Formula 1 wherein, in Formula 1, M is a third row transition metal, $L_{11}$ is a ligand represented by Formula 2, n1 is 1 or 2, and when n1 is two, two groups $L_{11}$ are identical to or different from each other, $L_{12}$ is an organic ligand, n2 is 0, 1, 2, or 3, and when n2 is two or more, two or more of groups $L_{12}$ are identical to or different from each other:

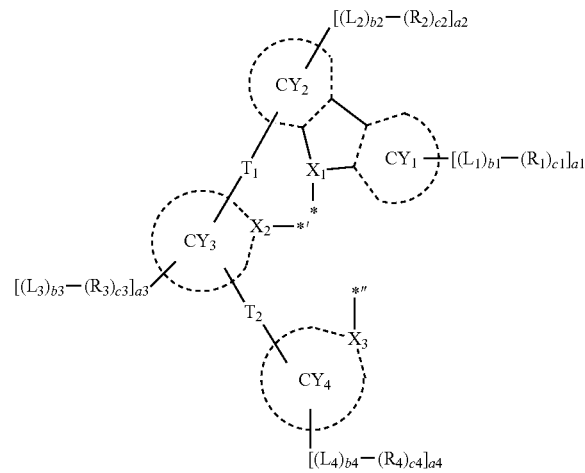

Formula 2 wherein, in Formula 2, groups and variables are the same as described in the specification.

20 Claims, 1 Drawing Sheet

(56) References Cited

U.S. PATENT DOCUMENTS

| 2015/0280147 | A1 | 10/2015 | Wesemann et al. |
| 2017/0062739 | A1 | 3/2017 | Choi et al. |
| 2018/0047913 | A1 | 2/2018 | Ono et al. |

FOREIGN PATENT DOCUMENTS

| KR | 10-2015-0129504 A | 11/2015 |
| KR | 10-2017-0024545 A | 3/2017 |
| WO | 2011-066898 A1 | 6/2011 |
| WO | 2014-042197 A1 | 3/2014 |
| WO | 2014-067598 A1 | 5/2014 |

* cited by examiner

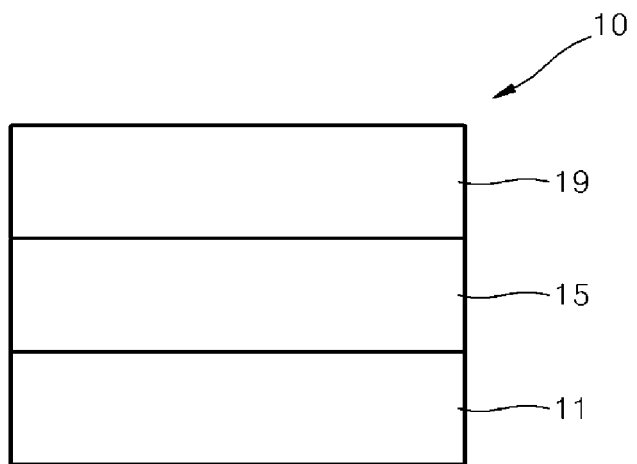

ORGANOMETALLIC COMPOUND, ORGANIC LIGHT-EMITTING DEVICE INCLUDING THE ORGANOMETALLIC COMPOUND, AND DIAGNOSTIC COMPOUND INCLUDING THE ORGANOMETALLIC COMPOUND

CROSS-REFERENCE TO RELATED APPLICATIONS

This application claims priority to Korean Patent Application No. 10-2017-0038713, filed on Mar. 27, 2017 in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have superior characteristics in terms of a viewing angle, a response time, a brightness, a driving voltage, and a response speed, and which produce full-color images.

In a typical example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

Provided are an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to an aspect of an embodiment, provided is an organometallic compound represented by Formula 1:

Formula 1
$$M(L_{11})_{n1}(L_{12})_{n2}$$

Formula 2

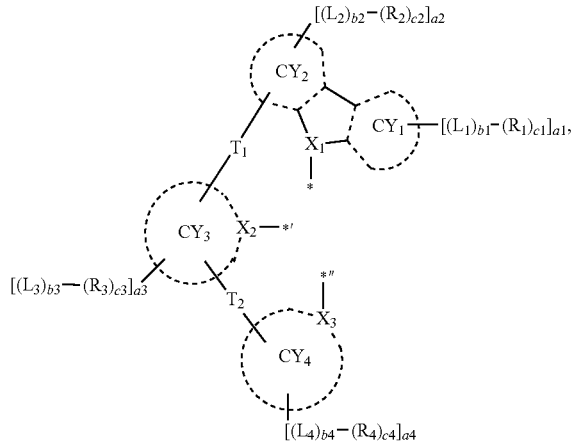

In Formulae 1 and 2,

M may be a third row transition metal, $L_{11}$ may be a ligand represented by Formula 2, n1 may be 1 or 2, and when n1 is two, two groups $L_{11}$ may be identical to or different from each other, $L_{12}$ may be an organic ligand, n2 may be 0, 1, 2, or 3, and when n2 is two or more, two or more of groups $L_{12}$ may be identical to or different from each other, $X_1$ may be $B(R_7)$, $N(R_7)$, $P(R_7)$, or $As(R_7)$, $X_2$ and $X_3$ may each be N or C, $CY_1$ to $CY_4$ may each independently be selected from a $C_5$-$C_{30}$ carbocyclic group and a $C_1$-$C_{30}$ heterocyclic group, $T_1$ and $T_2$ may each be selected from a single bond, a double bond, *—N[$(L_5)_{b5}$-$(R_5)_{c5}$]—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *C(=O)*', *—S(=O)—*', *—S(=O)$_2$—*', *—C($R_5$)=*', *=C($R_5$)—*', *—C($R_5$)=C($R_6$)—*', *—C(=S)—*', and *—C≡C—*', $L_1$ to $L_5$ may each independently be selected from a single bond, a substituted or unsubstituted $C_5$-$C_{30}$ carbocyclic group, and a substituted or unsubstituted $C_1$-$C_{30}$ heterocyclic group, b1 to b5 may each independently be an integer of 1 to 5, $R_5$ and $R_6$ may optionally be linked via a single bond or a first linking group to form a substituted or unsubstituted $C_5$-$C_{30}$ carbocyclic group or a substituted or unsubstituted $C_1$-$C_{30}$ heterocyclic group, $R_1$ to $R_7$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), c1 to c5 may each independently be an integer of 1 to 5, a1 to a4 may each independently be an integer of 0 to 20, two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, two or more of neighboring $R_1$ to $R_4$ may optionally be linked to form a substituted or unsubstituted $C_5$-$C_{30}$ carbocyclic group or a substituted or unsubstituted $C_1$-$C_{30}$ heterocyclic group,

*, *', and *" in Formula 2 each independently indicate a binding site to M of Formula 1, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substitute with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

According to an aspect of an embodiment, provided is an organic light-emitting device including:

a first electrode, a second electrode, and an organic layer disposed between the first electrode and the second electrode, wherein the organic layer includes an emission layer and at least one organometallic compound as described above.

In the organic layer, the organometallic compound may serve as a dopant.

According to an aspect of an embodiment, provided is a diagnostic composition including at least one organometallic compound represented by Formula 1.

BRIEF DESCRIPTION OF THE DRAWINGS

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided. The organometallic compound according to an embodiment may be represented by Formula 1 below:

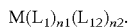

$$M(L_1)_{n1}(L_{12})_{n2}. \quad \text{Formula 1}$$

M in Formula 1 may be a third row transition metal.

For example, M in Formula 1 may be Os, Pt, Pd, Au, Ru, Re, Rd, Rh, or Ir, but embodiments of the present disclosure are not limited thereto.

In an embodiment, M in Formula 1 may be Os, Ru, Pt, or Pd, but embodiments of the present disclosure are not limited thereto.

The organometallic compound represented by Formula 1 may be a neutral compound which is not composed of an ion pair of a cation and an anion.

In Formula 1, $L_{11}$ may be a ligand represented by Formula 2, n1 may be 1 or 2, and when n1 is two, two groups $L_{11}$ may be identical to or different from each other, $L_{12}$ may be an organic ligand, and n2 may be 0, 1, 2, or 3, and when n2 is two or more, two or more of groups $L_{12}$ may be identical to or different from each other.

Formula 2

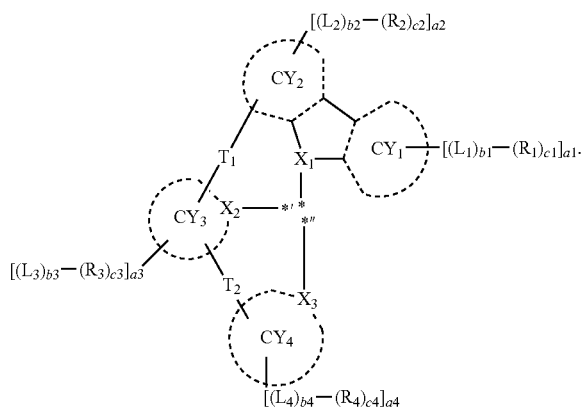

In an embodiment, in Formula 1, M may be Os, and n1 may be 1 or 2. In one or more embodiments, in Formula 1, M may be Pt, n1 and n2 may each be 1, and $L_{12}$ may be a monodentate organic ligand, but embodiments of the present disclosure are not limited thereto.

In Formula 2, $X_1$ may be $B(R_7)$, $N(R_7)$, $P(R_7)$, or $As(R_7)$.

$R_7$ may not be not linked to M of Formula 1, and in addition, may not be linked to any of $CY_1$ to $CY_4$, $T_1$, and $T_2$ of Formula 2.

For example, $X_1$ may be $P(R_7)$, but embodiments of the present disclosure are not limited thereto.

In Formula 2, $X_2$ and $X_3$ may each independently be N or C.

In Formulae 1 and 2, at least one selected from a bond between $X_2$ and M and a bond between $X_3$ and M may be a covalent bond.

For example, in Formulae 1 and 2, one selected from a bond between $X_2$ and M and a bond between $X_3$ and M may be a covalent bond, and the other bond may be a covalent bond or a coordination bond.

For example, $X_2$ may be N and $X_3$ may be C; $X_2$ may be C and $X_3$ may be N; or $X_2$ and $X_3$ may be both N.

In Formula 2, $CY_1$ to $CY_4$ may each independently be selected from a $C_5$-$C_{30}$ carbocyclic group and a $C_1$-$C_{30}$ heterocyclic group.

For example, $CY_1$ to $CY_4$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a pyrrole group, a thiophene group, a furan group, an indole group, an isoindole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group.

In Formula 2, $T_1$ and $T_2$ may each independently be selected from a single bond, a double bond, *—N[($L_5$)$_{b5}$-($R_5$)$_{c5}$]—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*'.

$L_1$ to $L_5$ may each independently be selected from a single bond, a substituted or unsubstituted $C_5$-$C_{30}$ carbocyclic group, and a substituted or unsubstituted $C_1$-$C_{30}$ heterocyclic group.

For example, $L_1$ to $L_5$ may each independently be selected from:

a single bond, a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group and a benzothiadiazole group; and a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenyfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), $Q_{31}$ to $Q_{39}$ may each independently be selected from:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CH_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

For example, b1 to b5 each indicate the number of $L_1$ to $L_5$, respectively, and may each independently be an integer of 1 to 5. When b1 is two or more, two or more of groups $L_1$ may be identical to or different from each other, when b2 is two or more, two or more of groups $L_2$ may be identical to or different from each other, when b3 is two or more, two or more of groups $L_3$ may be identical to or different from each other, when b4 is two or more, two or more of groups $L_4$ may be identical to or different from each other, and when b5 is two or more, two or more of groups $L_5$ may be identical to or different from each other.

For example, b1 to b5 may each independently be 1 or 2.

$R_5$ and $R_6$ may optionally be linked via a single bond or a first linking group to form a substituted or unsubstituted $C_5$-$C_{30}$ carbocyclic group or a substituted or unsubstituted $C_1$-$C_{30}$ heterocyclic group (for example, a 5-membered to 7-membered cyclic group having 5 or 6 carbons; a 5-membered to 7-membered cyclic group having 5 or 6 carbons, each substituted with at least one selected from deuterium, a cyano group, —F, a $C_1$-$C_{10}$ alkyl group, and a $C_6$-$C_{14}$ aryl group).

The first linking group may be selected from *—O—*', *—S—*', *—C($R_8$)($R_9$)—*', *—C($R_8$)=*', *=C($R_8$)—*', *—C($R_8$)=C($R_9$)—*', *—C(=O)—*', *—C(=S)—*', *—C≡C—*', *—N($R_8$)—*', *—Si($R_8$)($R_9$)—*', and *—P($R_8$)($R_9$)—*', wherein $R_8$ and $R_9$ are each the same as described in connection with $R_1$ of the present specification, and * and *' each indicate a binding site to a neighboring atom.

In an embodiment, $T_1$ and $T_2$ may each be a single bond, but embodiments of the present disclosure are not limited thereto.

$R_1$ to $R_7$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), wherein $Q_1$ to $Q_9$ may each be independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

For example, $R_1$ to $R_7$ may each independently be selected from:
hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N(Q$_1$)(Q$_2$), —Si(Q$_3$)(Q$_4$)(Q$_5$), —B(Q$_6$)(Q$_7$), and —P(=O)(Q$_8$)(Q$_9$), and Q$_1$ to Q$_9$ may each independently be selected from: —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CH$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a C$_1$-C$_{10}$ alkyl group, and a phenyl group.

In an embodiment, R$_1$ to R$_7$ may each independently be selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, groups represented by Formulae 9-1 to 9-19, groups represented by Formulae 10-1 to 10-139, —N(Q$_1$)(Q$_2$), —Si(Q$_3$)(Q$_4$)(Q$_5$), —B(Q$_6$)(Q$_7$), and —P(=O)(Q$_8$)(Q$_9$) (wherein Q$_1$ to Q$_9$ are each independently the same as described above), but embodiments of the present disclosure are not limited thereto:

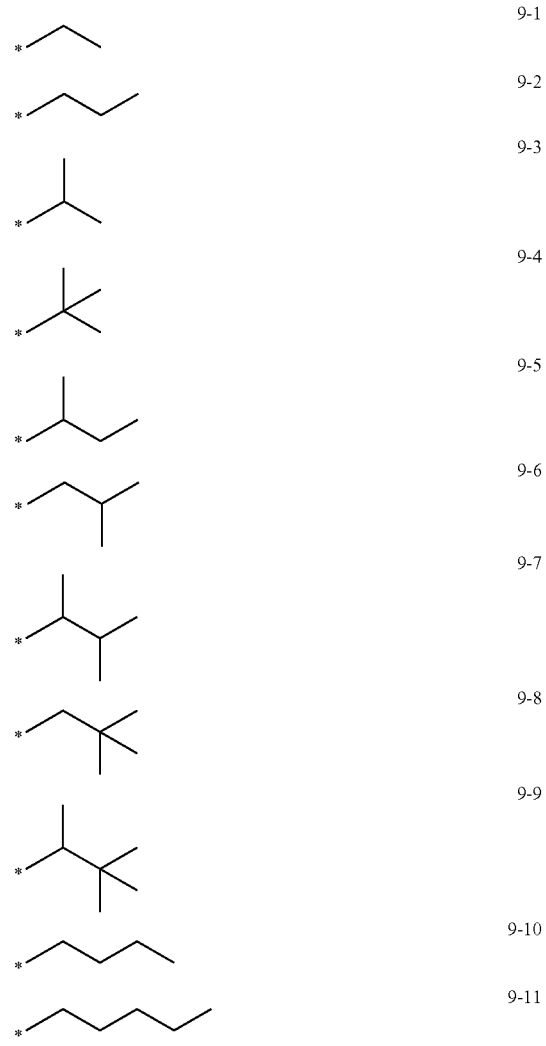

-continued
9-12 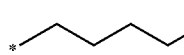
9-13 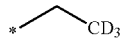
9-14 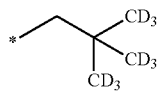
9-15 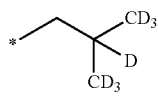
9-16 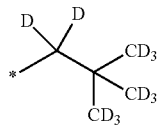
9-17 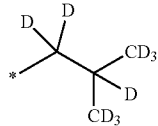
9-18 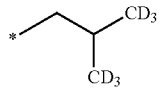
9-19 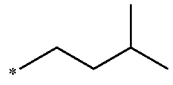
10-1 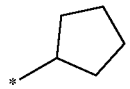
10-2 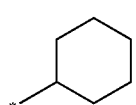
10-3 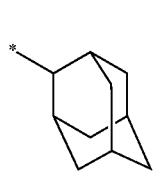
10-4 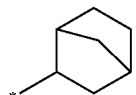
10-5 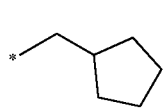
10-6 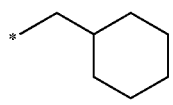
-continued
10-7 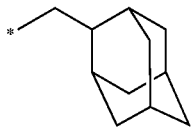
10-8 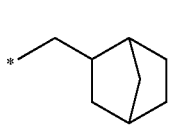
10-9 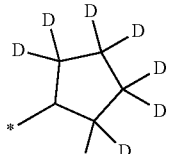
10-10 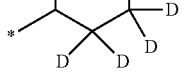
10-11 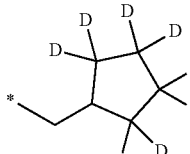
10-12 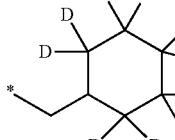
10-13 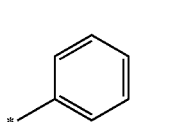
10-14 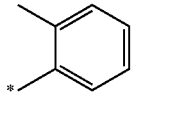
10-15 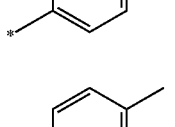
10-16 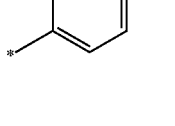

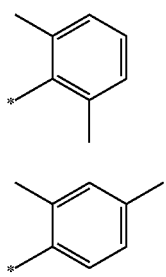
10-17
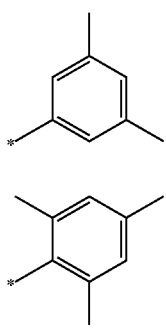
10-18
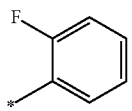
10-19
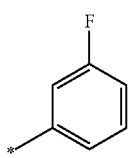
10-20
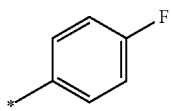
10-21
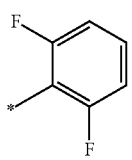
10-22
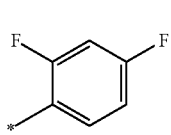
10-23
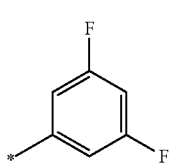
10-24
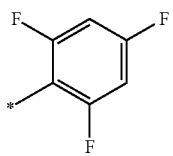
10-25
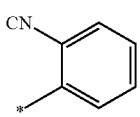
10-26
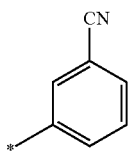
10-27
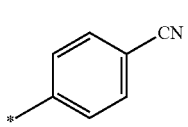
10-28
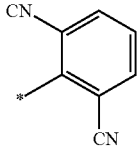
10-29
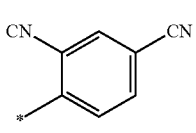
10-30
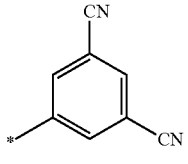
10-31
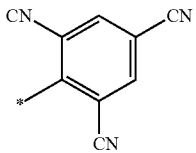
10-32
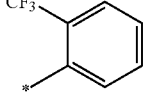
10-33
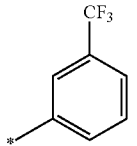
10-34
10-35
10-36

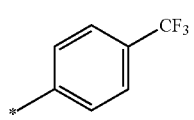
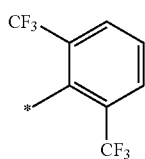
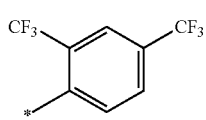
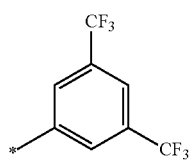
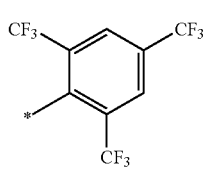
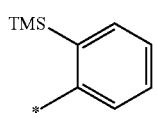
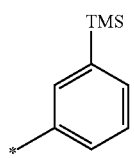
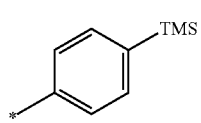
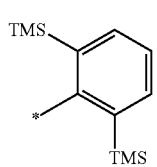
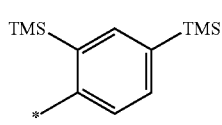
10-37
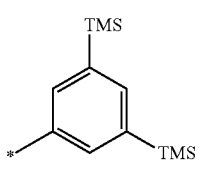
10-38
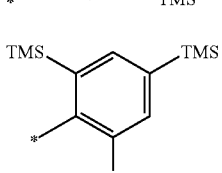
10-39
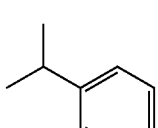
10-40
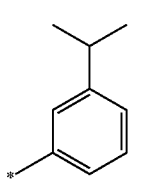
10-41
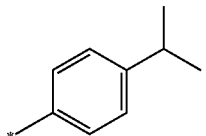
10-42
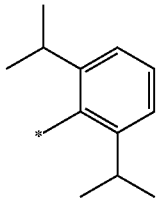
10-43
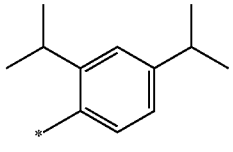
10-44
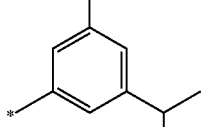
10-45
10-46
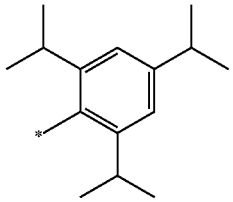

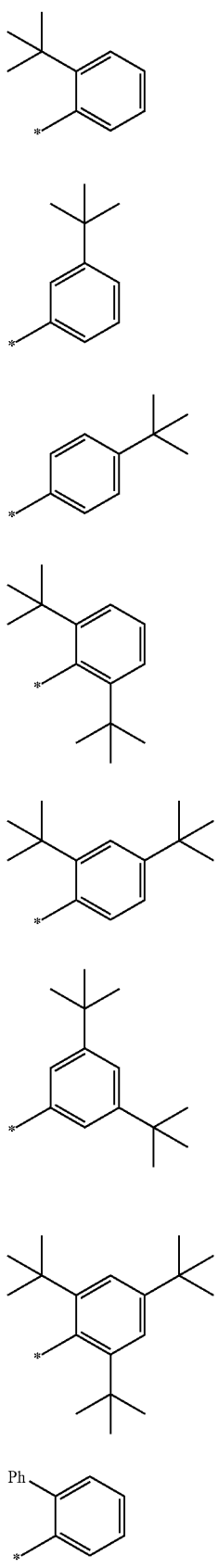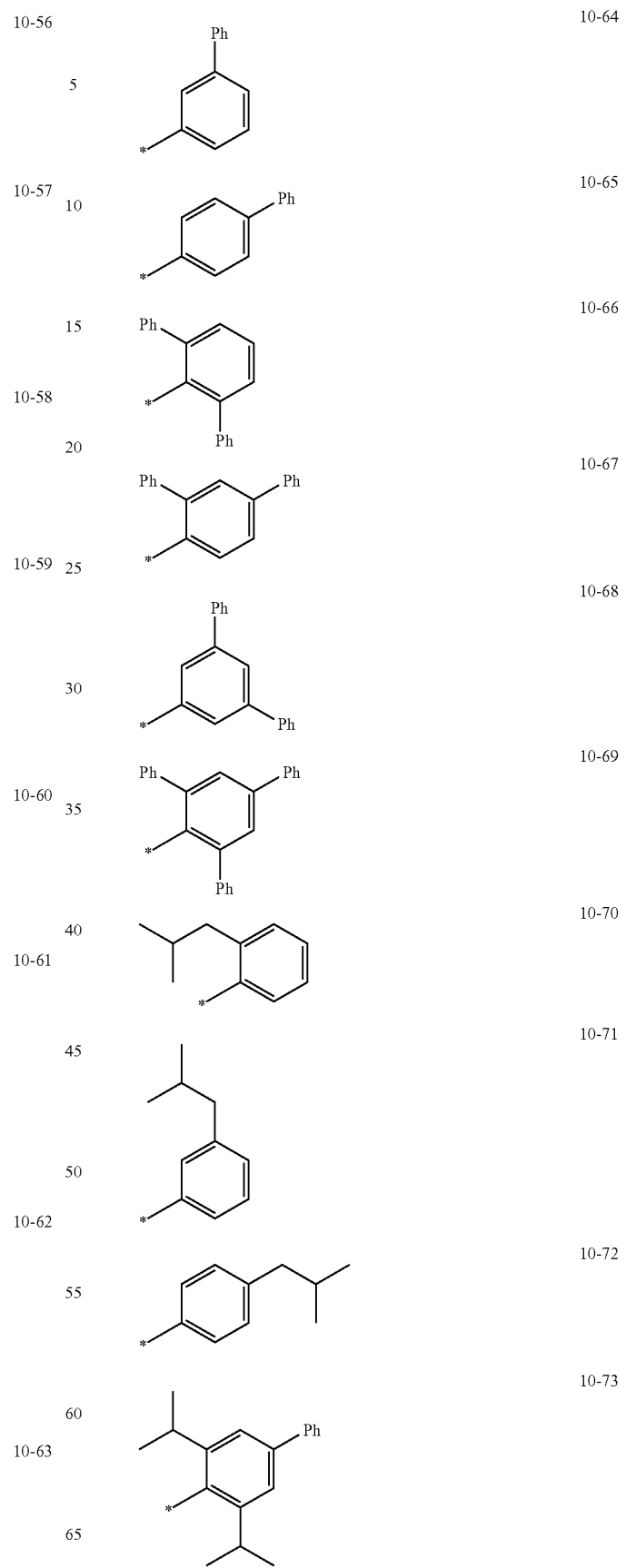

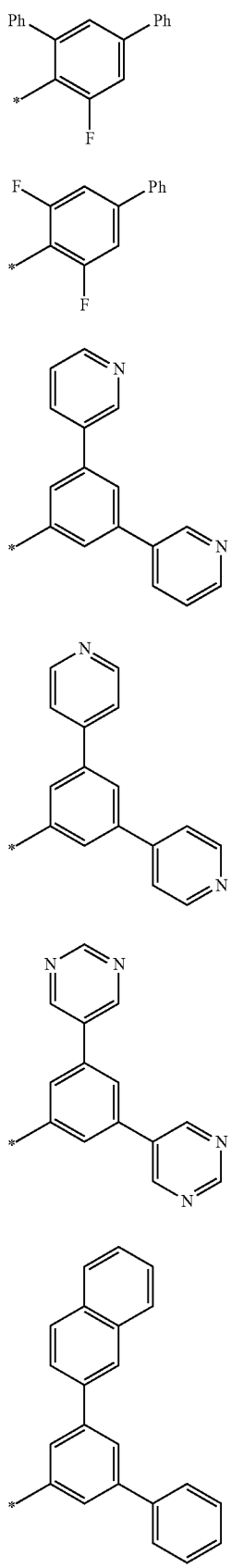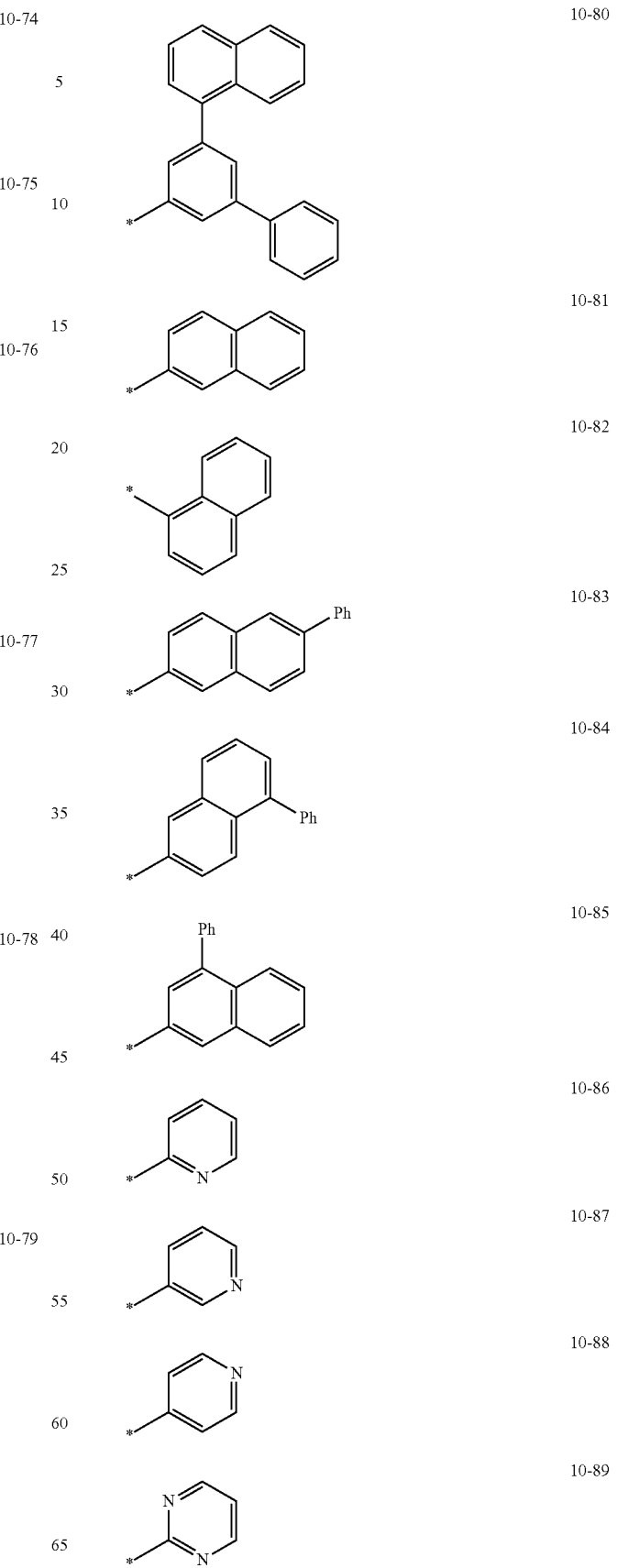

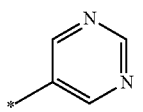
10-90
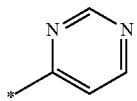
10-91
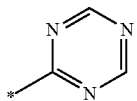
10-92
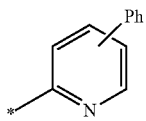
10-93
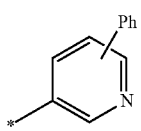
10-94
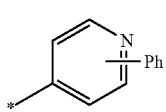
10-95
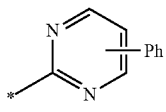
10-96
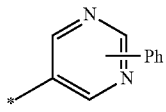
10-97
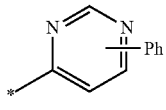
10-98
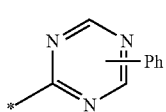
10-99
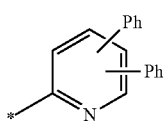
10-100
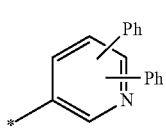
10-101
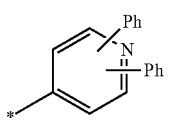
10-102
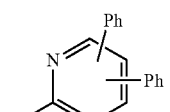
10-103
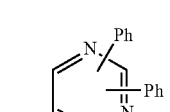
10-104
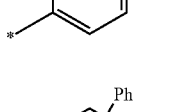
10-105
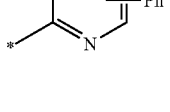
10-106
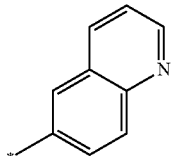
10-107
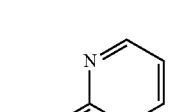
10-108
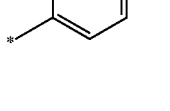
10-109
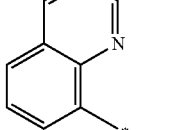
10-110

10-111 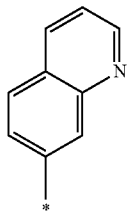
10-112 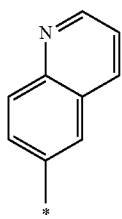
10-113 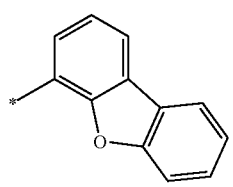
10-114 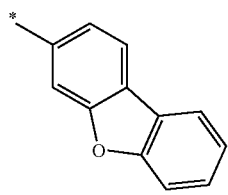
10-115 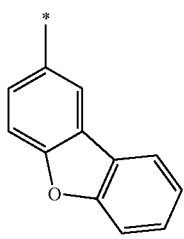
10-116 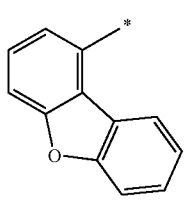
10-117 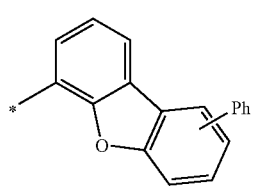
10-118 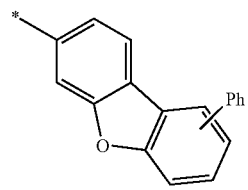
10-119 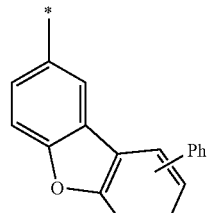
10-120 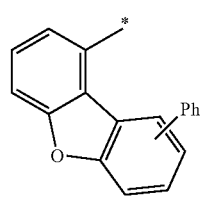
10-121 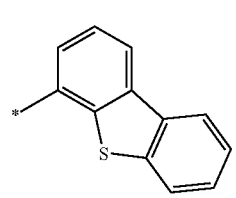
10-122 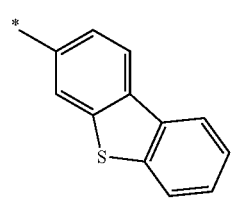
10-123 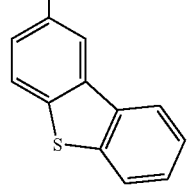
10-124 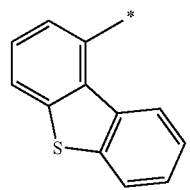

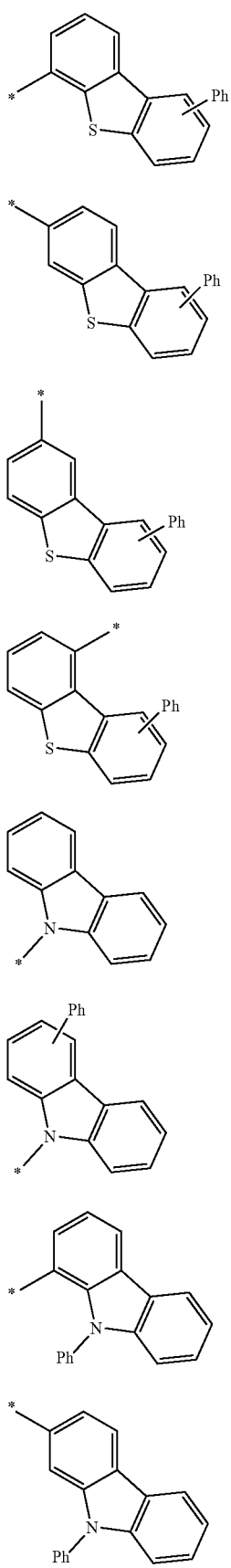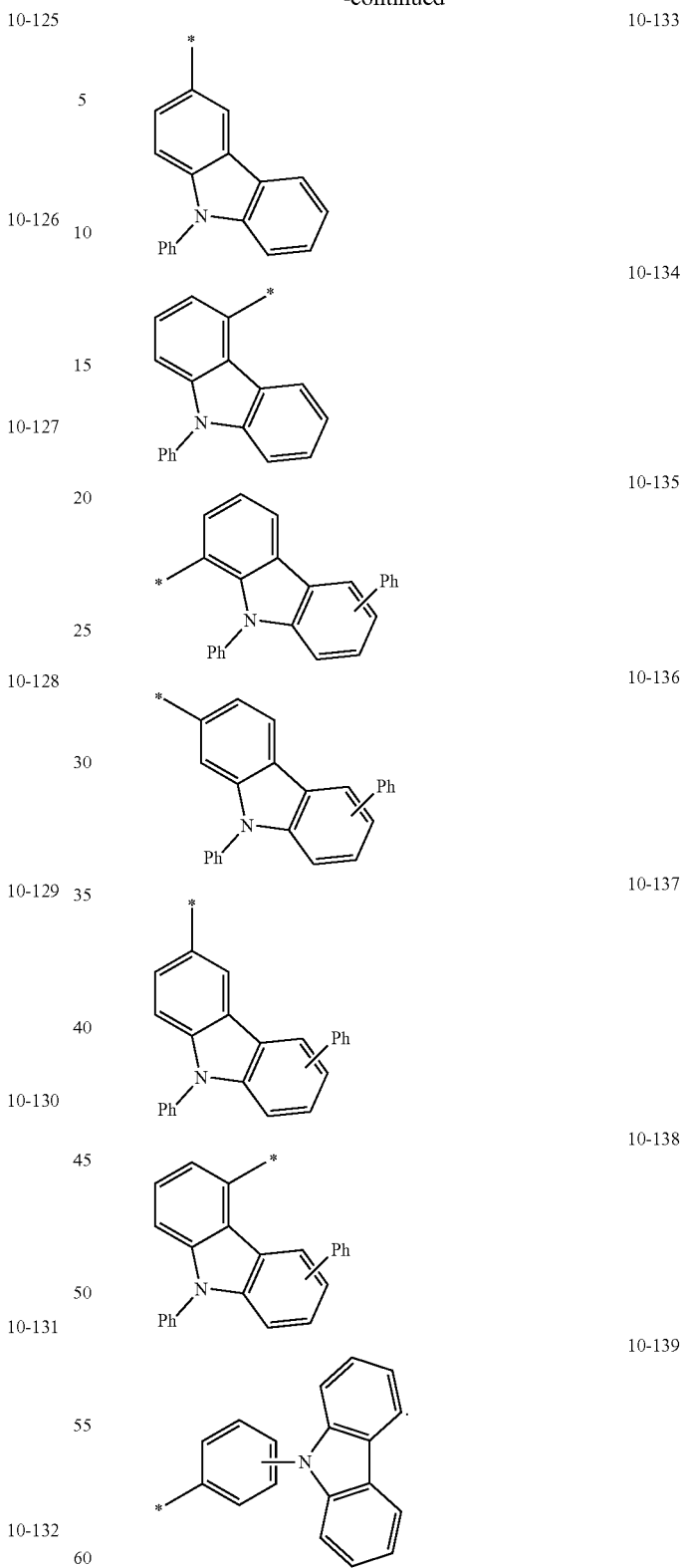
In Formulae 9-1 to 9-19 and 10-1 to 10-139, "Ph" indicates a phenyl group, "TMS" indicates a trimethylsilyl group, "*" indicates a binding site to a neighboring atom.
In Formulae 9-1 to 9-19 and 10-1 to 10-139, c1 to c5 indicate the number of $R_1$ to $R_5$, respectively, and may each independently be an integer of 1 to 5. When c1 is two or more, two or more of groups $R_1$ may be identical to or different from each other, when c2 is two or more, two or more of groups $R_2$ may be identical to or different from each other, when c3 is two or more, two or more of groups $R_3$ may be identical to or different from each other, when c4 is two or more, two or more of groups $R_4$ may be identical to or different from each other, and when c5 is two or more, two or more of groups $R_5$ may be identical to or different from each other. For example, c1 to c5 may each independently be 1, 2, or 3.

a1 to a4 indicate the number of $*-(L_1)_{b1}-(R_1)_{c1}$, $*-(L_2)_{b2}-(R_2)_{c2}$, $*-(L_3)_{b3}-(R_3)_{c3}$, and $*-(L_4)_{b4}-(R_4)_{c4}$, respectively, and may each independently be an integer of 0 to 20. When a1 is two or more, two or more of groups $*-(L_1)_{b1}-(R_1)_{c1}$ may be identical to or different from each other, when a2 is two or more, two or more of groups $*-(L_2)_{b2}-(R_2)_{c2}$ may be identical to or different from each other, when a3 is two or more, two or more of groups $*-(L_3)_{b3}-(R_3)_{c3}$ may be identical to or different from each other, and when a4 is two or more, two or more of groups $*-(L_4)_{b4}-(R_4)_{c4}$ may be identical to or different from each other. For example, a1 to a4 may each independently be an integer of 1 to 5.

In Formula 1, two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, and two or more of neighboring $R_1$ to $R_4$ may optionally be linked to form a substituted or unsubstituted $C_5$-$C_{30}$ carbocyclic group or a substituted or unsubstituted $C_1$-$C_{30}$ heterocyclic group.

For example, in Formula 1, a substituted or unsubstituted $C_5$-$C_{30}$ carbocyclic group or a substituted or unsubstituted $C_1$-$C_{30}$ heterocyclic group, each of which may be formed by two of a plurality of groups $R_1$, two of a plurality of groups $R_2$, two of a plurality of groups $R_3$, two of a plurality of groups $R_4$, and two or more of neighboring $R_1$ to $R_4$ that are optionally linked, may be selected from:

a pentadiene group, a cyclohexane group, a cycloheptane group, an adamantane group, a bicycle-heptane group, a bicycle-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group;

a cyclohexane group, a cycloheptane group, an adamantane group, a bicycle-heptane group, a bicycle-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{11}$, but embodiments of the present disclosure are not limited thereto.

$R_{11}$ is the same as described in connection with $R_1$.

In the present specification, "an azabenzothiophene group, an azabenzofuran group, an azaindene group, an azaindole group, an azabenzosilole group, an azadibenzothiophene group, an azadibenzofuran group, an azafluorene group, an azacarbazole group, and an azadibenzosilole group" each independently indicate a heteroring having the same backbone as "a benzothiophene group, a benzofuran group, an indene group, an indole group, a benzosilole group, a dibenzothiophene group, a dibenzofuran group, a fluorene group, a carbazole group, and a dibenzosilole group", respectively, wherein at least one carbon constituting the ring is substituted with nitrogen.

In an embodiment, a moiety represented by

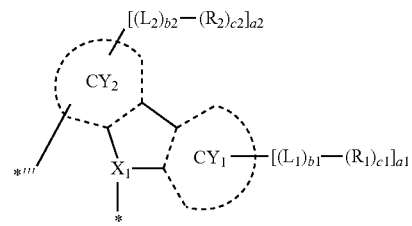

in Formula 2 may be represented by one selected from Formulae CY1-1 to CY1-12:

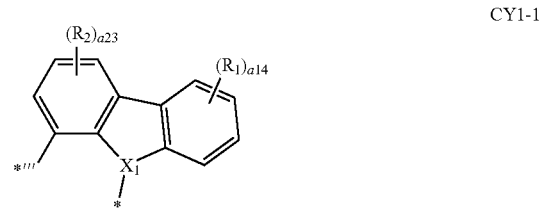

CY1-1

CY1-2

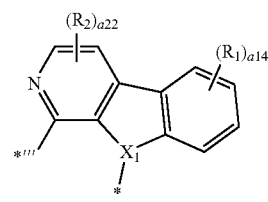

CY1-3

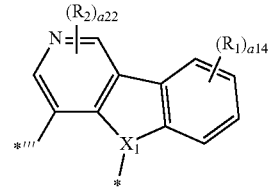

CY1-4

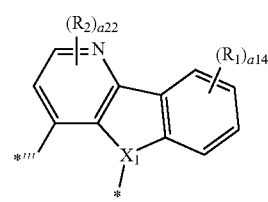

-continued

CY1-5
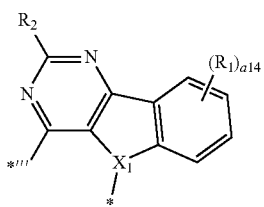

CY1-6
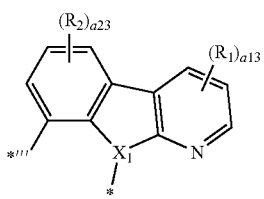

CY1-7
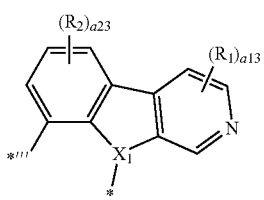

CY1-8
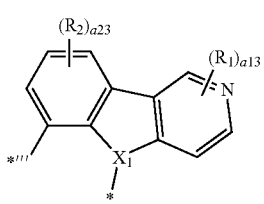

CY1-9
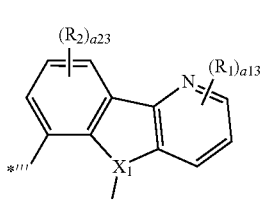

CY1-10
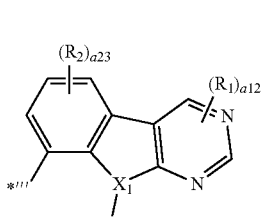

CY1-11
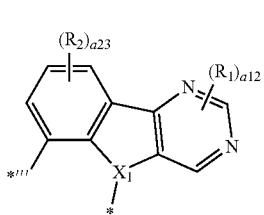

CY1-12
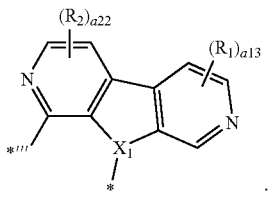

In Formulae CY1-1 to CY1-12, $X_1$, $R_1$, and $R_2$ are each independently the same as described above, a14 may be an integer of 0 to 4, a13 and a23 may each independently be an integer of 0 to 3, a12 and a22 may each independently be an integer of 0 to 2,

* indicates a binding site to M of Formula 1, and

*''' indicates a binding site to a neighboring atom.

In one or more embodiments, a moiety represented by

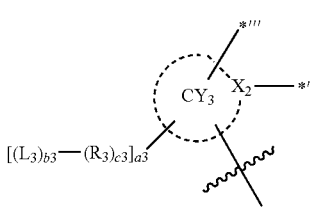

in Formula 2 may be represented by one selected from Formulae CY3-1 to CY3-9:

CY3-1
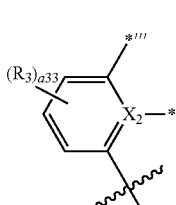

CY3-2
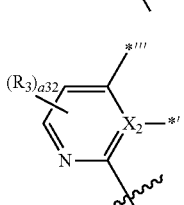

CY3-3
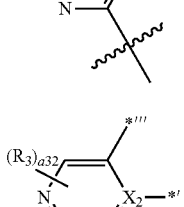

-continued

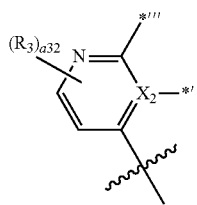
CY3-4

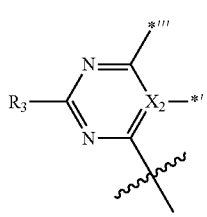
CY3-5

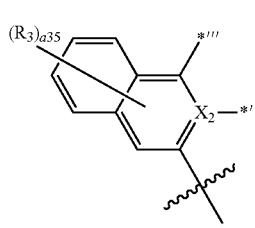
CY3-6

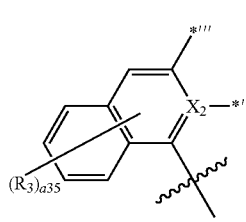
CY3-7

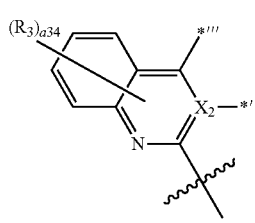
CY3-8

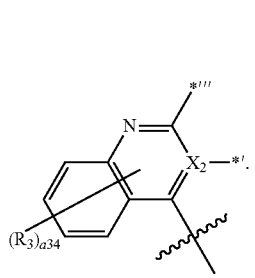
CY3-9

In Formulae CY3-1 to CY3-9, $X_2$ and $R_3$ are the same as described above, a35 may be an integer of 0 to 5, a33 may be an integer of 0 to 3, a32 may be an integer of 0 to 2,

*' indicates a binding site to M of Formula 1, and

*''' and ⌇ each indicate a binding site to a neighboring atom.

In one or more embodiments, a moiety represented by

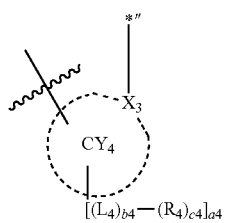

in Formula 2 may be represented by one selected from Formulae CY4-1 to CY4-40:

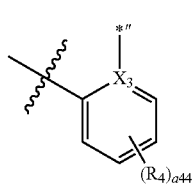
CY4-1

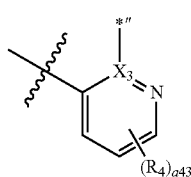
CY4-2

CY4-3

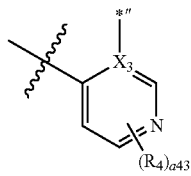
CY4-4

CY4-5

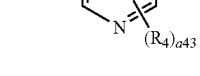

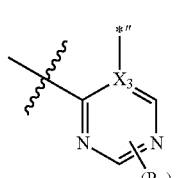
CY4-6

-continued
CY4-7
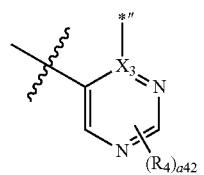
CY4-8
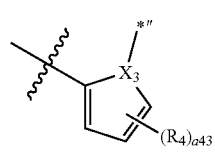
CY4-9
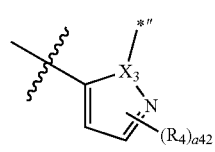
CY4-10
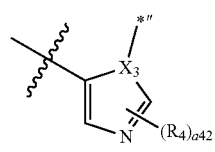
CY4-11
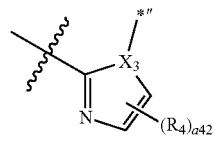
CY4-12
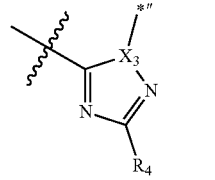
CY4-13
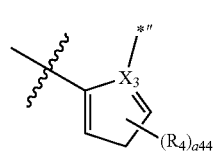
CY4-14
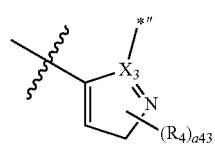
CY4-15
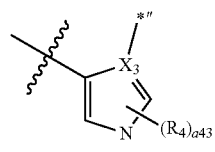
CY4-16
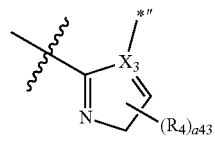
-continued
CY4-17
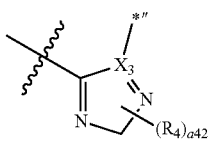
CY4-18
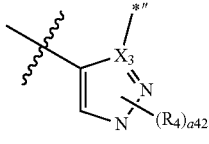
CY4-19
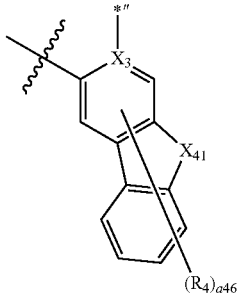
CY4-20
CY4-21
CY4-22

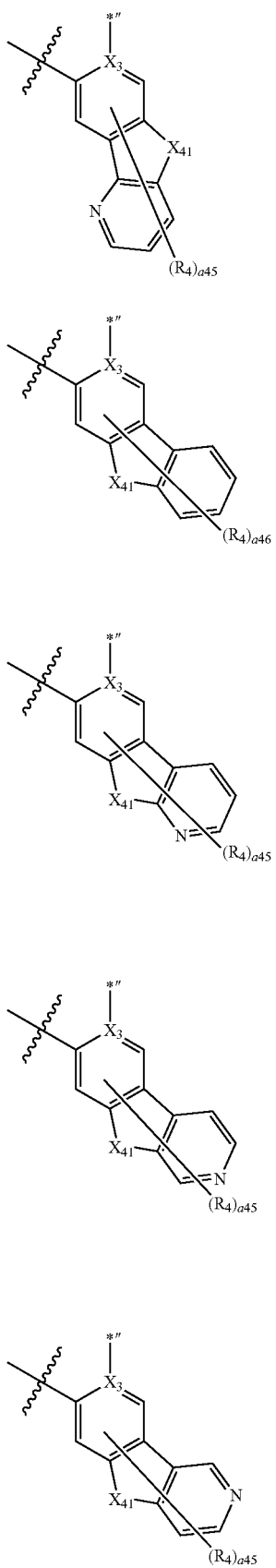
CYA-23
CYA-24
CYA-25
CYA-26
CYA-27
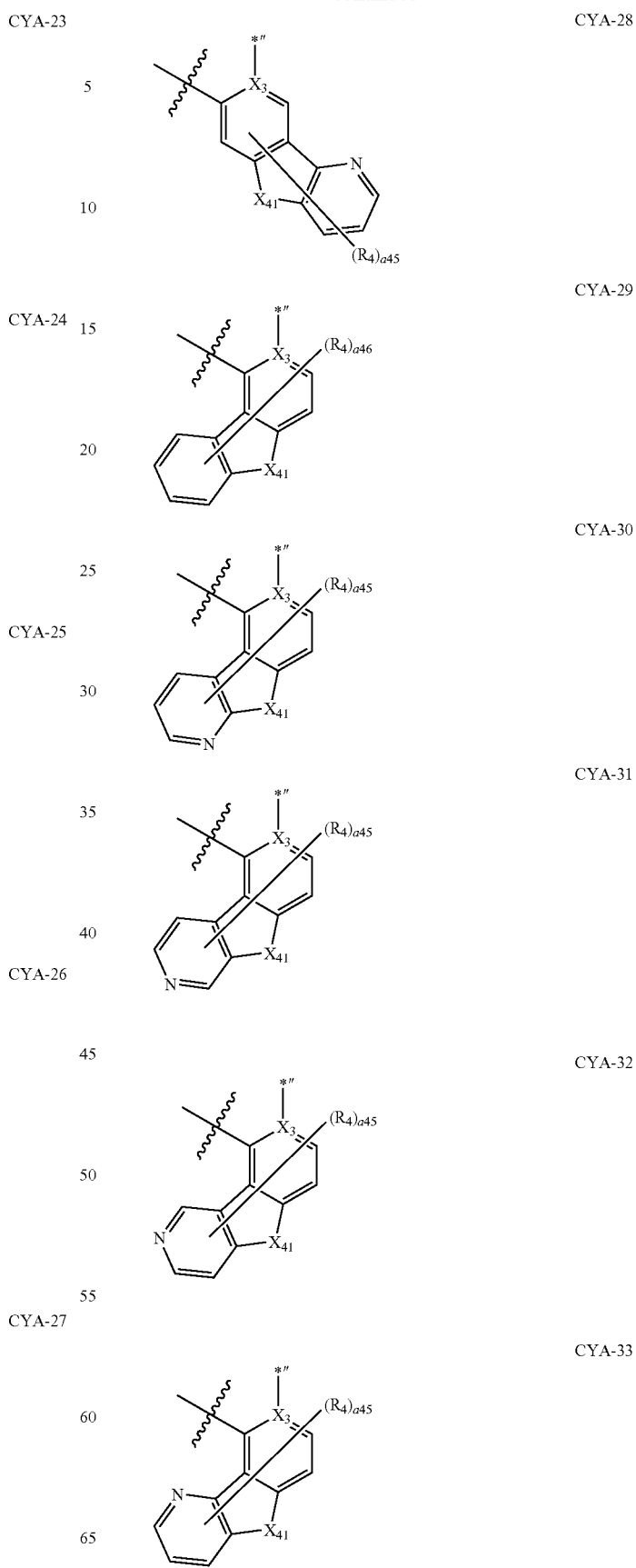
CYA-28
CYA-29
CYA-30
CYA-31
CYA-32
CYA-33

-continued

CYA-34

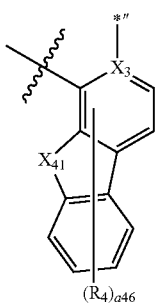

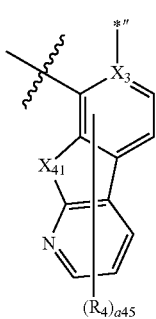

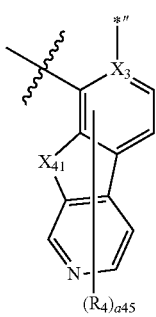

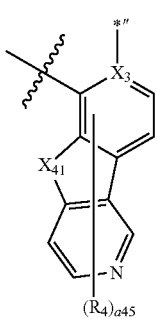

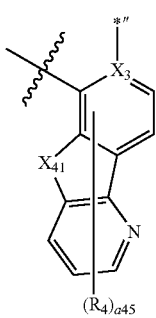

-continued

CY4-39

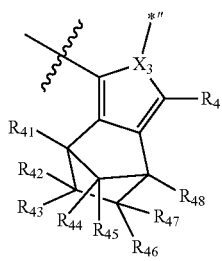

CY4-40

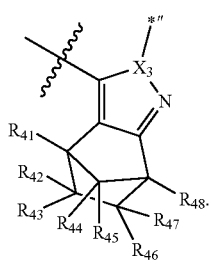

In Formulae CY4-1 to CY4-40,
$X_3$ and $R_4$ are the same as described above,
$X_{41}$ may be O, S, $N(R_{41})$, or $C(R_{41})(R_{42})$,
$R_{41}$ to $R_{48}$ are each independently the same as described in connection with $R_4$,
a46 may be an integer of 0 to 6,
a45 may be an integer of 0 to 5,
a44 may be an integer of 0 to 4,
a43 may be an integer of 0 to 3,
a42 may be an integer of 0 to 2,
*″ indicates a binding site to M of Formula 1, and
⌇ indicates a binding site to a neighboring atom.

In one or more embodiments,
the moiety represented by

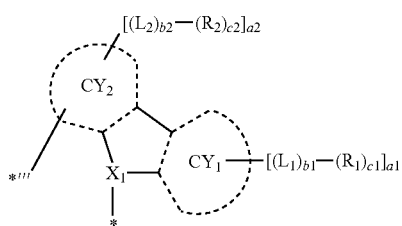

in Formula 2 may be represented by Formula CY1 (1), and/or
the moiety represented by

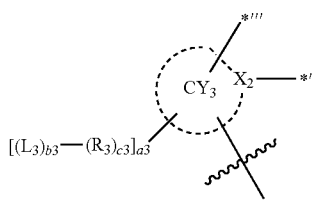

in Formula 2 may be represented by one selected from Formulae CY3(1) to CY3(11), and/or the moiety represented by
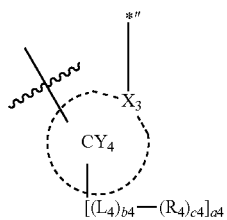
in Formula 2 may be represented by one selected from Formulae CY4(1) to CY4(23):
CY1(1)
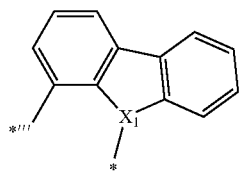
CY3(1)
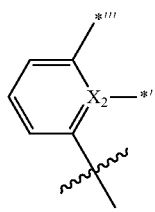
CY3(2)
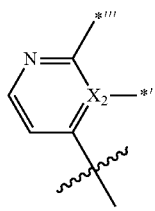
CY3(3)
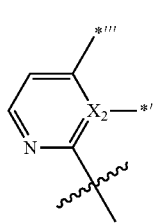
CY3(4)
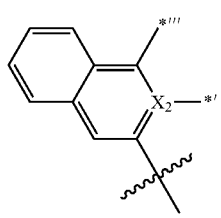
CY3(5)
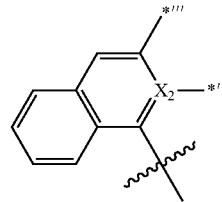
CY3(6)
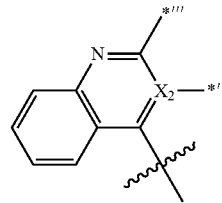
CY3(7)
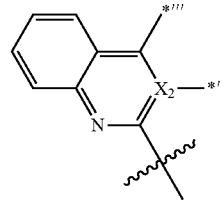
CY3(8)
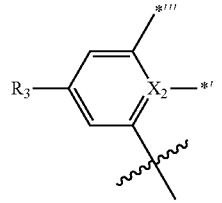
CY3(9)
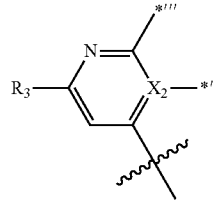
CY3(10)
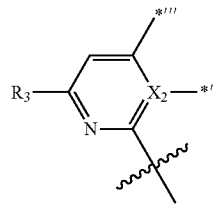
CY3(11)
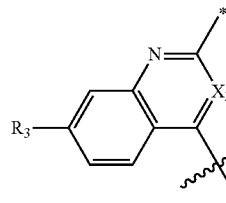

-continued
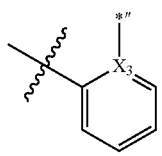 CY4(1)
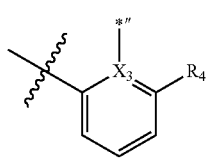 CY4(2)
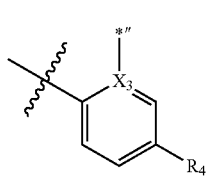 CY4(3)
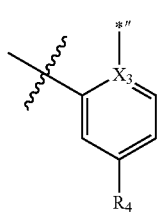 CY4(4)
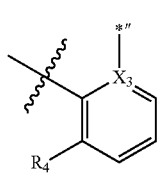 CY4(5)
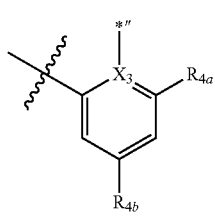 CY4(6)
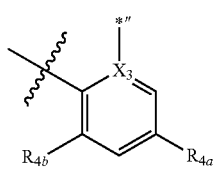 CY4(7)
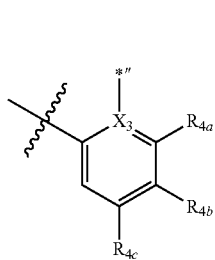 CY4(8)
-continued
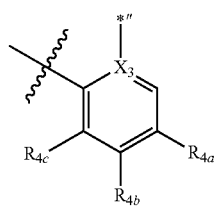 CY4(9)
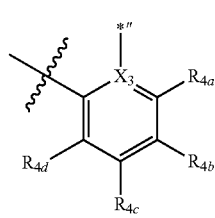 CY4(10)
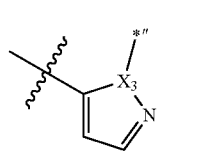 CY4(11)
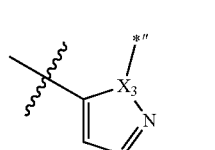 CYA(12)
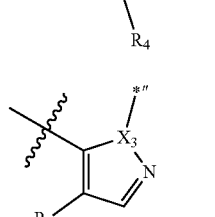 CYA(13)
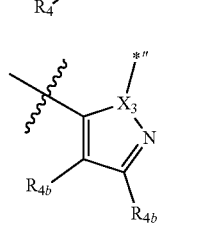 CYA(14)
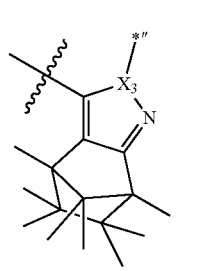 CYA(15)
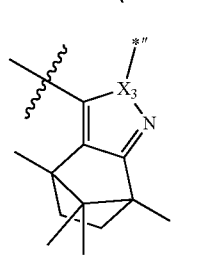 CYA(16)

CYA(17)

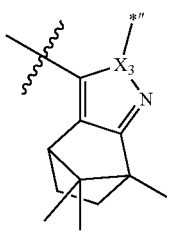

CY4(18)

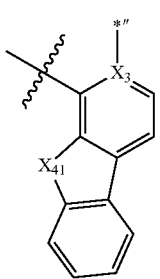

CY4(19)

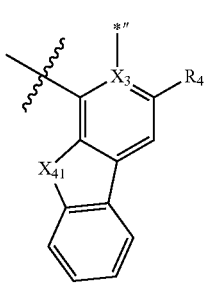

CY4(20)

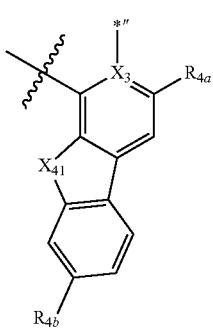

CY4(21)

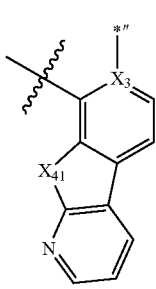

CY4(22)

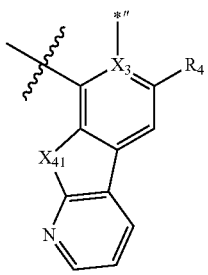

CY4(23)

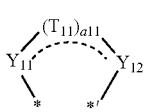

In Formulae CY1(1), CY3(1) to CY3(11), and CY4(1) to CY4(23), $X_1$ to $X_3$, $R_3$, and $R_4$ are each independently the same as described above, $X_{41}$ may be O, S, N($R_{41}$), or C($R_{41}$)($R_{42}$), and $R_{4a}$ to $R_{4d}$, $R_{41}$, and $R_{42}$ are each independently the same described in connection with $R_4$, provided that $R_3$, $R_4$, $R_{4a}$ to $R_{4d}$, $R_{41}$, and $R_{42}$ may not each independently be hydrogen, *, *', and *'' each indicate a binding site to M of Formula 1, and *''' and ⌇ each indicate a binding site to a neighboring atom.

In Formula 1, $L_{12}$ may be selected from ligands represented by Formulae 3A to 3D and 6-1:

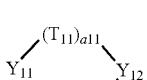  3A

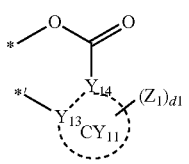  3B

3C

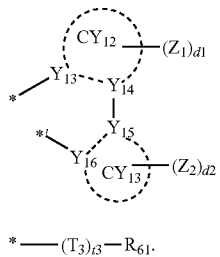

3D

*——(T₃)ₜ₃—R₆₁.

6-1

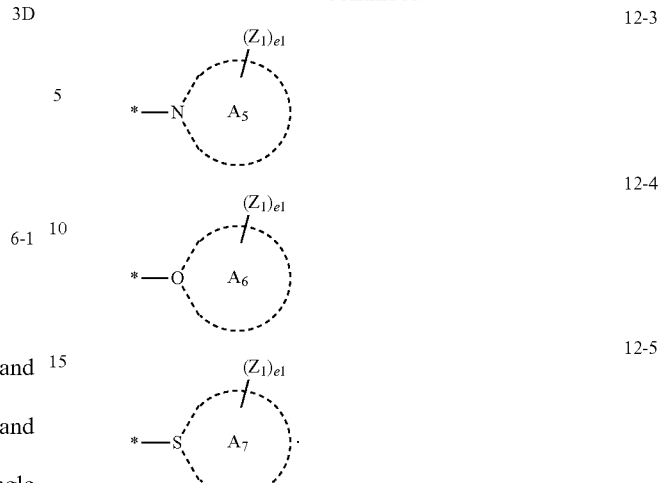

In Formulae 3A to 3D, $Y_{11}$ may be selected from O, N, N($Z_1$), P($Z_1$)($Z_2$), and As($Z_1$)($Z_2$), $Y_{12}$ may be selected from O, N, N($Z_3$), P($Z_3$)($Z_4$), and As($Z_3$)($Z_4$), $T_{11}$ may each independently be selected from a single bond, a double bond, *—C($Z_{11}$)($Z_{12}$)—*', *—C($Z_{11}$)=C($Z_{12}$)—*', *=C($Z_{11}$)—*', *—C($Z_{11}$)=*', *=C($Z_{11}$)—C($Z_{12}$)=C($Z_{13}$)—*', C($Z_{11}$)=C($Z_{12}$)—C($Z_{13}$)=*', *—N($Z_{11}$)—*', and a substituted or unsubstituted $C_6$-$C_{30}$ arylene group, a11 may be an integer of 1 to 5, $Y_{13}$ to $Y_{16}$ may each independently be C or N, a bond between $Y_{13}$ and $Y_{14}$ may be a single bond or a double bond, and a bond between $Y_{15}$ and $Y_{16}$ may be a single bond or a double bond, $CY_{11}$ to $CY_{13}$ may each independently be selected from a $C_5$-$C_{30}$ carbocyclic group, and a $C_2$-$C_{30}$ heterocyclic group, $Z_1$ to $Z_4$ and $Z_{11}$ to $Z_{13}$ are each independently the same as described in connection with $R_1$, d1 and d2 may each independently be an integer of 0 to 10,

* and *' each indicate a binding site to M of Formula 1, and in Formula 6-1, $T_3$ may be selected from a single bond, *—O—*', *—S—*', *—C($R_{62}$)($R_{63}$)—*', *—C($R_{62}$)=*', *=C($R_{62}$)—*', *—C($R_{62}$)=C($R_{63}$)—*', *—C(=O)—*', *—C(=S)—*', *—C≡C—*', and *—N($R_{62}$)—*', t3 may be an integer of 1 to 5, $R_{61}$ to $R_{63}$ are each independently the same as described in connection with $R_1$, or may each independently be —P($Q_{41}$)($Q_{42}$)($Q_{43}$), $Q_{41}$ to $Q_{43}$ are each independently the same as described in connection with $R_1$, and

* indicates a binding site to M of Formula 1.

In an embodiment, $L_{12}$ in Formula 1 may be selected from a ligand represented by Formula 6-1, and $T_3$ in Formula 6-1 may not be a single bond.

In one or more embodiments, $L_{12}$ in Formula 1 may be selected from ligands represented by Formulae 12-2 to 12-5:

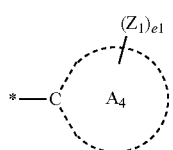

12-2

In Formulae 12-1 to 12-5, ring $A_4$ may be selected from a cyclopentane group, a cyclohexene group, a cycloheptene group, a benzene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, an isoindole group, an indole group, an indazole group, a purine group, a quinoline group, an isoquinoline group, a benzoquinoline group, a quinoxaline group, a quinazoline group, a cinnoline group, a naphthyridine group, a carbazole group, a phenanthroline group, a benzimidazole group, a benzofuran group, a benzothiophene group, a benzothiazole group, an isobenzothiazole group, a benzoxazole group, an isobenzoxazole group, a triazole group, a tetrazole group, an oxadiazole group, a thiadiazole group, a triazine group, a dibenzofuran group, a dibenzothiophene group, a benzocarbazole group, a dibenzocarbazole group, an imidazopyridine group, and an imidazopyrimidine group, ring $A_5$ may be selected from a pyrrole group, an imidazole group, a pyrazole group, a thiazole group, an isothiazole group, an oxazole group, an isoxazole group, a pyridine group, a pyrazine group, a pyrimidine group, a pyridazine group, an isoindole group, an indole group, an indazole group, a purine group, a quinoline group, an isoquinoline group, a benzoquinoline group, a quinoxaline group, a quinazoline group, a cinnoline group, a naphthyridine group, a carbazole group, a phenanthroline group, a benzimidazole group, a benzofuran group, a benzothiazole group, an isobenzothiazole group, a benzoxazole group, an isobenzoxazole group, a triazole group, a tetrazole group, an oxadiazole group, a thiadiazole group, a triazine group, a benzocarbazole group, a dibenzocarbazole group, an imidazopyridine group, and an imidazopyrimidine group, ring $A_6$ may be selected from a furan group, an oxazole group, an isoxazole group, a benzofuran group, a benzoxazole group, an isobenzoxazole group, an oxadiazole group, and a dibenzofuran group, ring $A_7$ may be selected from a thiophene group, a thiazole group, an isothiazole group, a benzothiophene group, a benzothiazole group, an isobenzothiazole group, a thiadiazole group, and a dibenzothiophene group, $Z_1$ is the same as described in connection with $R_1$, two or more of a plurality of groups $Z_1$ may optionally be linked to form a substituted or unsubstituted $C_5$-$C_{30}$ carbocyclic group or a substituted or unsubstituted $C_2$-$C_{30}$ heterocyclic group, e1 may be an integer of 0 to 8,

* indicates a binding site to M of Formula 1.

In one or more embodiments, $L_{12}$ in Formula 1 may be selected from ligands represented by Formulae 13-1 to 13-47 and 14-1 to 14-28, but embodiments of the present disclosure are not limited thereto:

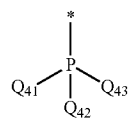
13-1

13-2

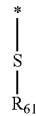
13-3

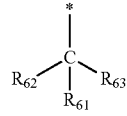
13-4

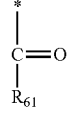
13-5

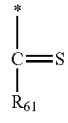
13-6

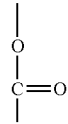
13-7

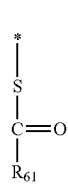
13-8

-continued

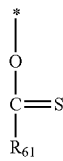
13-9

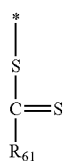
13-10

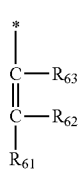
13-11

13-12

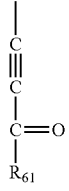
13-13

13-14

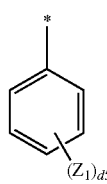
13-15

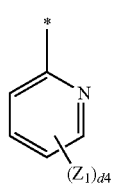
13-16

13-17 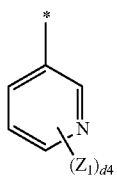
13-18 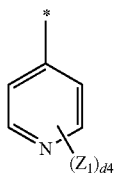
13-19 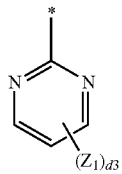
13-20 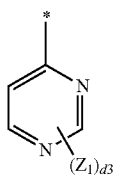
13-21 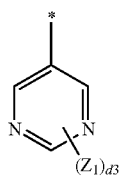
13-22 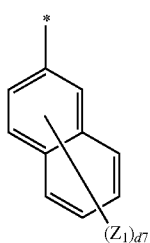
13-23 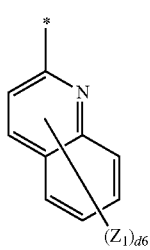
13-24 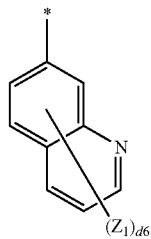
13-25 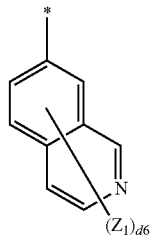
13-26 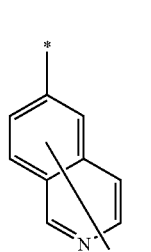
13-27 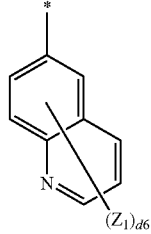
13-28 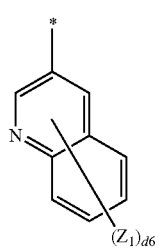
13-29 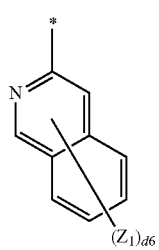

| | |
|---|---|
| 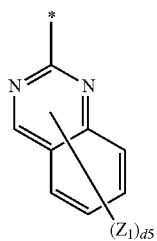 | 13-30 |
| 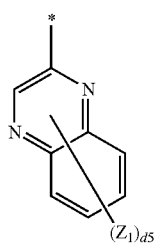 | 13-31 |
| 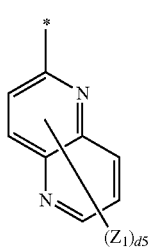 | 13-32 |
| 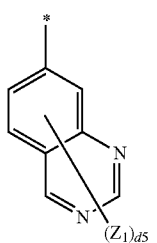 | 13-33 |
| 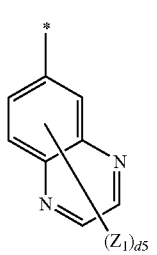 | 13-34 |
| 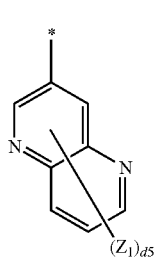 | 13-35 |
| | |
|---|---|
| 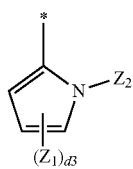 | 13-36 |
| 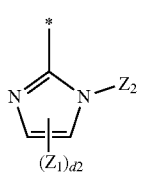 | 13-37 |
| 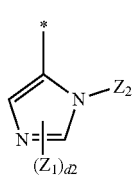 | 13-38 |
| 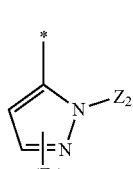 | 13-39 |
| 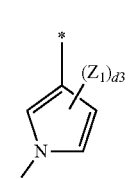 | 13-40 |
| 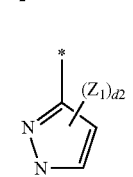 | 13-41 |
| 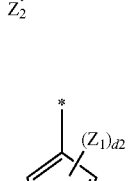 | 13-42 |
| 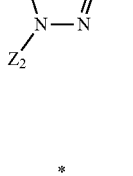 | 13-43 |
| 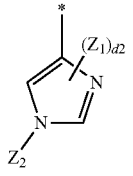 | |

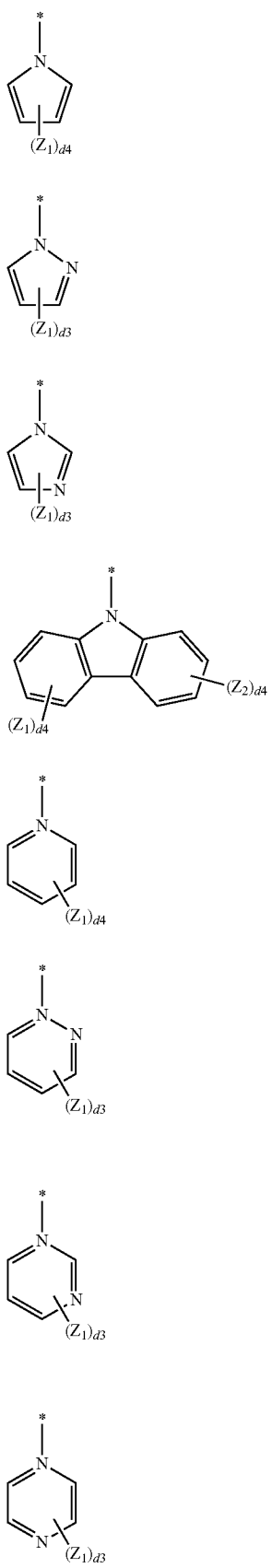
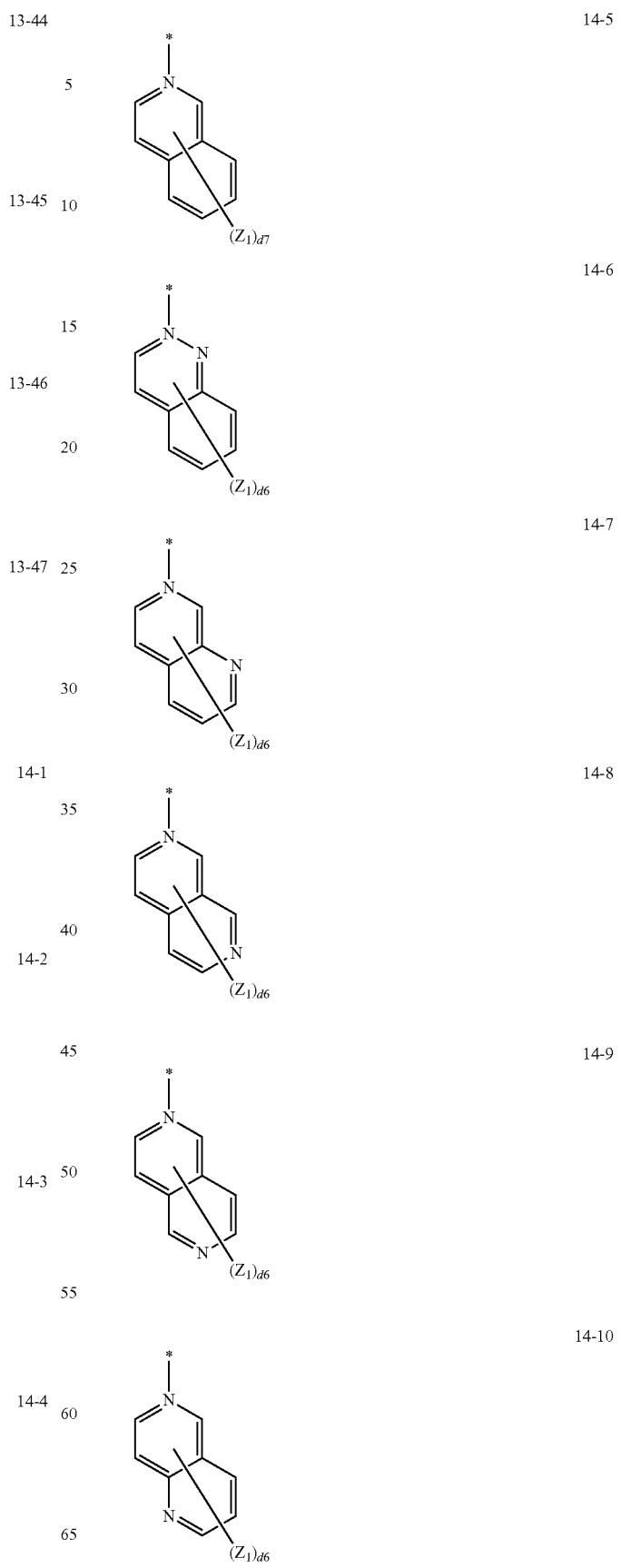

-continued
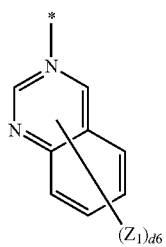
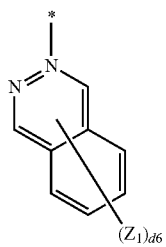
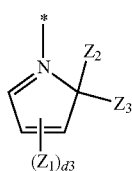
14-13
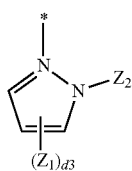
14-14
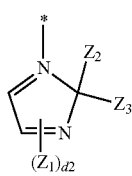
14-15
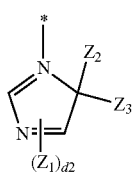
14-16
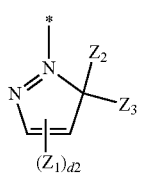
14-17
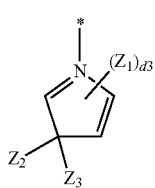
14-18
-continued
14-11
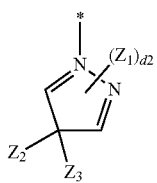
14-12
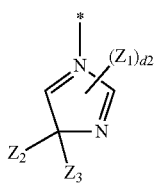
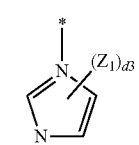
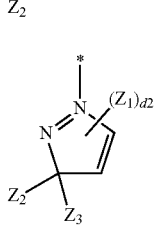
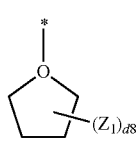
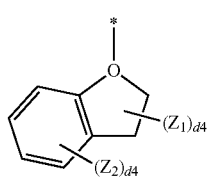
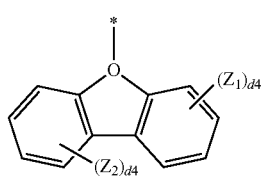
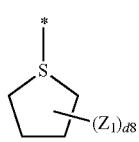
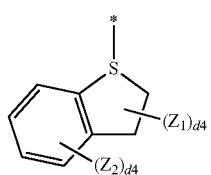
14-19
14-20
14-21
14-22
14-23
14-24
14-25
14-26
14-27

-continued 14-28

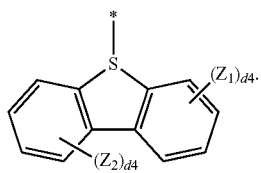

In Formulae 13-1 to 13-47 and 14-1 to 14-28,
$R_{61}$ to $R_{63}$, $Q_{41}$ to $Q_{43}$, and $Z_1$ to $Z_3$ are each independently the same as described in connection with $R_1$,
d2 may be an integer of 0 to 2,
d3 may be an integer of 0 to 3,
d4 may be an integer of 0 to 4,
d5 may be an integer of 0 to 5,
d6 may be an integer of 0 to 6,
d7 may be an integer of 0 to 7,
d8 may be an integer of 0 to 8, and
* indicates a binding site to M of Formula 1.

For example, the organometallic compound may be one selected from Compounds 1 to 46, but embodiments of the present disclosure are not limited thereto:

1

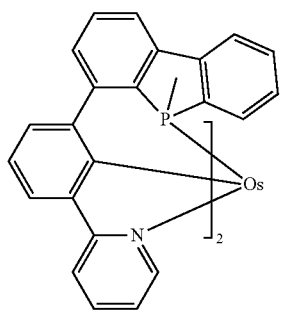

2

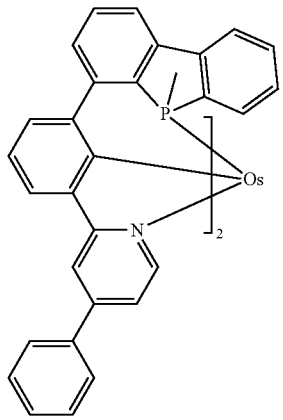

3

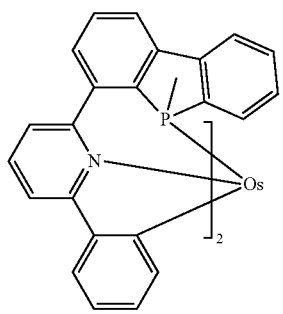

4

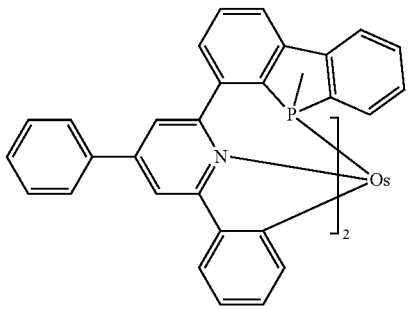

5

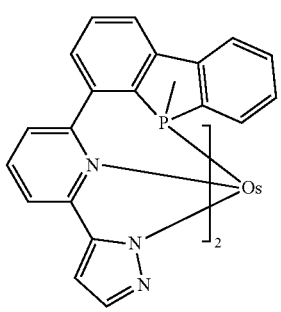

6

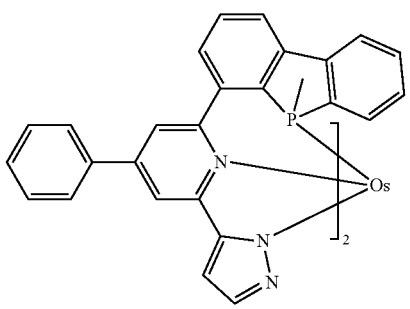

7

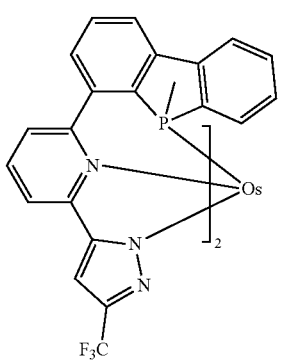

8

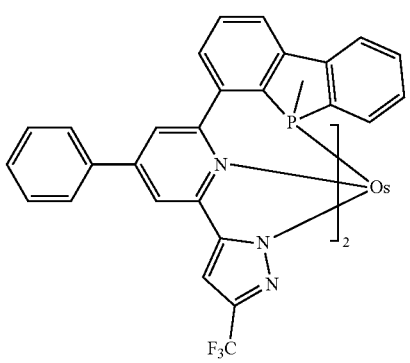

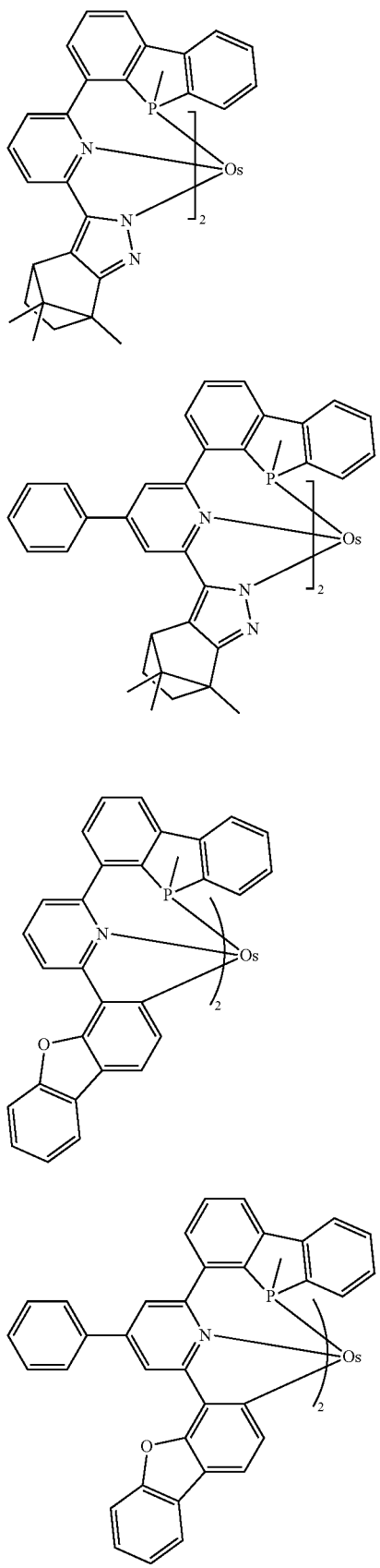
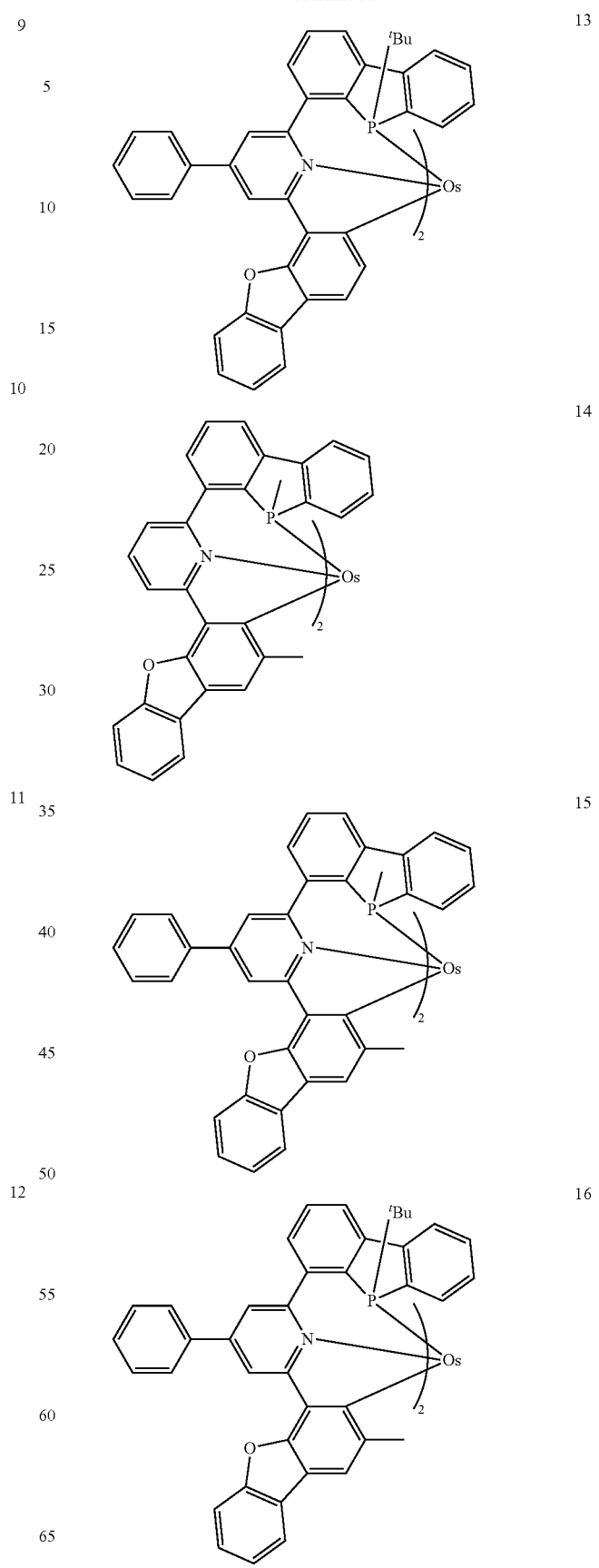

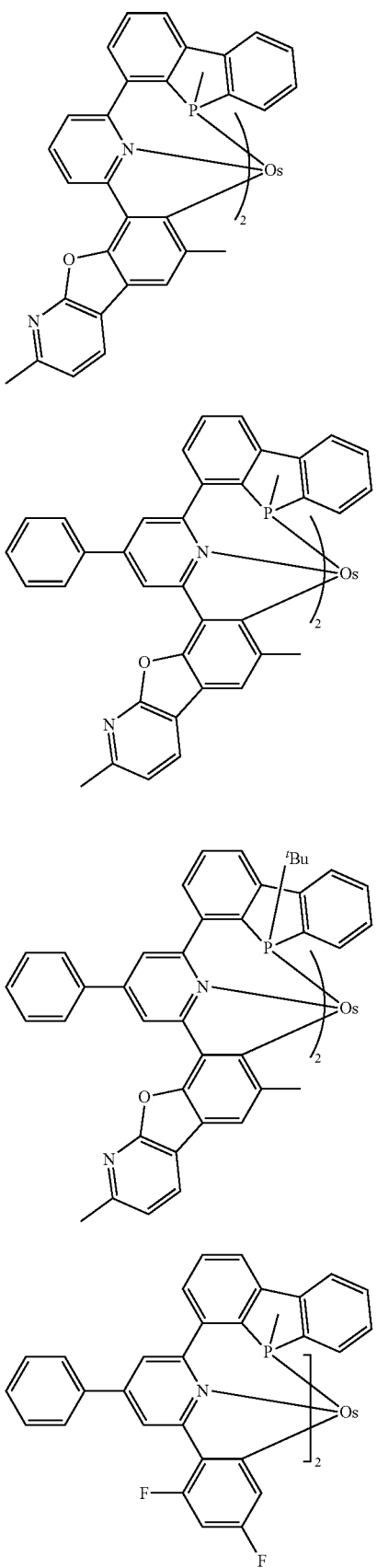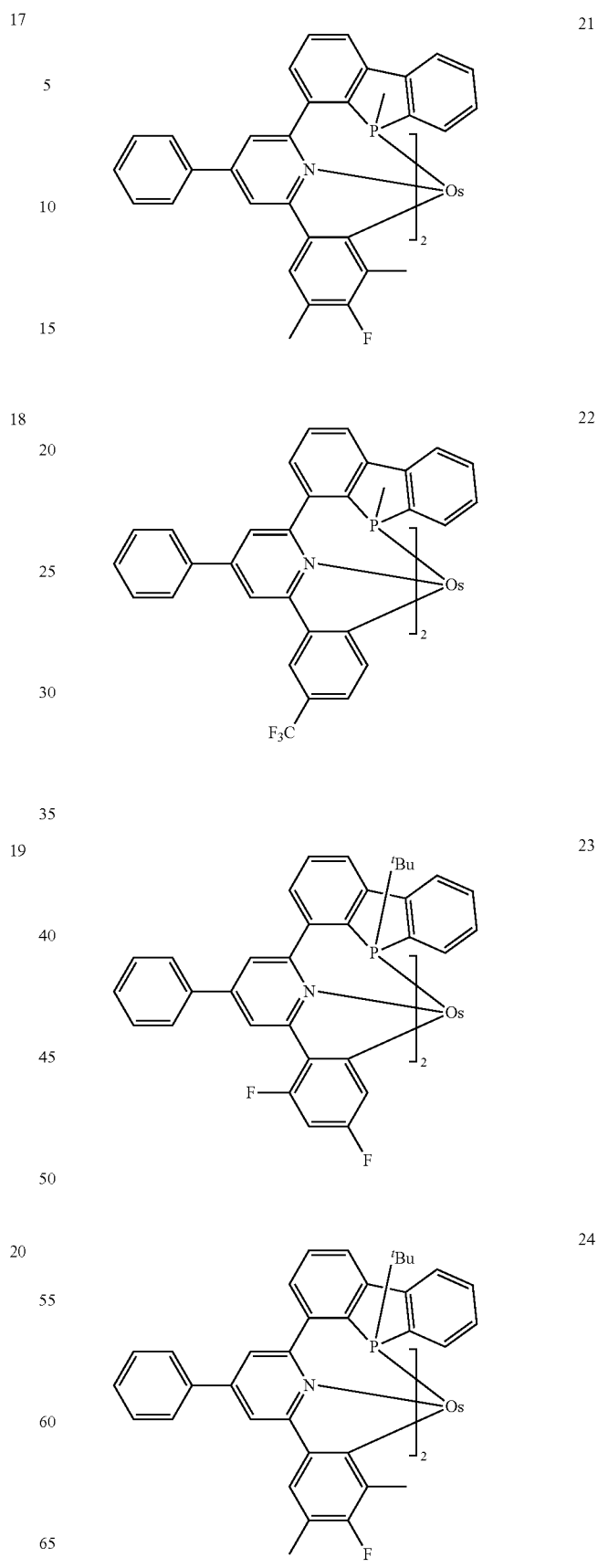

25
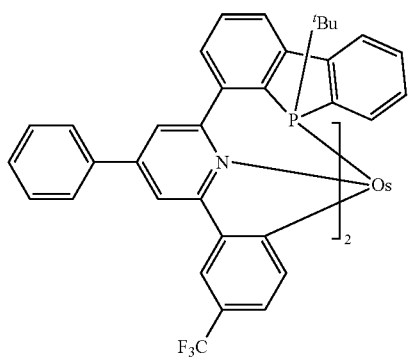
26
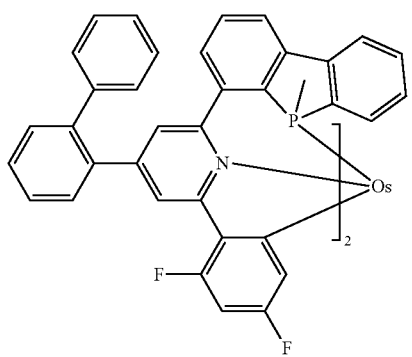
27
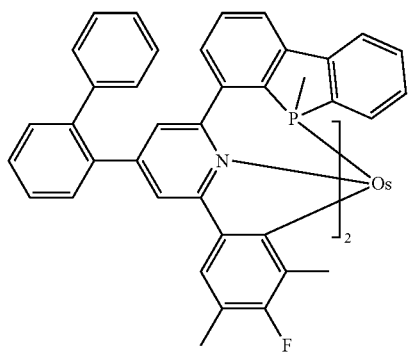
28
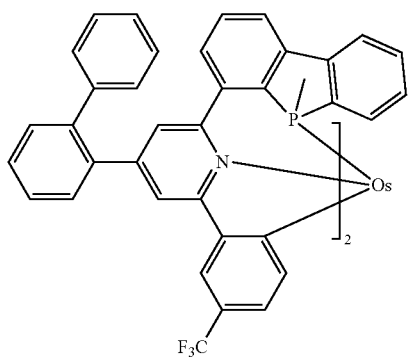
29
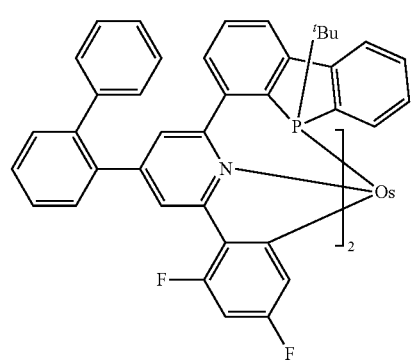
30
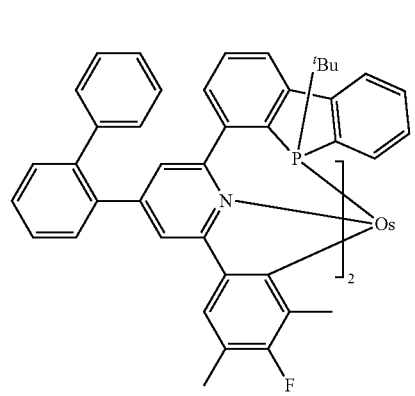
31
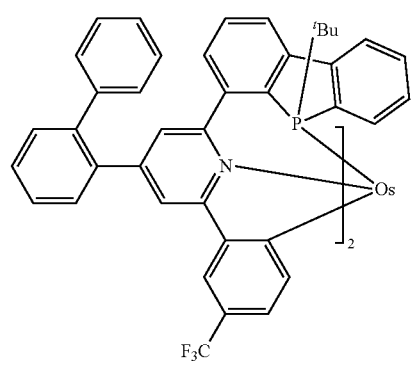
32
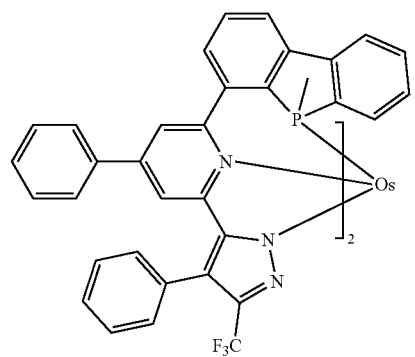

33
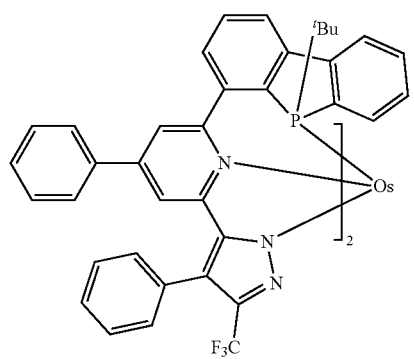
34
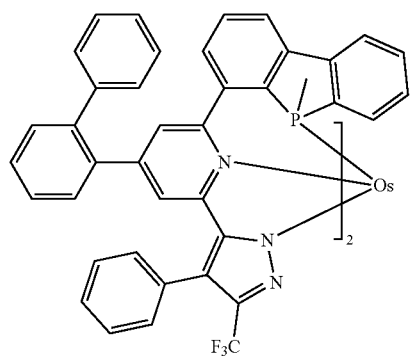
35
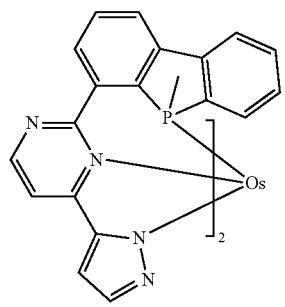
36
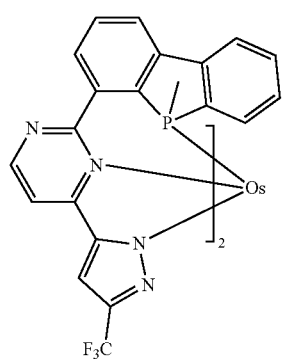
37
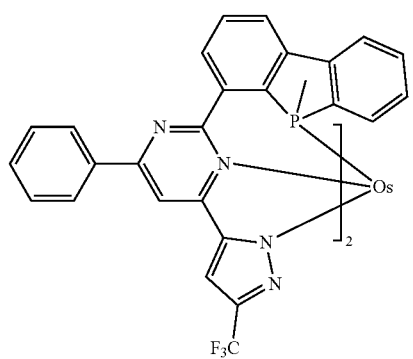
38
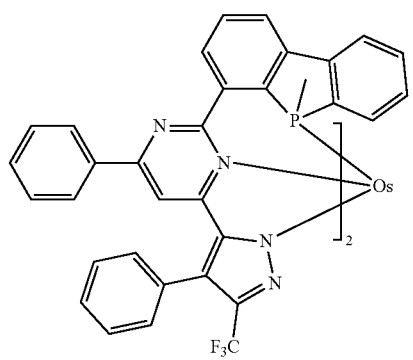
39
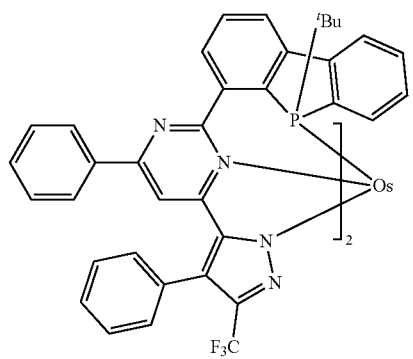
40
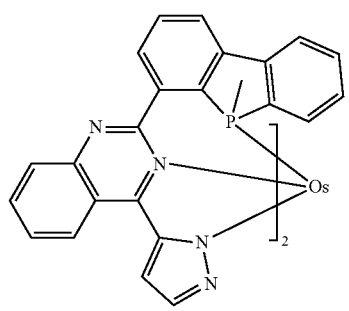

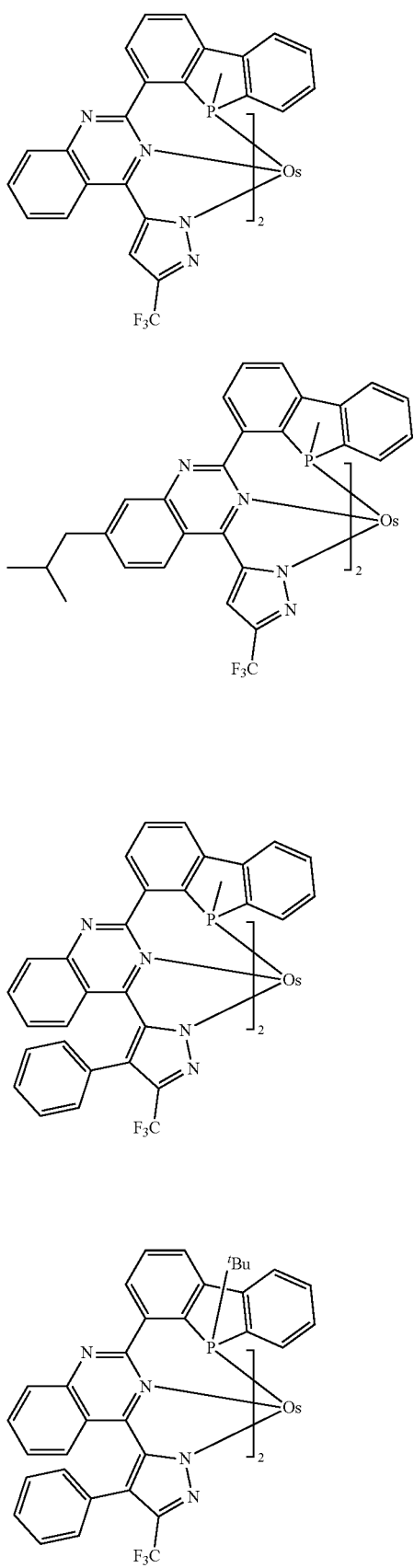

41

42

43

44

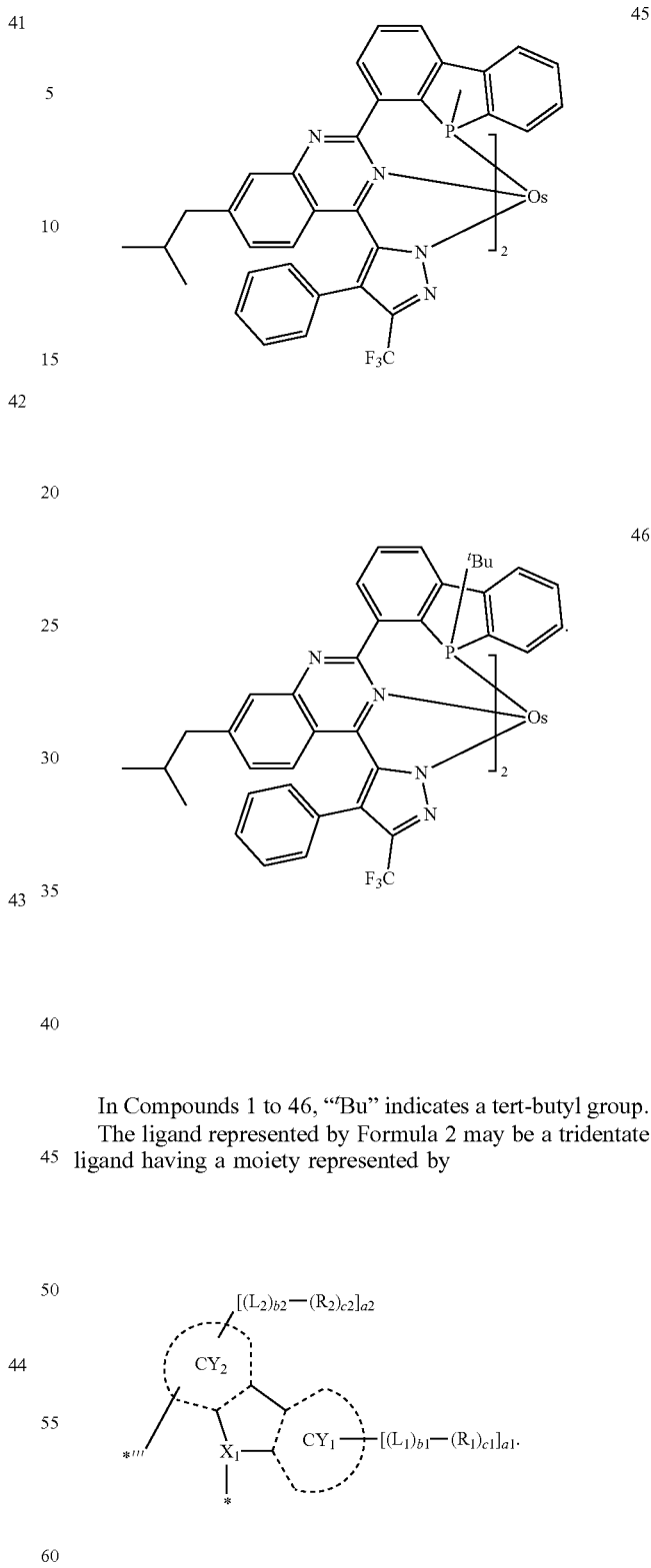

45

46

In Compounds 1 to 46, "$^t$Bu" indicates a tert-butyl group.

The ligand represented by Formula 2 may be a tridentate ligand having a moiety represented by

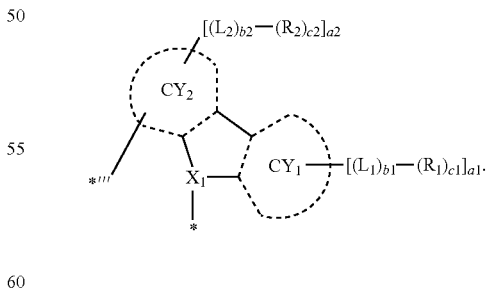

Therefore, in the ligand represented by Formula 2, Cyclo-metallated ring 1 (refer to Formula 2' below) formed by M, $X_1$, $CY_2$, $T_1$, and $CY_3$ may be a ring including at least 6-membered ring (for example, a 6-membered ring, a 7-membered ring, or a 8-membered ring):

Formula 2'

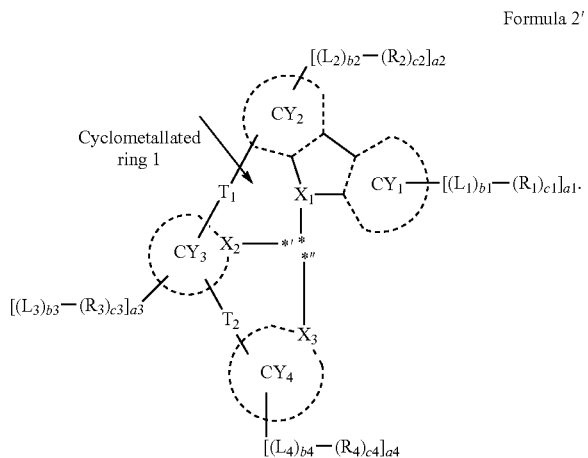

In this regard, the organometallic compound including the ligand represented by Formula 2 may have relatively short radiative decay time and strong metal-ligand charge transfer. In addition, the organometallic compound including the ligand represented by Formula 2 may have excellent chemical resistance, electrical stability, and robustness, at the same time. Furthermore, due to the presence of Cyclometallated ring 1 which is at least 6-membered ring, a stable binding angle between M (metal) and $L_{11}$ (tridentate ligand represented by Formula 2) in Formula 1 may be formed, and thus, the molecular stability of the organometallic compound represented by Formula 1 may be improved. Therefore, an electronic device, for example, an organic light-emitting device, including the organometallic compound, may have improved emission efficiency.

For example, regarding Compounds 1 to 46, the highest occupied molecular orbital (HOMO) levels, the lowest unoccupied molecular orbital (LUMO) levels, and triplet ($T_1$) energy levels are measured according to the density functional theory (DFT) of the Gaussian program (structurally optimized at a level of B3LYP, 6-31G(d,p)), and the measurement results are shown in Table 1.

TABLE 1

| Compound No. | HOMO (eV) | LUMO (eV) | T1 energy level (eV) |
|---|---|---|---|
| 1 | −4.441 | −1.229 | 2.285 |
| 2 | −4.421 | −1.428 | 2.155 |
| 3 | −4.420 | −1.324 | 2.234 |
| 4 | −4.410 | −1.512 | 2.084 |
| 5 | −4.612 | −1.394 | 2.398 |
| 6 | −4.579 | −1.529 | 2.272 |
| 7 | −5.069 | −1.691 | 2.519 |
| 8 | −5.010 | −1.783 | 2.416 |
| 9 | −4.338 | −1.336 | 2.227 |
| 10 | −4.315 | −1.482 | 2.091 |
| 11 | −4.469 | −1.422 | 2.205 |
| 12 | −4.453 | −1.594 | 2.089 |
| 13 | −4.413 | −1.584 | 2.008 |
| 14 | −4.339 | −1.494 | 2.060 |
| 15 | −4.329 | −1.589 | 1.947 |
| 16 | −4.259 | −1.602 | 1.820 |
| 17 | −4.397 | −1.514 | 2.091 |
| 18 | −4.378 | −1.599 | 1.974 |
| 19 | −4.307 | −1.612 | 1.847 |
| 20 | −4.732 | −1.640 | 2.174 |
| 21 | −4.449 | −1.573 | 2.053 |
| 22 | −4.801 | −1.783 | 2.124 |
| 23 | −4.649 | −1.634 | 2.074 |

TABLE 1-continued

| Compound No. | HOMO (eV) | LUMO (eV) | T1 energy level (eV) |
|---|---|---|---|
| 24 | −4.276 | −1.550 | 1.876 |
| 25 | −4.726 | −1.772 | 2.033 |
| 26 | −4.706 | −1.553 | 2.216 |
| 27 | −4.462 | −1.454 | 2.180 |
| 28 | −4.760 | −1.693 | 2.162 |
| 29 | −4.620 | −1.539 | 2.113 |
| 30 | −4.407 | −1.446 | 2.080 |
| 31 | −4.667 | −1.685 | 2.065 |
| 32 | −4.971 | −1.752 | 2.407 |
| 33 | −4.968 | −1.758 | 2.400 |
| 34 | −4.982 | −1.651 | 2.498 |
| 35 | −4.881 | −1.602 | 2.423 |
| 36 | −5.324 | −1.913 | 2.521 |
| 37 | −5.212 | −2.041 | 2.348 |
| 38 | −5.153 | −1.990 | 2.342 |
| 39 | −5.141 | −1.991 | 2.330 |
| 40 | −4.878 | −1.913 | 2.101 |
| 41 | −5.274 | −2.219 | 2.205 |
| 42 | −5.201 | −2.126 | 2.220 |
| 43 | −5.172 | −2.210 | 2.103 |
| 44 | −5.146 | −2.174 | 2.096 |
| 45 | −5.120 | −2.133 | 2.129 |
| 46 | −5.092 | −2.100 | 2.109 |

From Table 1, it has been confirmed that the organometallic compound represented by Formula 1 has such electric characteristics that are suitable for use in an electric device, for example, for use as a dopant for an organic light-emitting device.

Synthesis methods of the organometallic compound represented by Formula 1 may be understood by one of ordinary skill in the art by referring to Synthesis Examples provided below.

The organometallic compound represented by Formula 1 may be suitable for use in an organic layer of an organic light-emitting device, for example, for use as a dopant in an emission layer of the organic layer. Thus, according to another aspect of an embodiment, provided is an organic light-emitting device including: a first electrode, a second electrode, and an organic layer that is disposed between the first electrode and the second electrode, wherein the organic layer includes an organic layer including an emission layer and at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound represented by Formula 1 may be used between a pair of electrodes of the organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one of organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this regard, Compound 1 and Compound 2 may be included in an identical layer (for example, Compound 1 and Compound 2 both may be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, a buffer layer, or any combination thereof, and wherein the electron transport region includes a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including a metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide (SnO2), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 Angstroms per second (Å/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, R-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

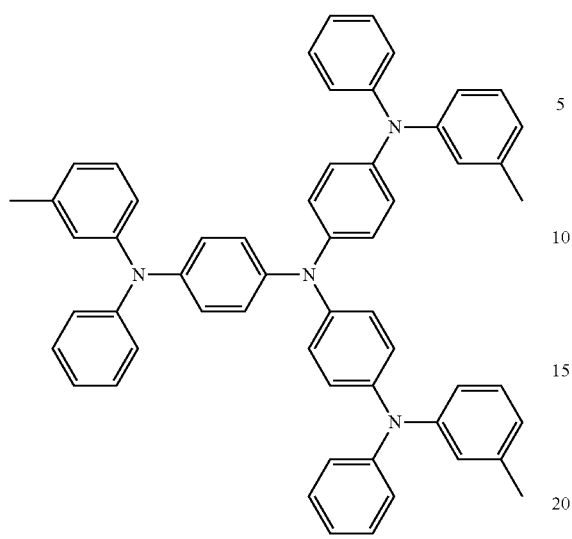
m-MTDATA
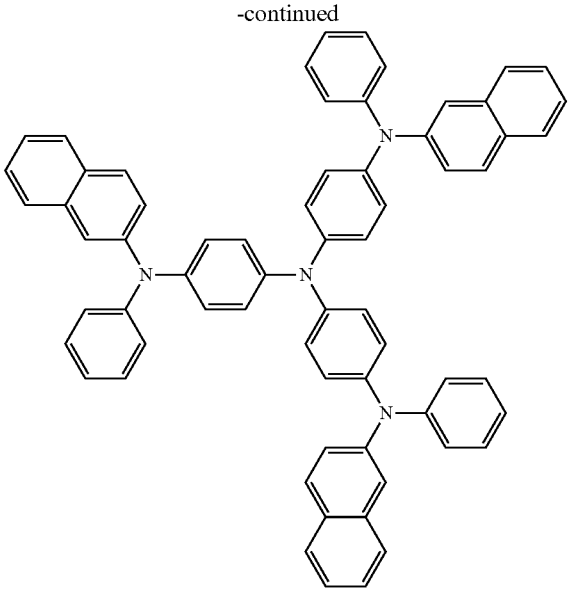
2-TNATA
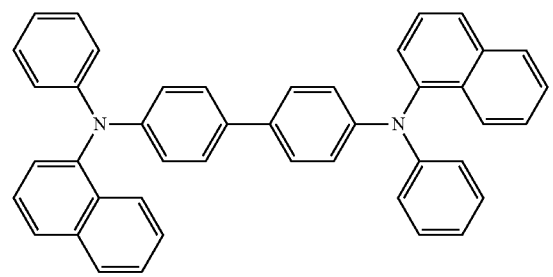
NPB
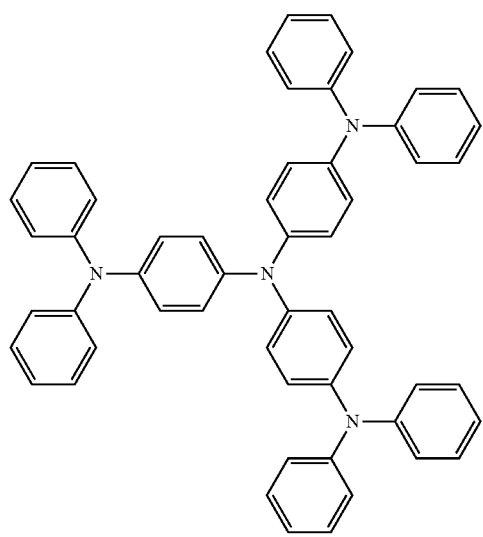
TDATA
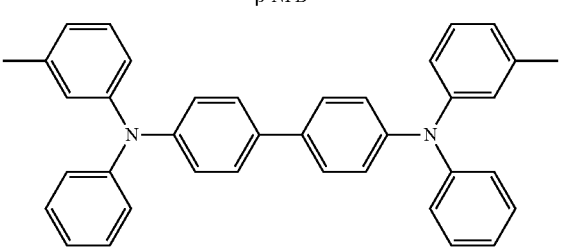
β-NPB
TPD Spiro-TPD Spiro-NPB methylated NPB

TAPC

HMTPD

Formula 201

Formula 202

Ar$_{101}$ and Ar$_{102}$ in Formula 201 may each be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

In Formula 201, xa and xb may each independently be an integer from 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

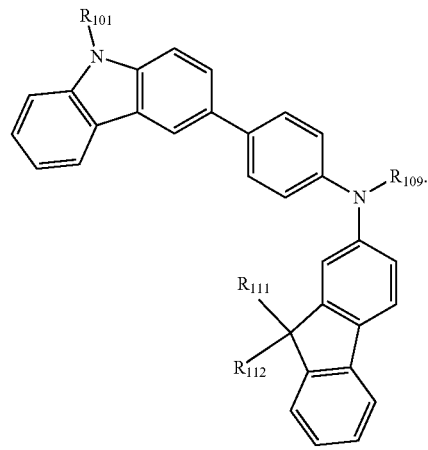

$R_{101}$, $R_{111}$, $R_{112}$, and $R_{109}$ in Formula 201A are each independently the same as described above.

For example, the compound represented by Formula 201 and the compound represented by Formula 202 may each include Compounds HT1 to HT20 below, but embodiments of the present disclosure are not limited thereto:

HT1

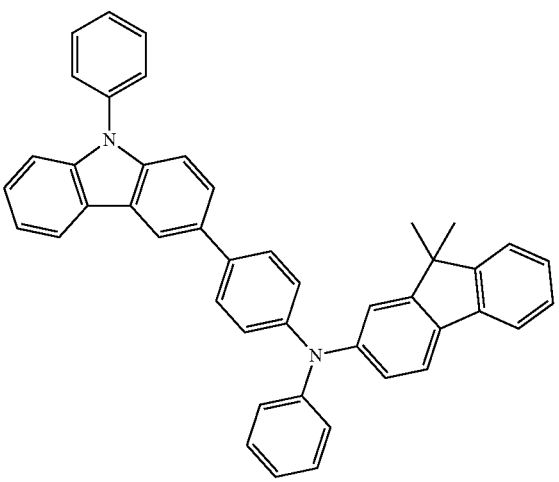

HT2
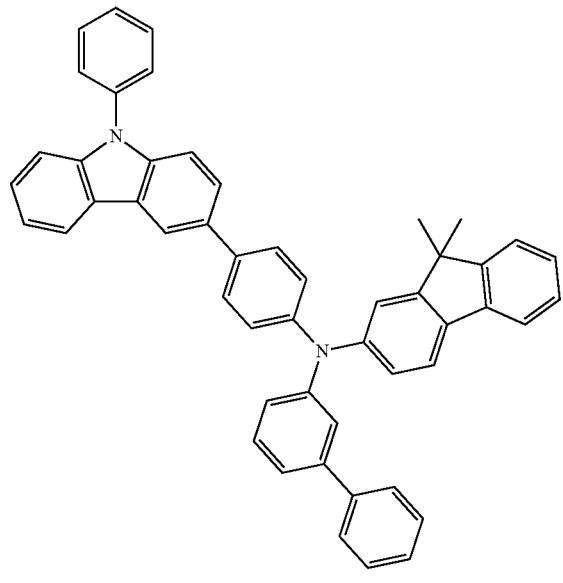
HT4
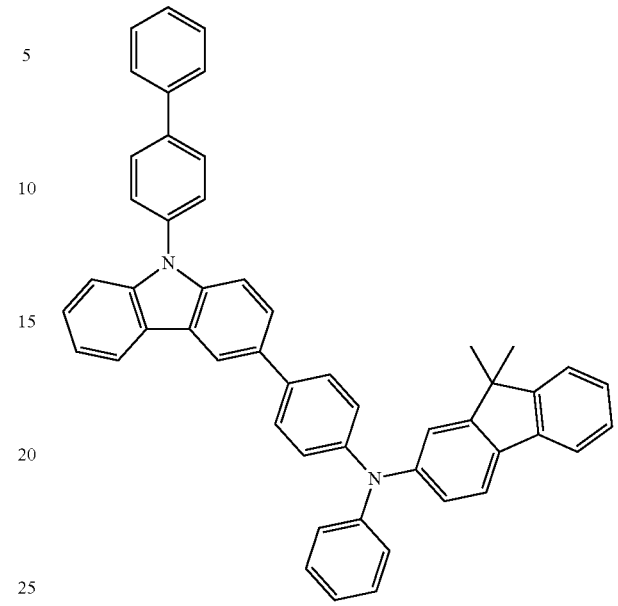
HT3
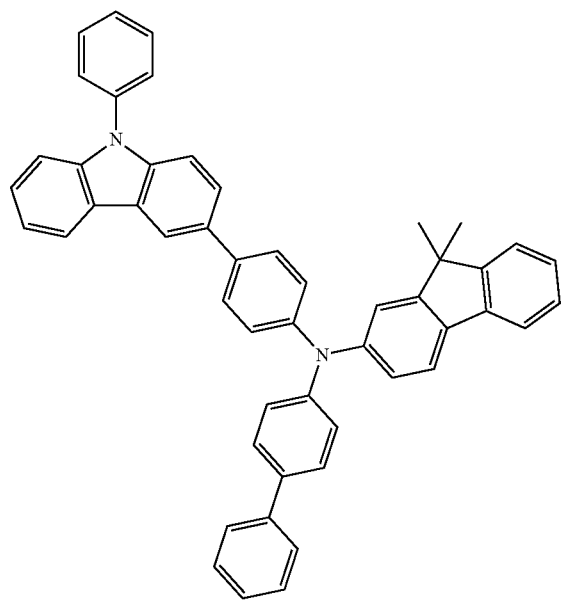
HT5
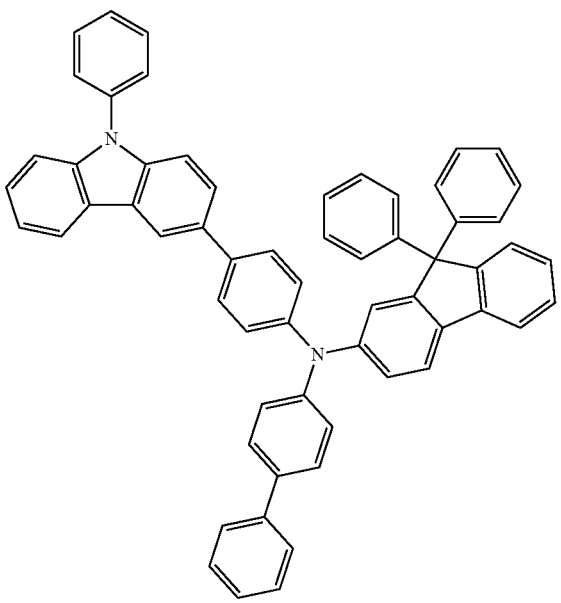

HT6
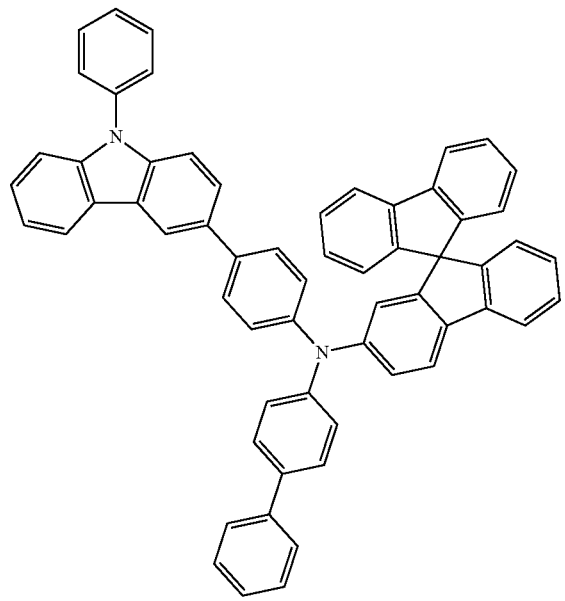
HT7
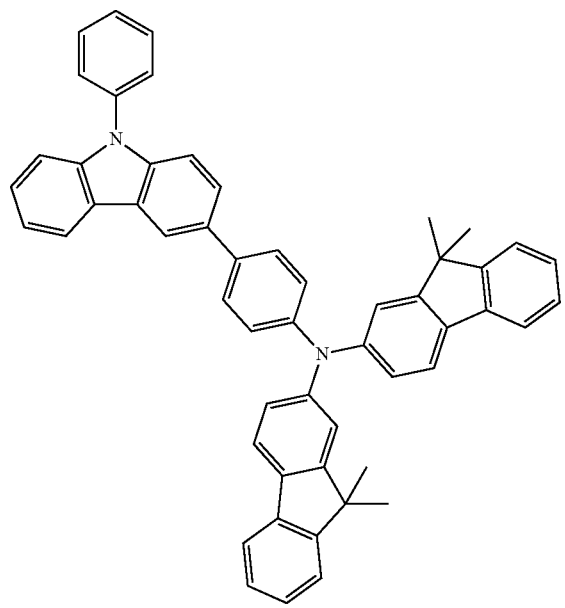
HT8
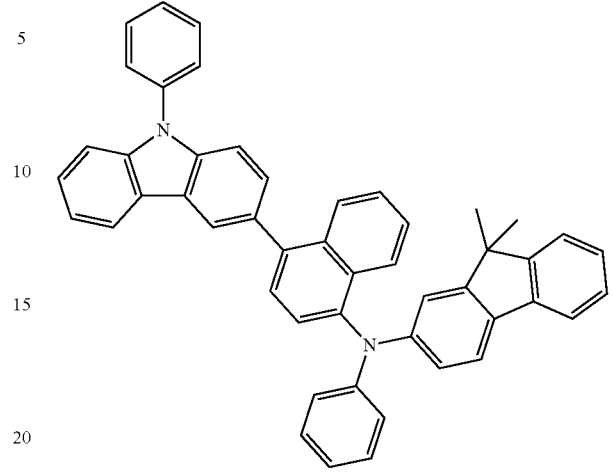
HT9
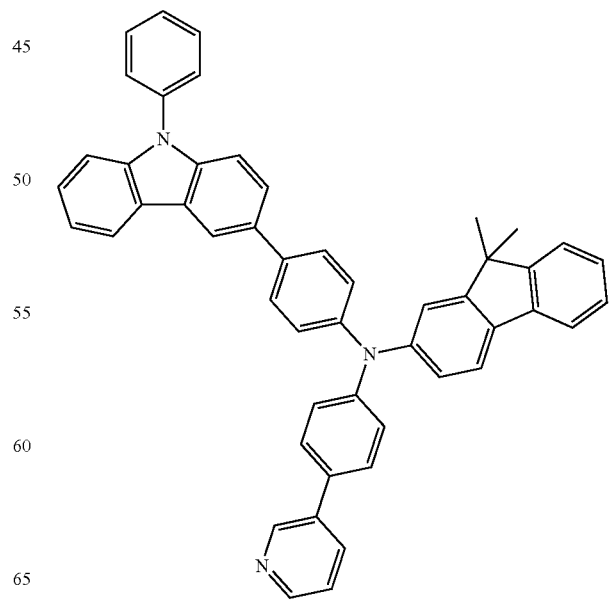
HT10

HT11
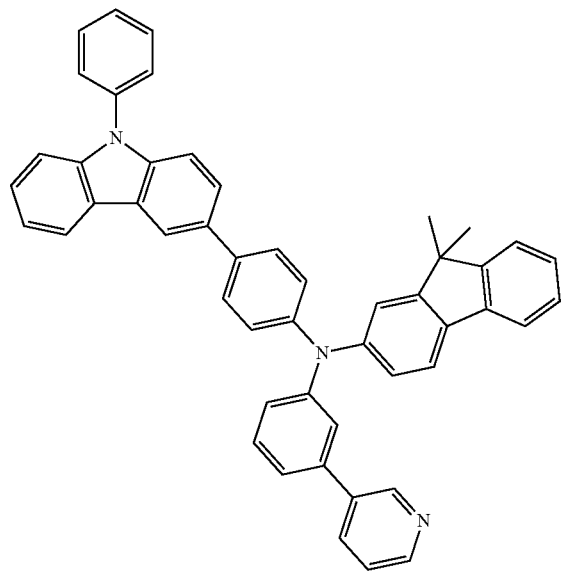
HT12
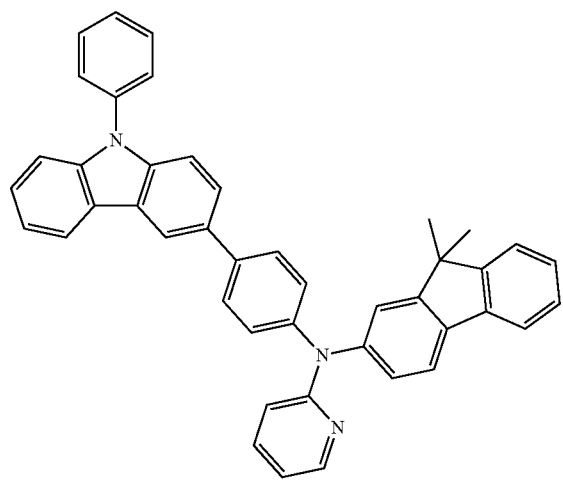
HT13
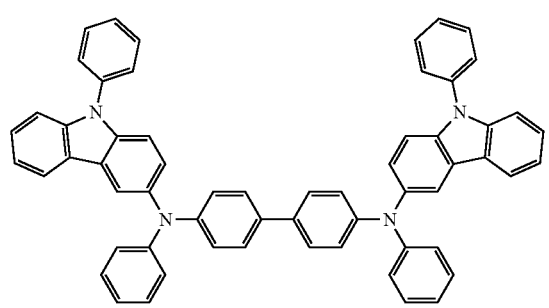
HT14
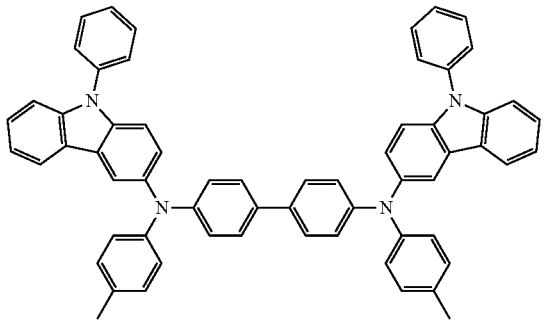
HT15
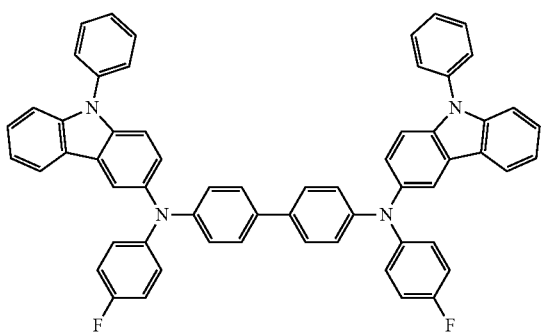
HT16
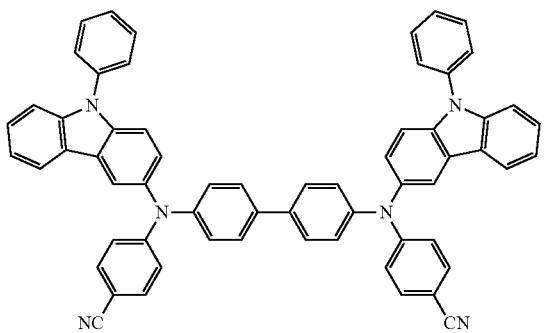
HT17

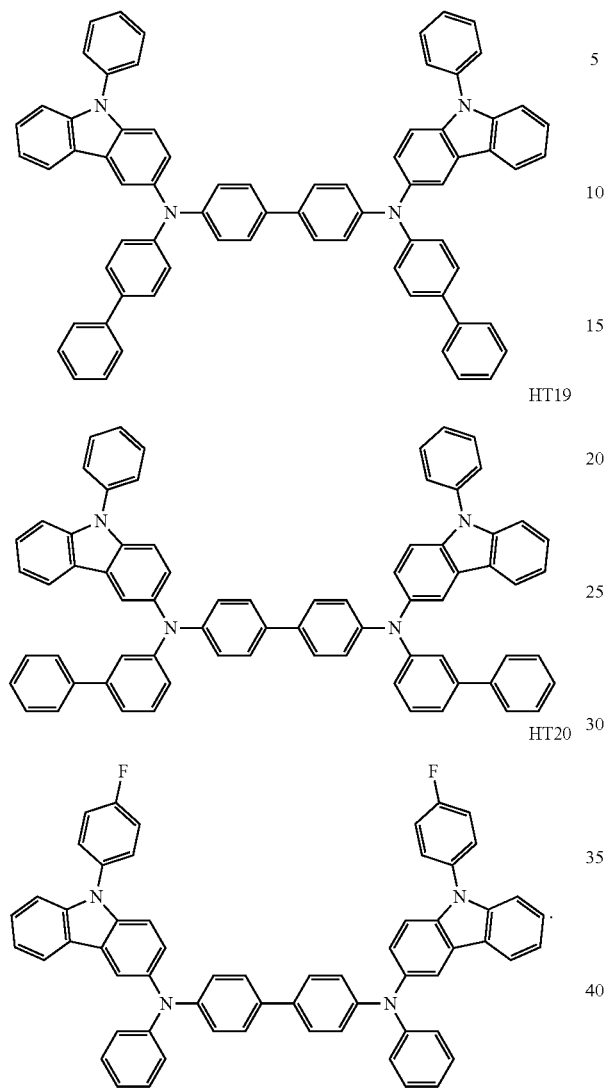

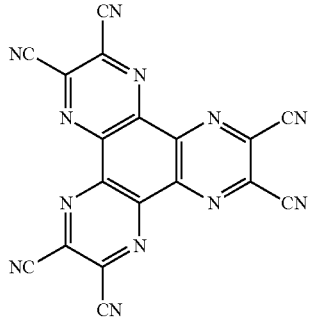

Compound HT-D1

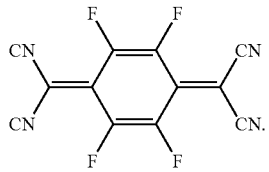

F4-TCNQ

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto.

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1 or the composition containing the organometallic compound represented by Formula 1.

The host may include at least one selected from TPBi, TBADN, ADN (also referred to as "DNA"), CBP, CDBP, TCP, mCP, Compound H50, Compound H51, and Compound H52:

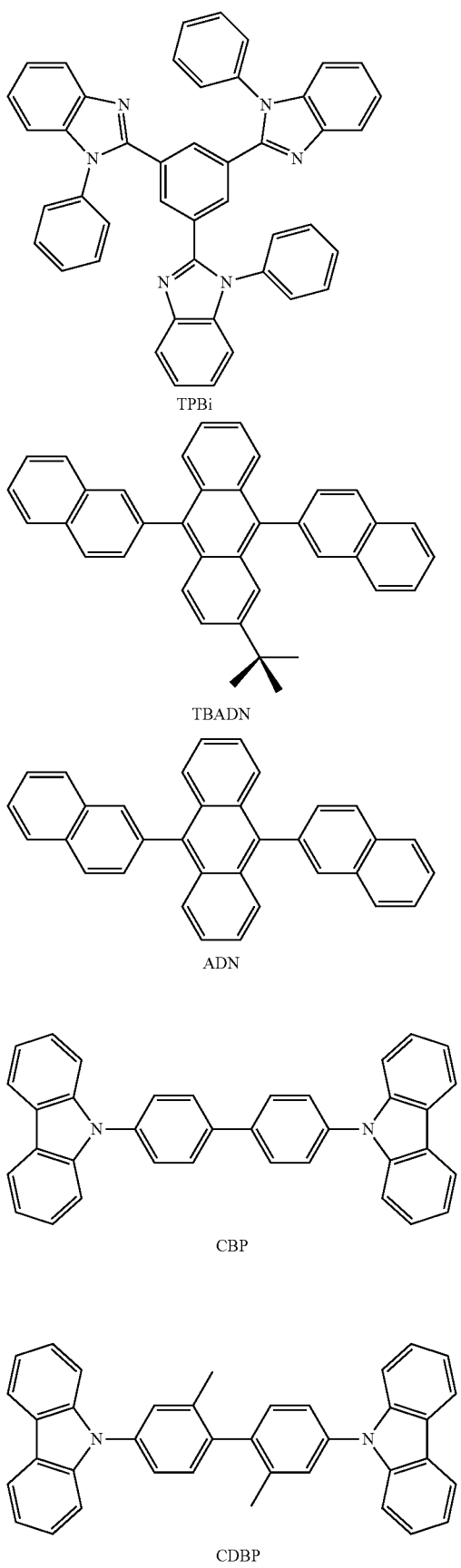
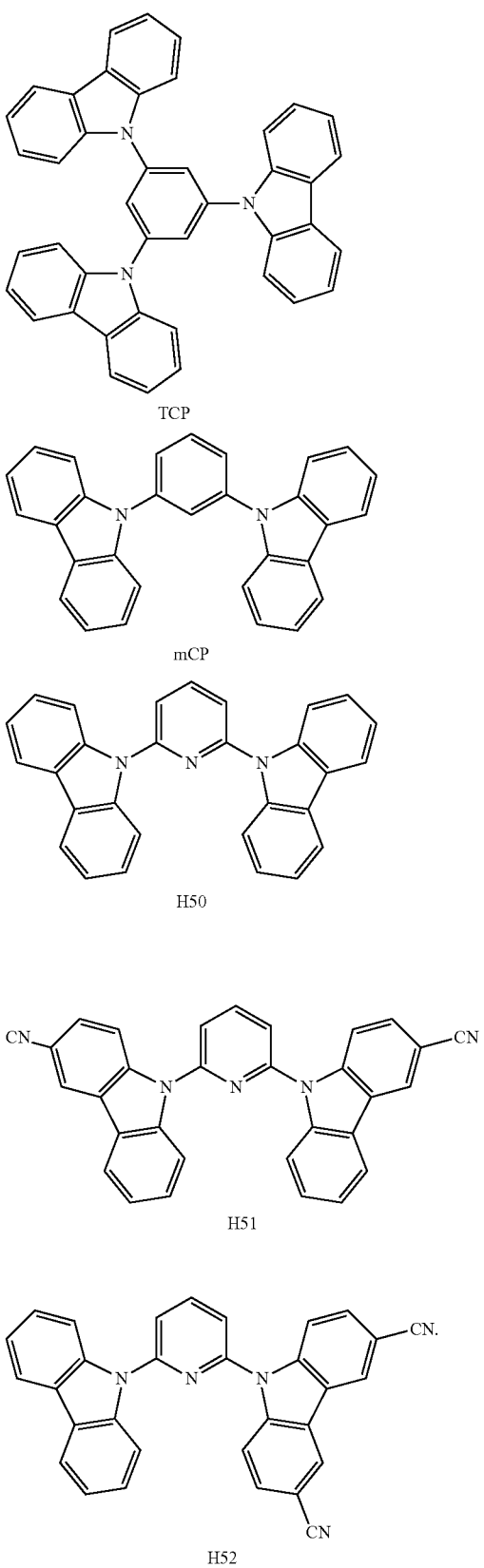
In one or more embodiments, the host may further include a compound represented by Formula 301 below.

Formula 301

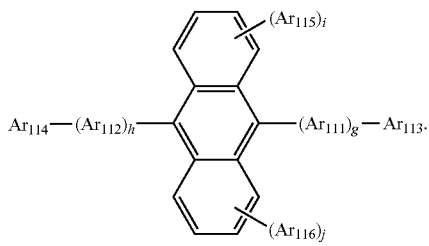

Ar$_{111}$ and Ar$_{112}$ in Formula 301 may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

Ar$_{113}$ to Ar$_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j In Formula 301 may each independently be an integer from 0 to 4, and may be, for example, 0, 1, or 2.

Ar$_{113}$ to Ar$_{116}$ in Formula 301 may each be selected from:

a $C_1$-$C_{10}$ alkyl group substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

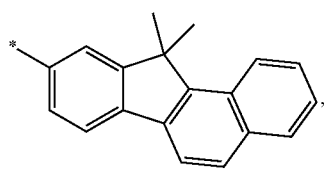 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

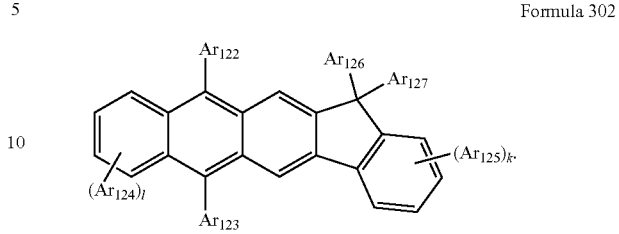

Ar$_{122}$ to Ar$_{125}$ in Formula 302 are the same as described in detail in connection with Ar$_{113}$ in Formula 301.

Ar$_{126}$ and Ar$_{127}$ in Formula 302 may each be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

The compound represented by Formula 301 and the compound represented by Formula 302 may include Compounds H1 to H42 below, but are not limited thereto:

H1

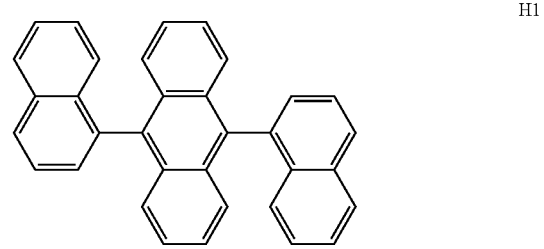

H2

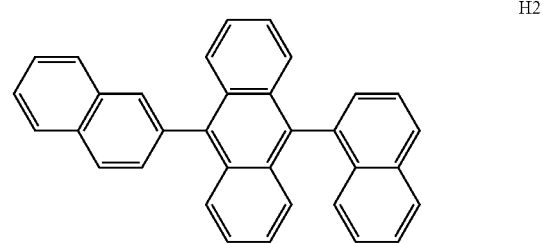

H3

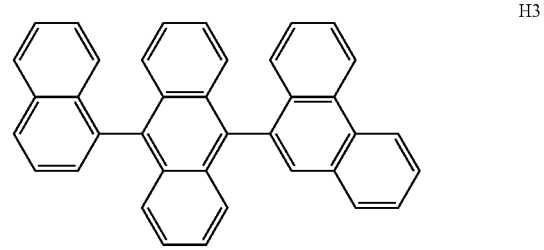

H4

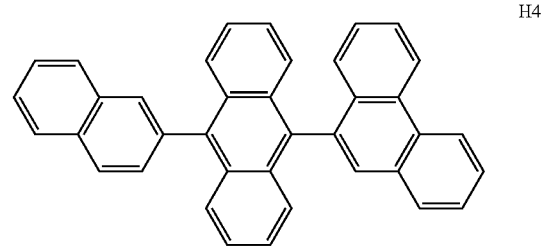

H5
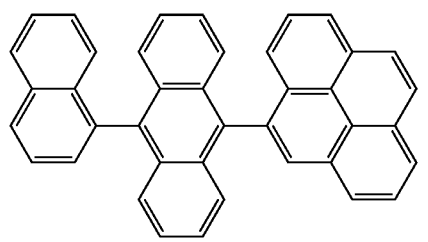
H6
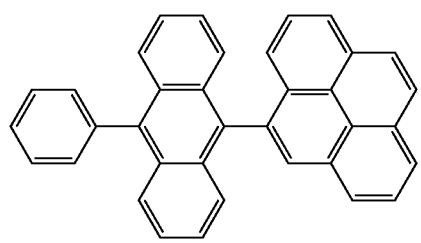
H7
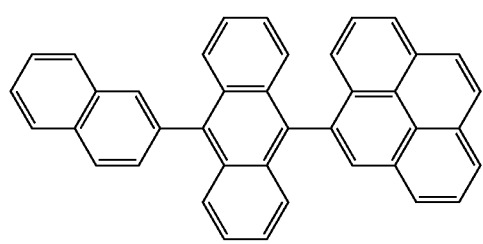
H8
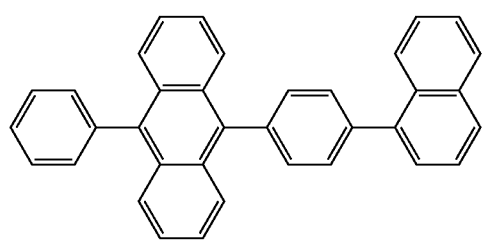
H9
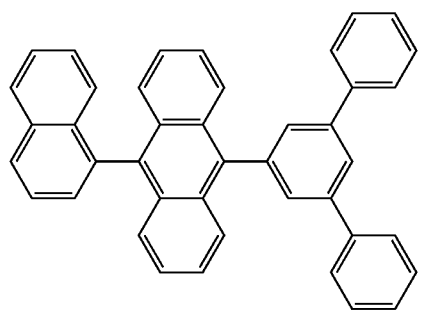
H10
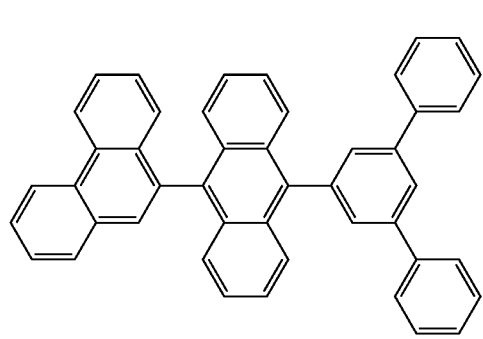
H11
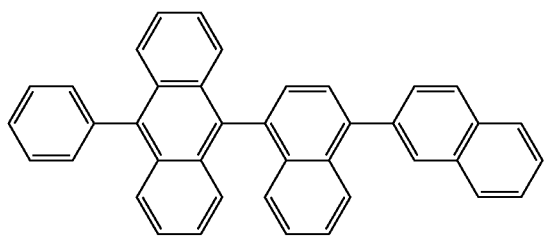
H12
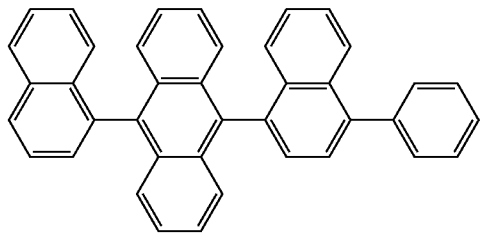
H13
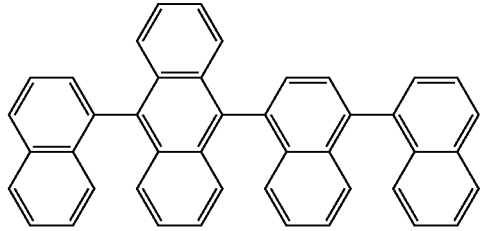
H14
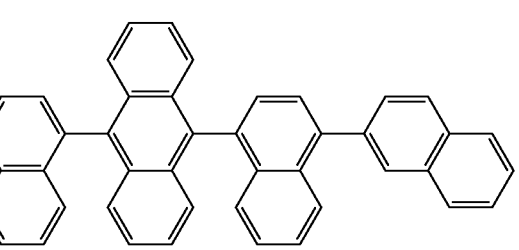
H15
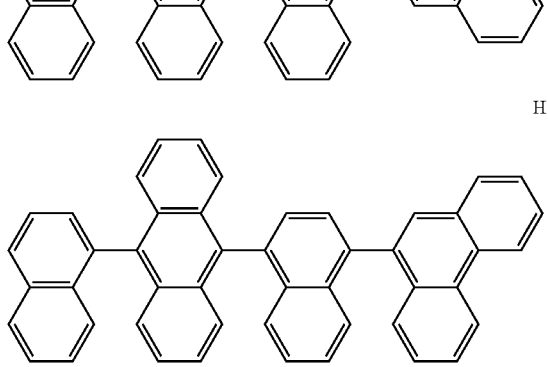
H16
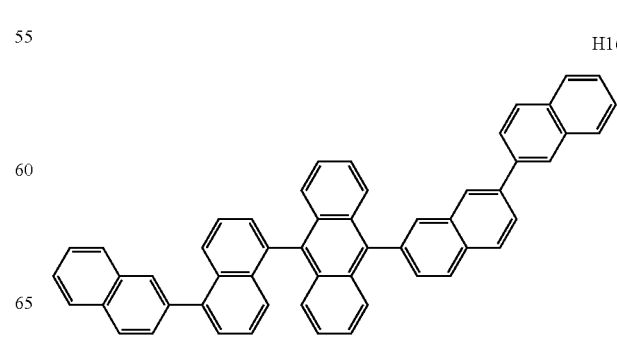

-continued
H17
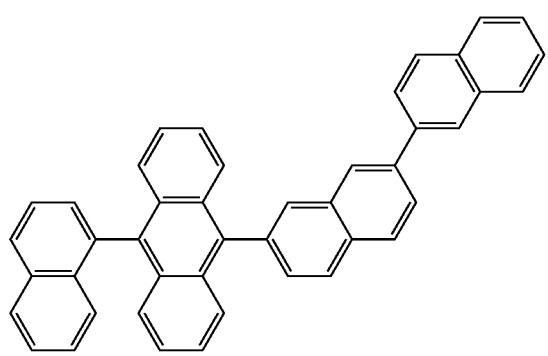
H18
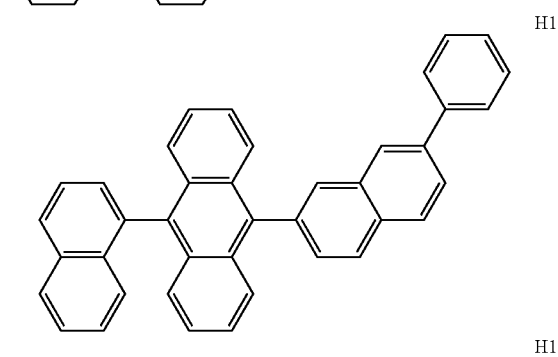
H19
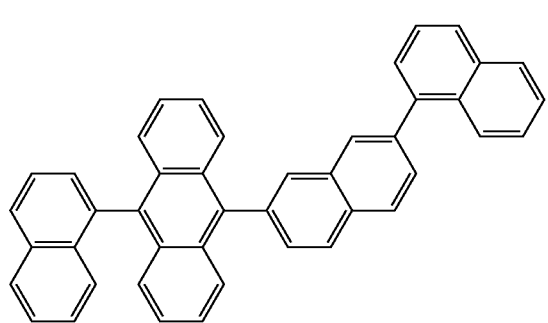
H20
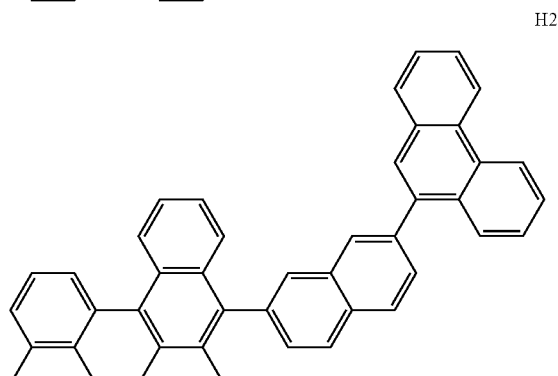
H21
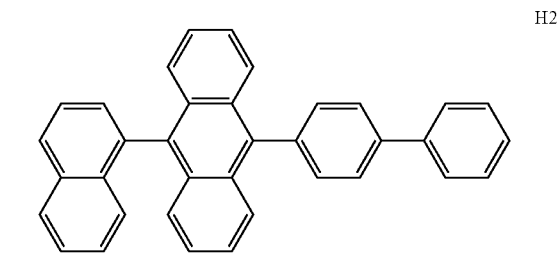
-continued
H22
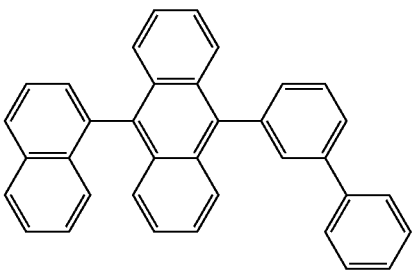
H23
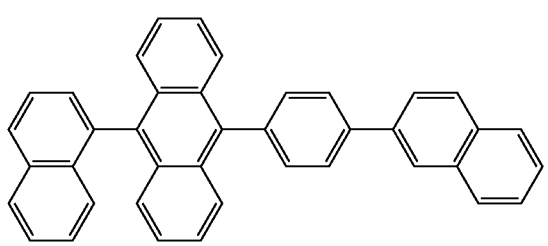
H24
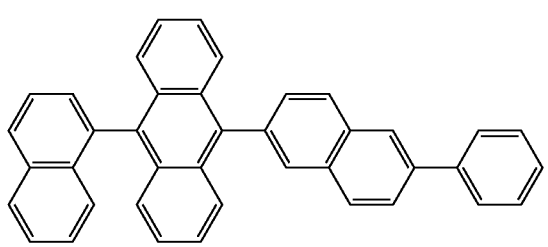
H25
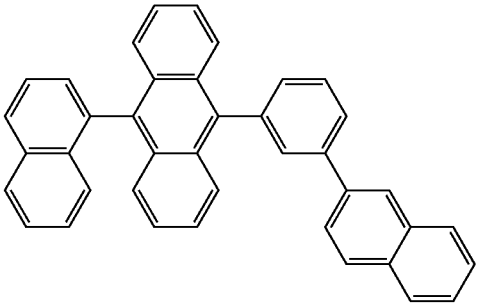
H26
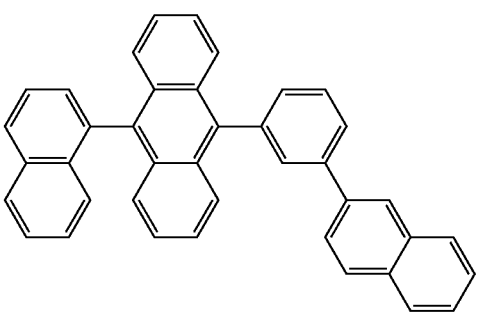

-continued
H27
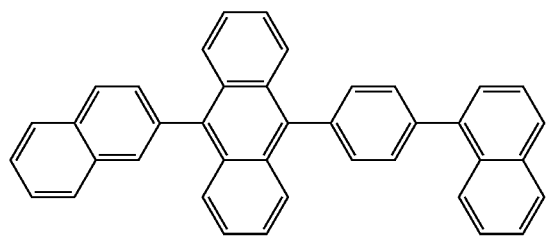
H28
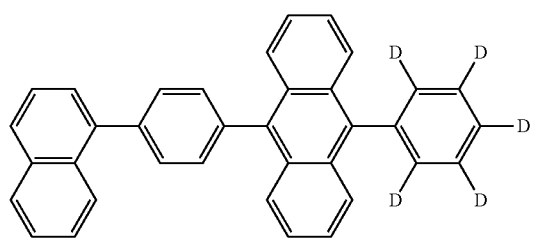
H29
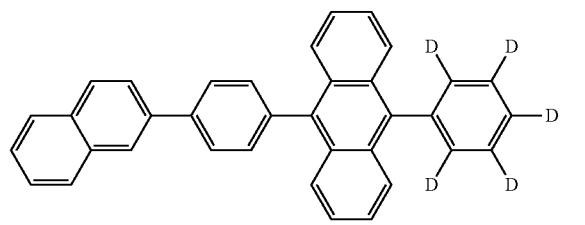
H30
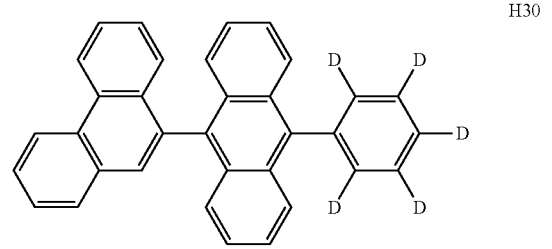
H31
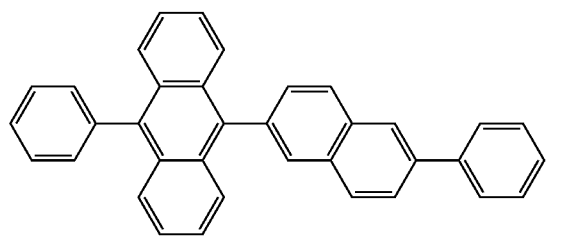
H32
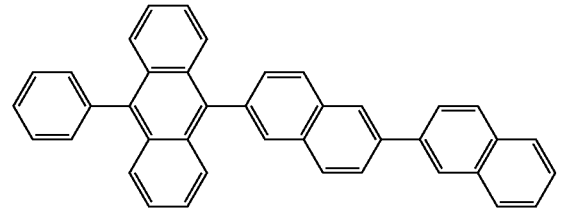
-continued
H33
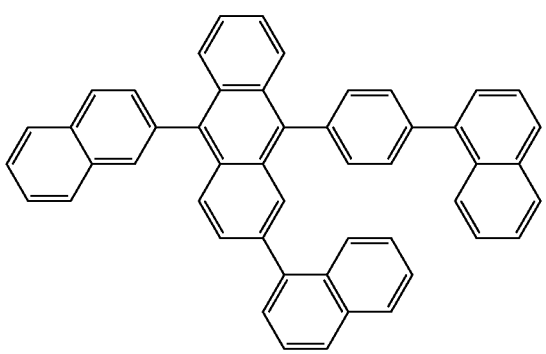
H34
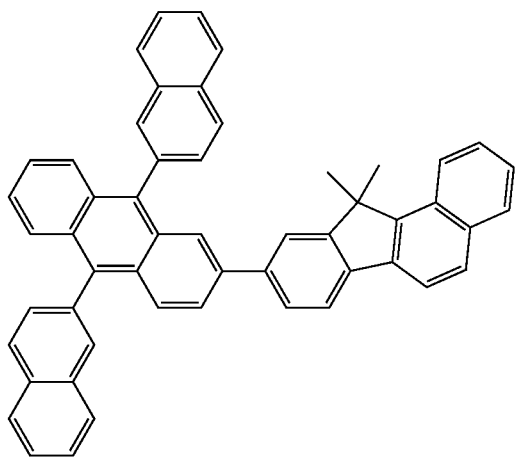
H35
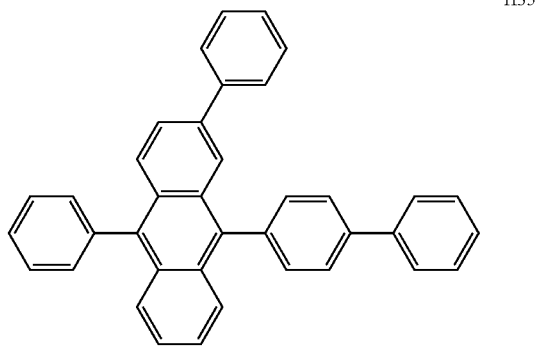

99
-continued
H36
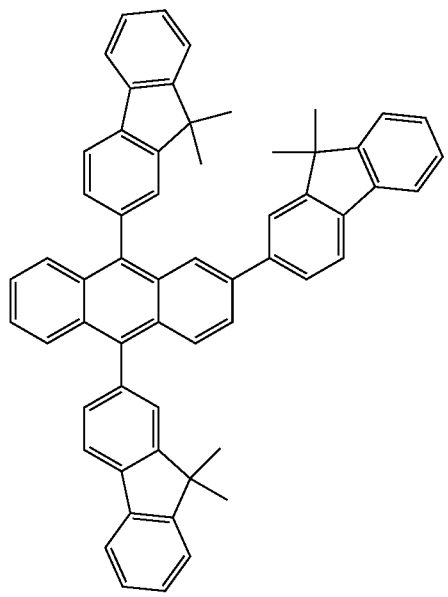
H37
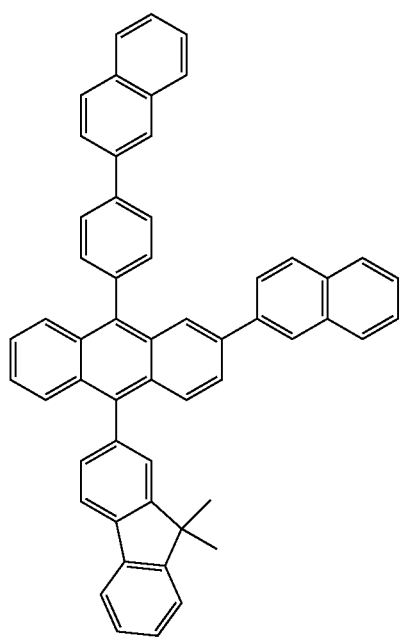
H38
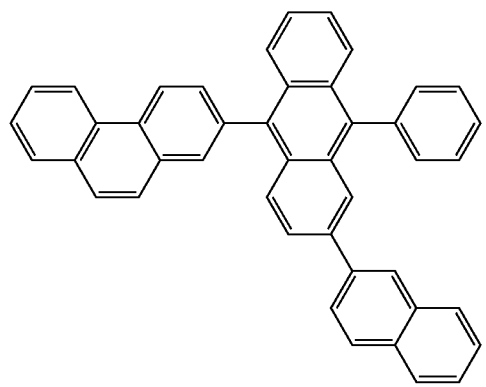
100
-continued
H39
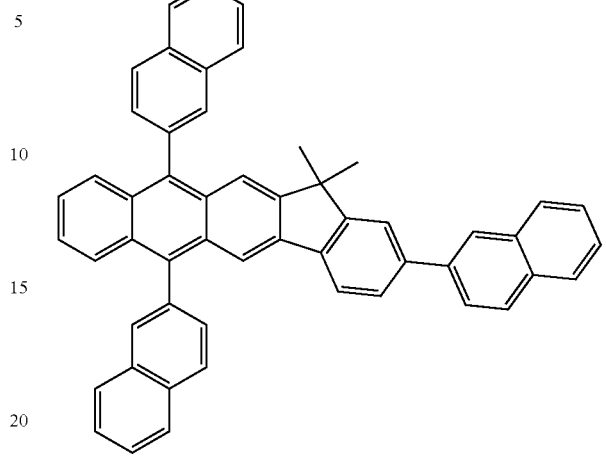
H40
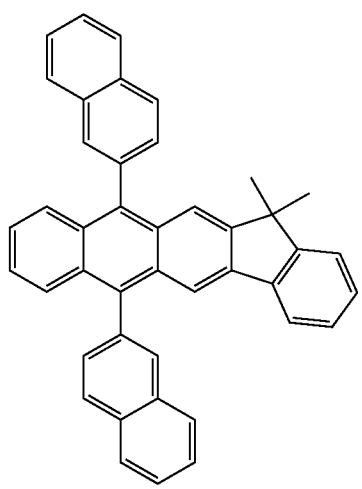
H41
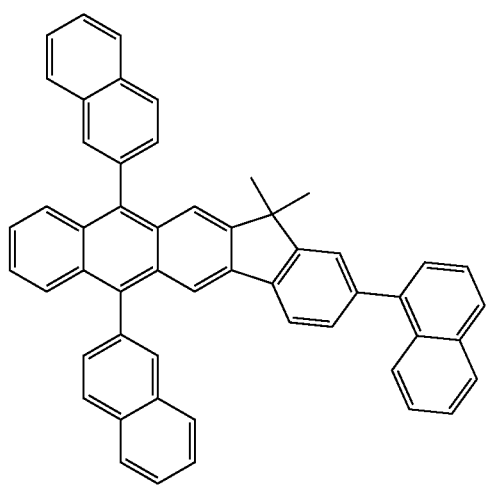

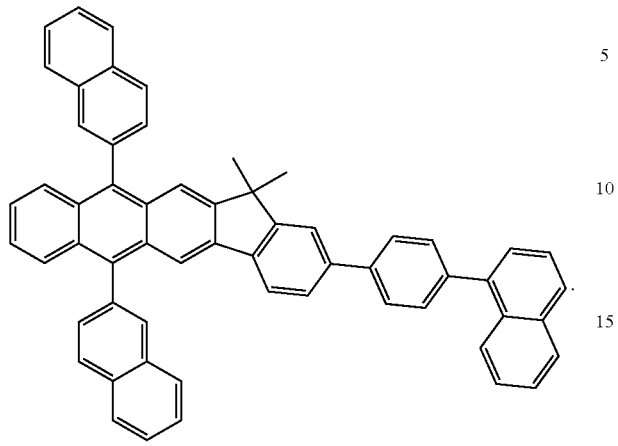

H42

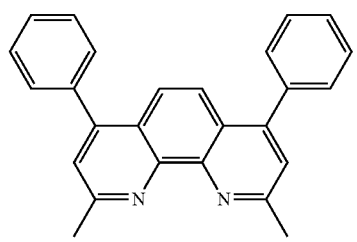

BCP

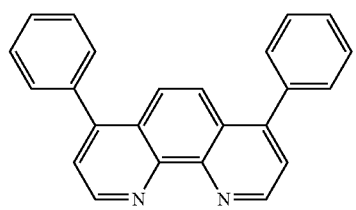

Bphen

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto:

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may include at least one selected from BCP, Bphen, $Alq_3$, BAlq, TAZ, and NTAZ:

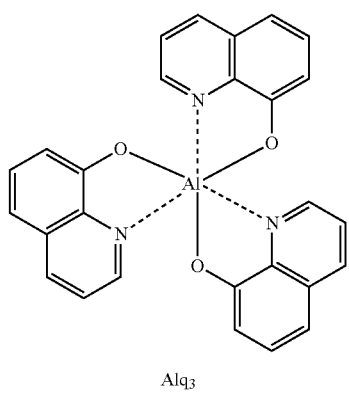

$Alq_3$

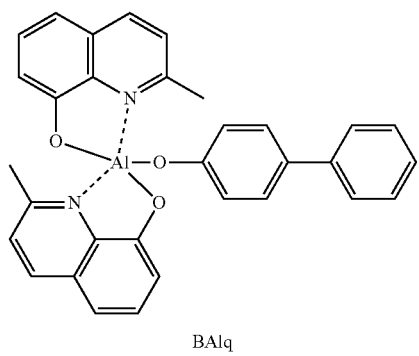

BAlq

-continued
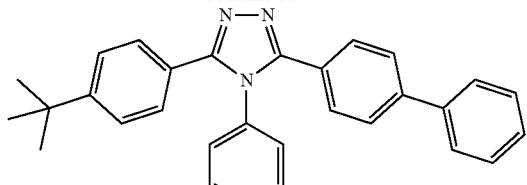
TAZ
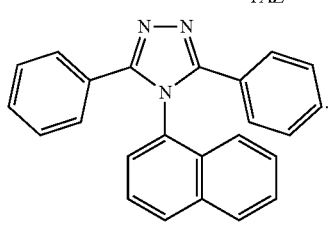
NTAZ
In one or more embodiments, the electron transport layer may include at least one of ET1 to ET25, but are not limited thereto:
ET1
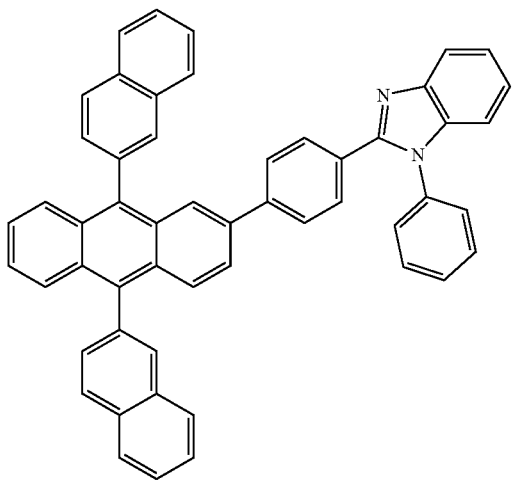
ET2
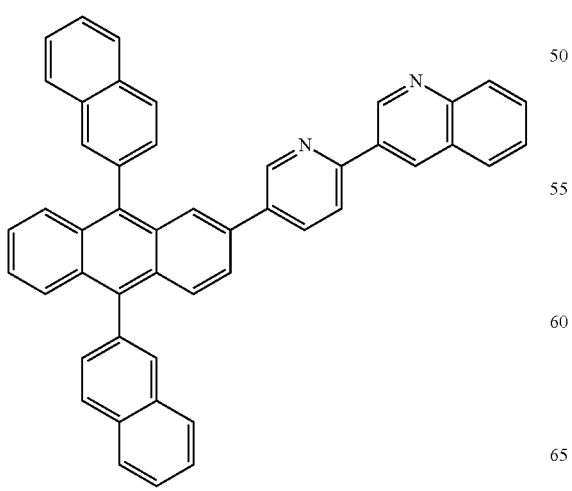
-continued
ET3
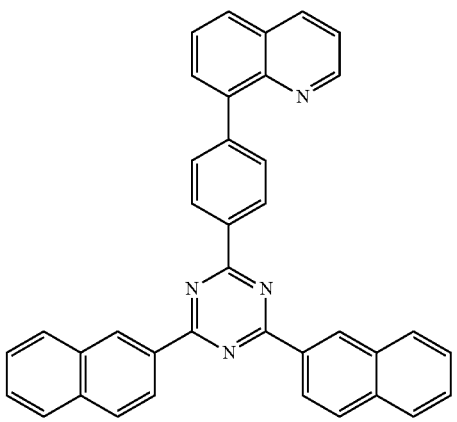
ET4
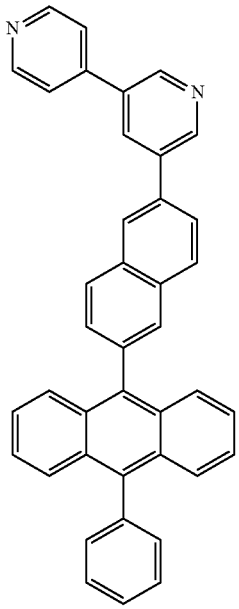
ET5
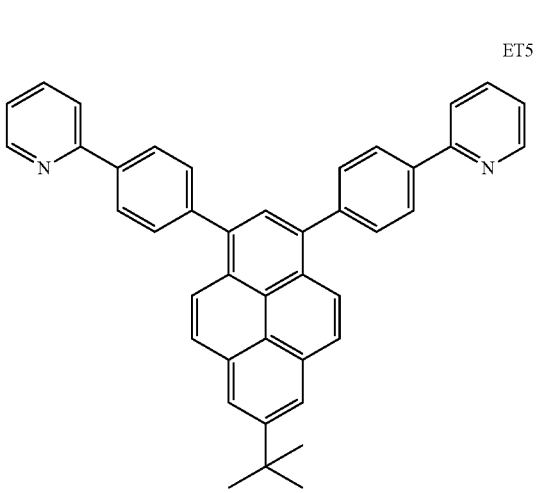

ET6
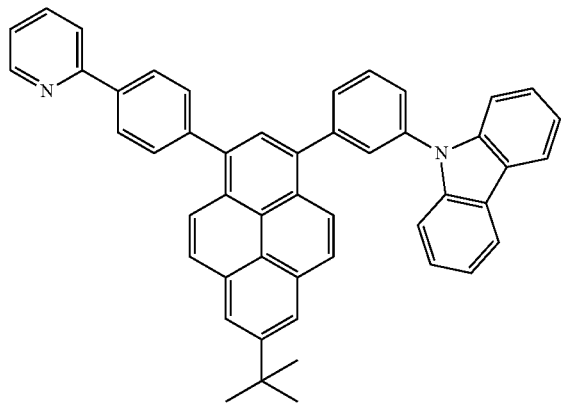
ET7
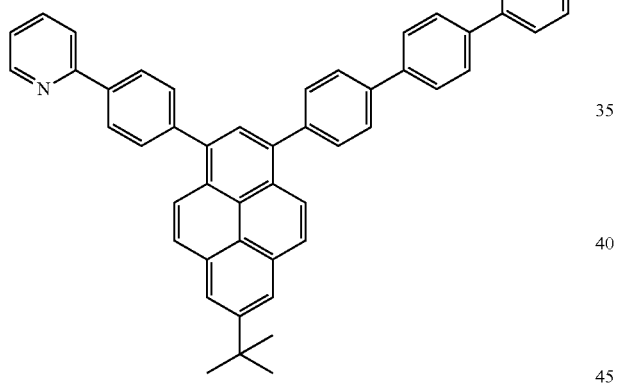
ET8
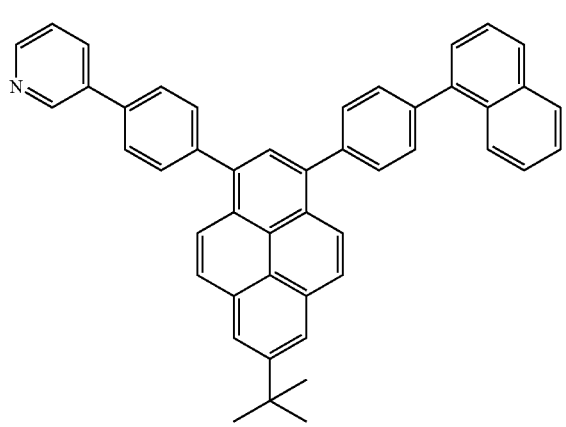
ET9
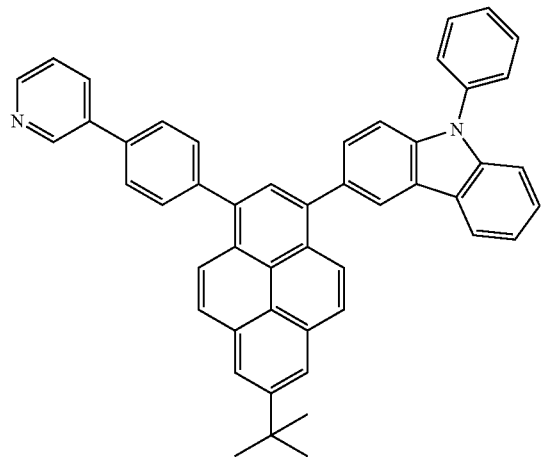
ET10
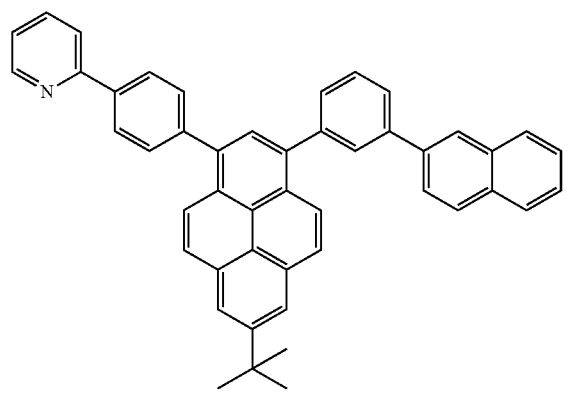
ET11
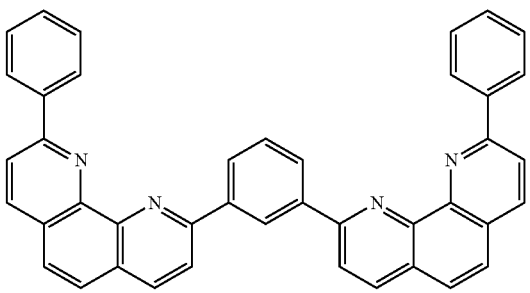
ET12
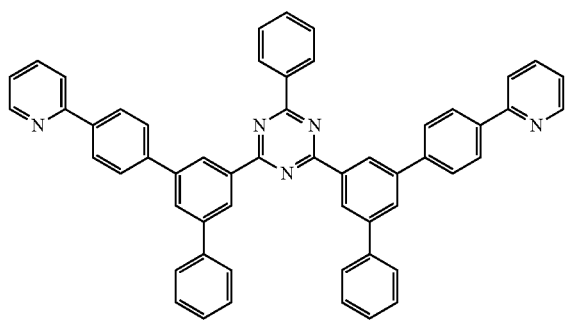

ET13
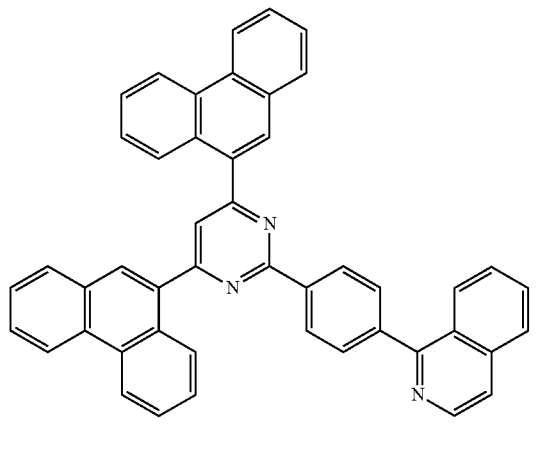
ET14
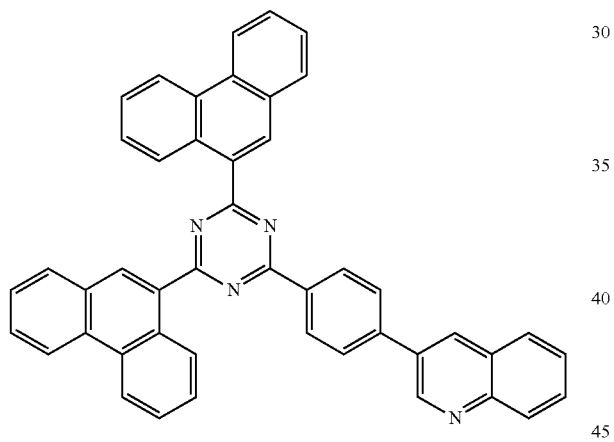
ET15
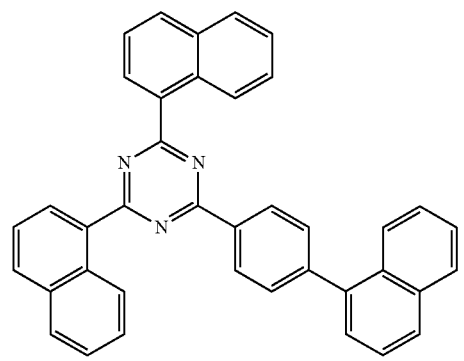
ET16
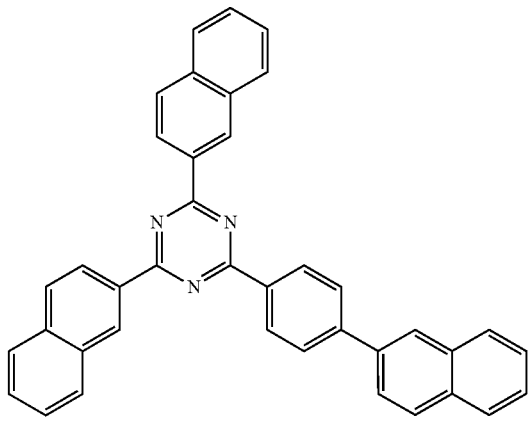
ET17
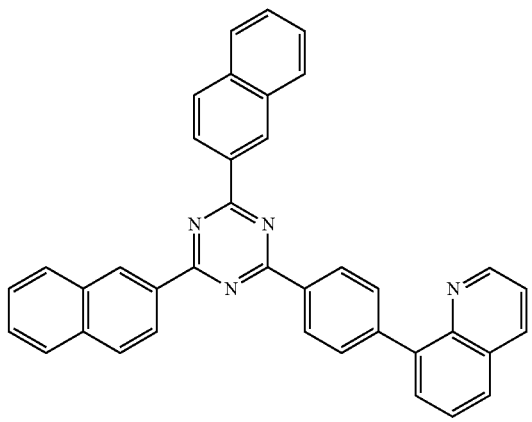
ET18
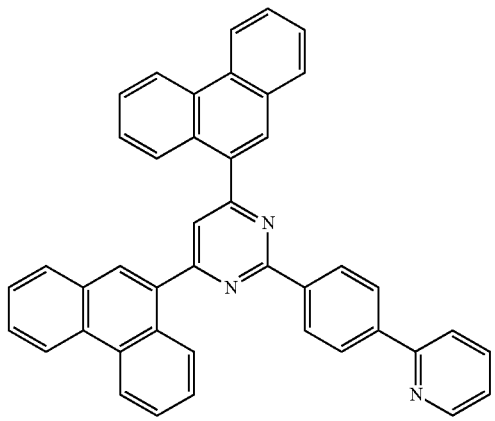

ET19
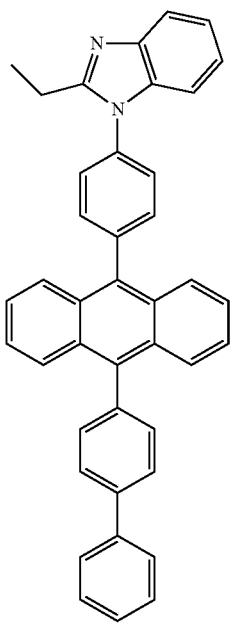
ET20
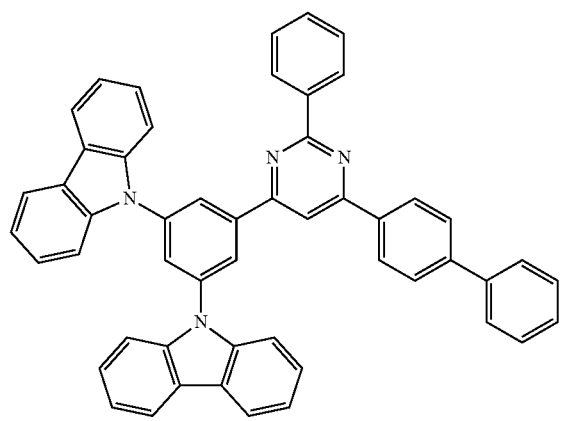
ET21
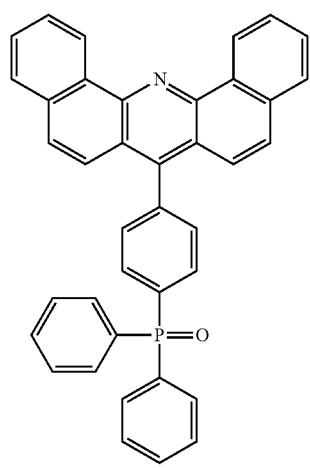
ET22
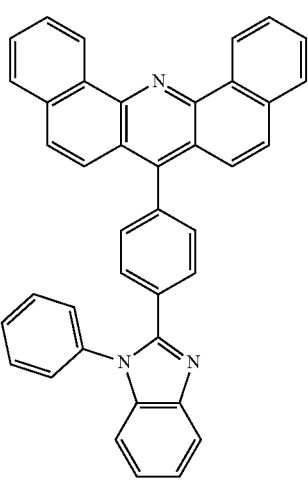
ET23
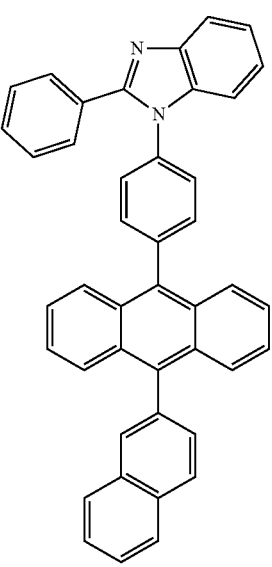
ET24
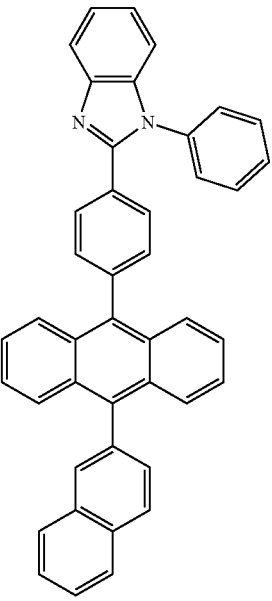

ET25

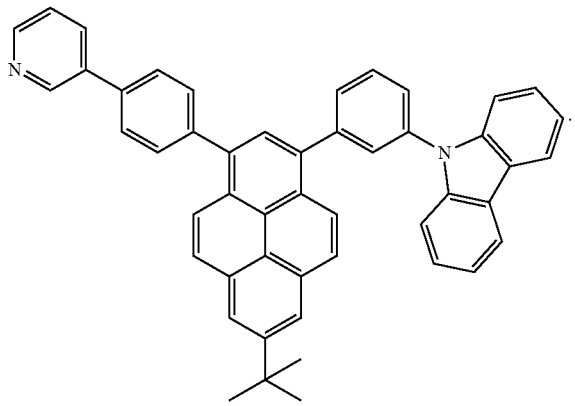

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2.

ET-D1

ET-D2

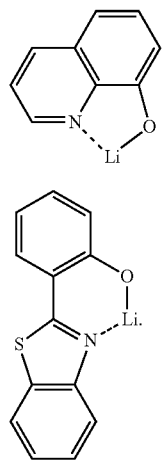

The electron transport region may include an electron injection layer that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

According to another aspect of an embodiment, provided is a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic hydrocarbon group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a heterocyclic aromatic system that has at least one heteroatom selected from N, O, P, Si and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), the term "$C_6$-$C_{60}$ arylthio group" as used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{104}$ is the $C_6$-$C_{59}$ aryl group and $A_{105}$ is the $C_1$-$C_{53}$ alkylene group).

The term "$C_1$-$C_{60}$ heteroaryloxy group" as used herein refers to —$OA_{106}$ (wherein $A_{106}$ is the $C_1$-$C_{60}$ heteroaryl group), and the term "$C_1$-$C_{60}$ heteroarylthio group" as used herein indicates —$SA_{107}$ (wherein $A_{107}$ is the $C_1$-$C_{60}$ heteroaryl group).

The term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{58}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, Si and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), and —P(=O)(Q$_{18}$)(Q$_{19}$);

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a monovalent non-aromatic condensed polycyclic group, and a monovalent non-aromatic condensed heteropolycyclic group;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), and —P(=O)(Q$_{28}$)(Q$_{29}$); and —N(Q$_{31}$)(Q$_{32}$), —Si(Q$_{33}$)(Q$_{34}$)(Q$_{35}$), —B(Q$_{36}$)(Q$_{37}$), and —P(=O)(Q$_{38}$)(Q$_{39}$), and Q$_{11}$ to Q$_{19}$, Q$_{21}$ to Q$_{29}$, and Q$_{31}$ to Q$_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_1$-C$_{60}$ alkyl group substituted with at least one selected from deuterium, a C$_1$-C$_{60}$ alkyl group, and a C$_6$-C$_{60}$ aryl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryl group substituted with at least one selected from deuterium, a C$_1$-C$_{60}$ alkyl group, and a C$_6$-C$_{60}$ aryl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 1

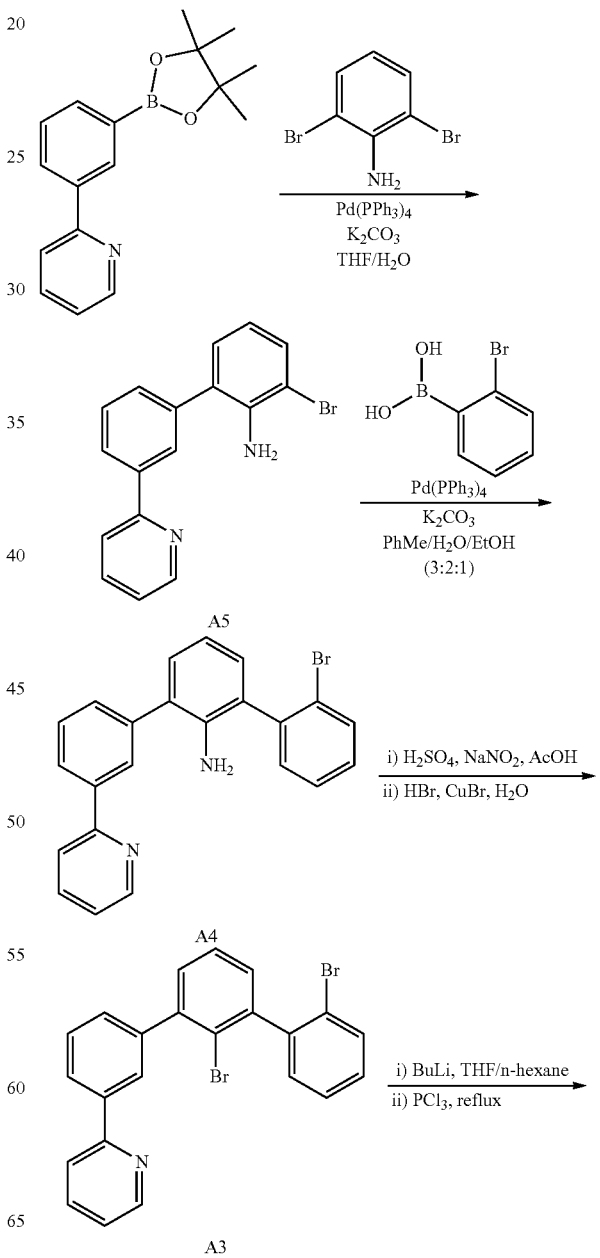

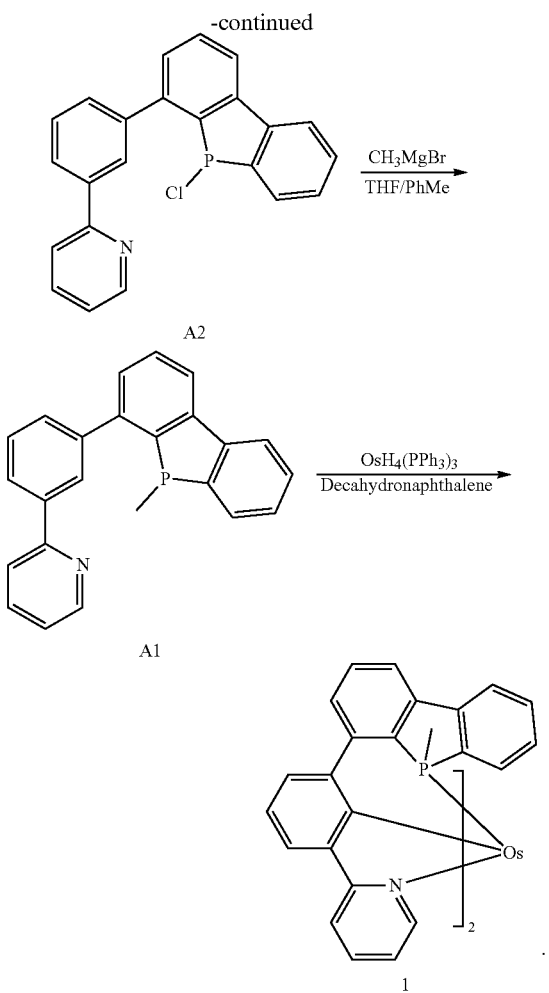

Synthesis of Intermediate A5

2-(Pinacolboronate phenyl)pyridine (2.59 grams (g), 9.23 millimoles (mmol)), 2,6-dibromoaniline (2.32 g, 9.23 mmol), Pd(PPh$_3$)$_4$ (0.75 g, 0.65 mmol), K$_2$CO$_3$ (1.91 g, 13.8 mmol) were mixed with 30 milliliters (mL) of tetrahydrofuran and 15 mL of distilled water. The mixed solution was stirred at a temperature of 75° C. for 5 hours, and then, cooled to room temperature. The reaction mixture was extracted by using ethyl acetate. The organic layer was dried over anhydrous magnesium sulfate (MgSO$_4$) to remove water and subsequently filtered under reduced pressure, and then evaporated under reduced pressed to remove the ethyl acetate. The residue obtained therefrom was then separated and purified by column chromatography with ethyl acetate:hexane=1:15 as an eluent, thereby obtaining 2.30 g (77%) of Intermediate A5. The obtained compound was confirmed by LCMS and 1H NMR.

$^1$H-NMR (CDCl$_3$) δ 8.61 (d, 1H), 8.30 (d, 1H), 8.22 (s, 1H), 7.53 (m, 5H), 7.20 (d, 1H), 7.05 (m, 1H), 6.81 (m, 1H), 5.70 (br. s, 2H)

MS: m/z 325.04 [(M+1)$^+$]

Synthesis of Intermediate A4

Intermediate A5 (2.30 g, 7.08 mmol), 2-bromophenylboronic acid (1.42 g, 7.08 mmol), Pd(PPh$_3$)$_4$ (0.57 g, 0.50 mmol), and K$_2$CO$_3$ (1.47 g, 10.6 mmol) were mixed with 15 mL of toluene (PhMe), 10 mL of distilled water, and 5 mL of ethanol. The mixed solution was stirred at a temperature of 95° C. for 6 hours, and then, cooled to room temperature.

The reaction mixture was extracted by using ethyl acetate. The organic layer was dried over MgSO$_4$ to remove water and subsequently filtered under reduced pressure, and then evaporated under reduced pressed to remove the ethyl acetate. The residue obtained therefrom was then separated and purified by column chromatography with ethyl acetate:hexane=1:15 as an eluent, thereby obtaining 2.21 g (78%) of Intermediate A4. The obtained compound was confirmed by LCMS and 1H NMR.

$^1$H-NMR (CDCl$_3$) δ 8.56 (d, 1H), 8.31 (d, 1H), 8.23 (s, 1H), 7.54 (m, 8H), 7.30 (m, 2H), 6.99 (m, 2H), 5.71 (br. s, 2H)

MS: m/z 401.05 [(M+1)$^+$]

Synthesis of Intermediate A3

Intermediate A4 (2.21 g, 5.51 mmol) was dissolved in 60 mL of acetic acid at a temperature of 0° C., and NaNO$_2$ (1.14 g, 16.5 mmol) dissolved in 1.1 mL of sulfuric acid was added thereto. The mixed solution was stirred at room temperature for 1 hour. CuBr (2.37 g, 16.5 mmol) dissolved in 47% HBr aqueous solution (45 mL) was then slowly added to the resulting mixed solution, and the reaction mixture was stirred at a temperature of 80° C. for 1 and half hours. The resultant obtained therefrom was cooled to room temperature. The reaction mixture was extracted by using ethyl acetate. The organic layer was neutralized with 1 M NaOH aqueous solution, dried by using MgSO$_4$ to remove water, and filtered under reduced pressure, and then evaporated under reduced pressed to remove the ethyl acetate. The residue obtained therefrom was then separated and purified by column chromatography with ethyl acetate:hexane=1:25 as an eluent, thereby obtaining 1.77 g (69%) of Intermediate A3. The obtained compound was confirmed by LCMS and 1H NMR.

$^1$H-NMR (CDCl$_3$) δ 8.56 (d, 1H), 8.32 (d, 1H), 8.22 (s, 1H), 7.55 (m, 9H), 7.28 (m, 2H), 7.01 (m, 1H)

MS: m/z 463.98 [(M+1)$^+$]

Synthesis of Intermediate A2

Intermediate A3 (1.77 g, 3.81 mmol) was dissolved in 60 mL of tetrahydrofuran at a temperature of −78° C., and then, n-BuLi (7.62 mmol) dissolved in n-hexane was added thereto. The mixed solution was stirred at a temperature of −78° C. for 1 hour. PCl$_3$ (2.37 g, 3.81 mmol) was slowly added thereto, and the reaction mixture was stirred at room temperature for 1 hour. After the completion of the reaction was confirmed, the reaction mixture was heated for 1 hour, and the resulting solution was cooled to room temperature, thereby obtaining a 0.65 g (46%) of a solid product, Intermediate A2. The obtained compound was used for the next reaction without being subjected to additional purification.

Synthesis of Intermediate A1

Intermediate A2 (0.65 g, 1.75 mmol) was dissolved in 20 mL of tetrahydrofuran at a temperature of 0° C., and CH$_3$MgBr (1.75 mmol) was slowly added thereto at room temperature, followed by being stirred for 3 hours at room temperature. The reaction mixture was extracted by using ethyl acetate. The organic layer was dried over MgSO$_4$ to remove water and subsequently filtered under reduced pressure, and then evaporated under reduced pressed to remove the ethyl acetate. The residue obtained therefrom was then separated and purified by column chromatography with ethyl acetate:hexane 1:25 as an eluent, thereby obtaining 0.50 g (82%) of Intermediate A1. The obtained compound was confirmed by LCMS and 1H NMR.

¹H-NMR (CDCl₃) δ 8.57 (d, 1H), 8.05 (s, 1H), 7.98 (d, 1H), 7.70 (m, 2H), 7.66 (d, 1H), 7.51 (t, 1H), 7.42 (m, 1H), 7.31 (m, 4H), 7.20 (m, 2H), 7.09 (d, 1H), 2.01 (s, 3H)

MS: m/z 352.11 [(M+1)⁺]

Synthesis of Compound 1

Intermediate A1 (0.50 g, 1.42 mmol) and OsH₄(PPh₃)₃ (0.61 g, 0.62 mmol) were added to 5 mL of decahydronaphthalene, and the mixed solution was allowed to react at a temperature of 200° C. for 2 hours. The resulting solution was cooled to room temperature and filtered under reduced pressure. The filtered residue was separated and purified by column chromatography with ethyl acetate:hexane=1:10 as an eluent, thereby obtaining 0.45 g (82%) of Compound 1. The obtained compound was confirmed by LCMS and 1H NMR.

¹H-NMR (CDCl₃) δ 8.60 (d, 2H), 8.31 (d, 2H), 7.99 (d, 2H), 7.75 (m, 8H), 7.56 (m, 12H), 7.02 (m, 2H), 1.99 (s, 6H)

MS: m/z 893.16 [(M+1)⁺]

Synthesis Example 2: Synthesis of Compound 7

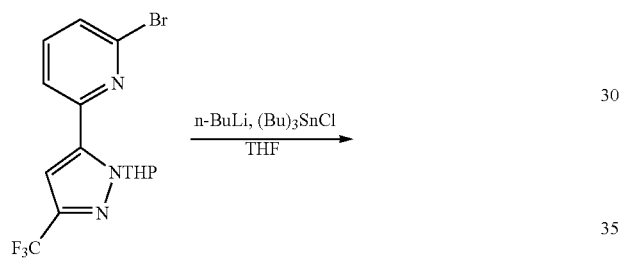

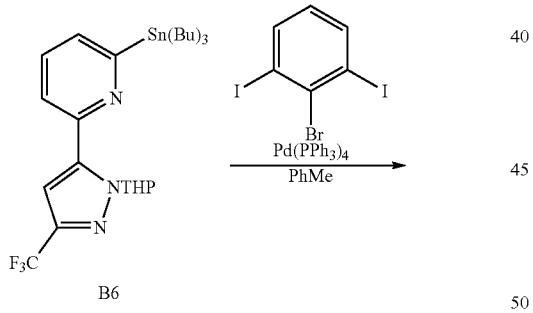

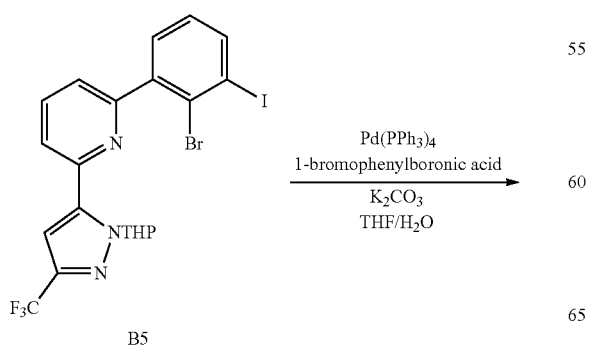
B5

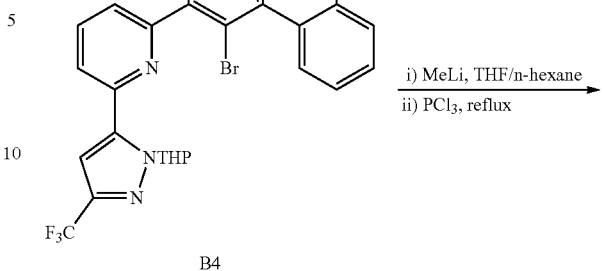
B4

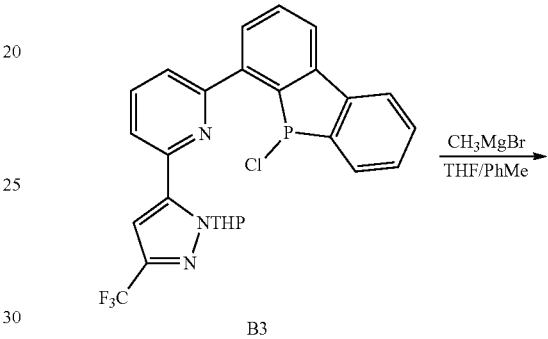
B3

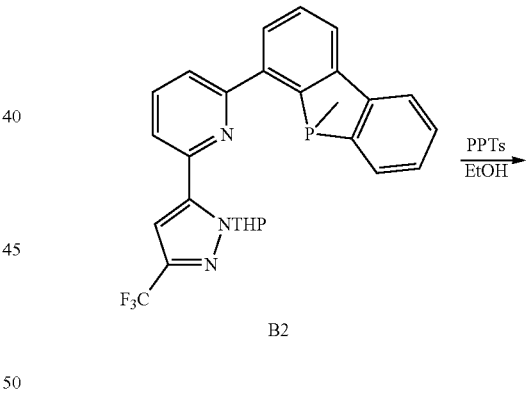
B2

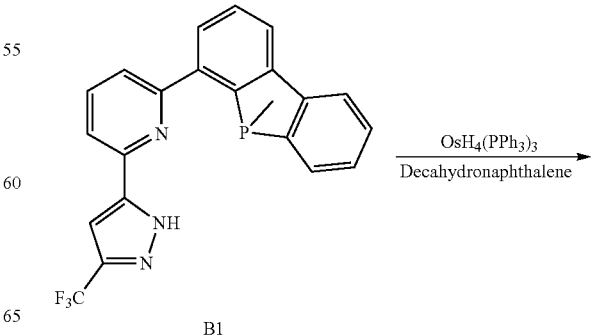
B1

-continued

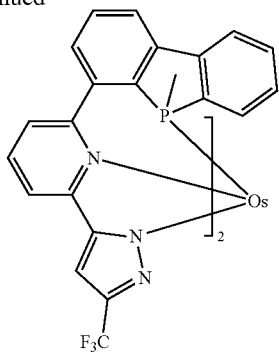

7

Synthesis of Intermediate B6

2-bromo-6-(1-(tetrahydro-2H-pyran-2-yl)-3-(trifluoromethyl)-1H-pyrazol-5-yl)pyridine (2.60 g, 6.91 mmol) was mixed with 30 mL of tetrahydrofuran, followed by addition of 7.25 mmol of n-butyllithium at a temperature of −78° C. and stirring for 1 hour. Subsequently, tributyltin chloride (2.36 g, 7.25 mmol) was added thereto, followed by stirring at room temperature for 3 hours. After the completion of the reaction was confirmed, distilled water was added thereto, and an organic layer was extracted therefrom using ethyl acetate. Next, anhydrous magnesium sulfate (MgSO$_4$) was added thereto to remove water therefrom. Then, a filtration process was performed thereon to obtain a filtrate. From the filtrate, ethyl acetate was removed under reduced pressure. As a result, Intermediate B6 was obtained, which was used for the next reaction without being subjected to additional purification.

Synthesis of Intermediate B5

Intermediate B6 (3.44 g, 5.87 mmol), 2-bromo-1,3-diiodobenzene (1.44 g, 3.52 mmol), and Pd(PPh$_3$)$_4$ (0.34 g, 0.29 mmol) were added to 30 mL of toluene (PhMe). The mixed solution was stirred at a temperature of 110° C. for 5 hours, and then, cooled to room temperature. Distilled water was added to the resulting mixture, and an organic layer was extracted therefrom by using ethyl acetate, followed by addition of anhydrous MgSO$_4$ to dry the organic layer. Next, a filtration process was performed thereon to obtain a filtrate. Then, ethyl acetate in the obtained filtrate was removed under reduced pressure. The residue obtained therefrom was purified by column chromatography with ethyl acetate:hexane=1:15 as an eluent to obtain 1.22 g (36%) of Intermediate B5. The obtained compound was confirmed by LCMS and $^1$H NMR.

$^1$H-NMR (CDCl$_3$) δ 8.20 (d, 1H), 8.05 (d, 1H), 7.75 (m, 2H), 7.31 (m, 2H), 6.88 (s, 1H), 5.89 (d, 1H), 4.01 (d, 1H), 3.52 (t, 1H), 2.53 (m, 1H), 2.14 (m, 3H), 1.72 (m, 2H)

MS: m/z 577.97 [(M+1)$^+$]

Synthesis of Intermediate B4

Intermediate B5 (1.22 g, 2.11 mmol), 2-bromophenylboronic acid (0.42 g, 2.11 mmol), Pd(PPh$_3$)$_4$ ((0.17 g, 0.15 mmol), and K$_2$CO$_3$ (0.73 g, 5.28 mmol) were mixed with 15 mL of THF and 5 mL of distilled water. Then, the mixture was stirred at a temperature of 75° C. for 4 hours, and then, cooled to room temperature. An organic layer was extracted therefrom by using ethyl acetate, followed by addition of anhydrous MgSO$_4$ to dry the organic layer. Next, a filtration process was performed thereon to obtain a filtrate. Then, ethyl acetate in the obtained filtrate was removed under reduced pressure. The residual was purified by column chromatography with ethyl acetate:hexane=1:15 as an eluent to obtain 1.06 g (83%) of Intermediate B4. The obtained compound was confirmed by LCMS and $^1$H NMR.

$^1$H-NMR (CDCl$_3$) δ 8.16 (d, 1H), 8.05 (d, 1H), 7.68 (m, 4H), 7.55 (m, 2H), 7.25 (m, 2H), 6.88 (s, 1H), 5.88 (d, 1H), 4.00 (d, 1H), 3.53 (t, 1H), 2.52 (m, 1H), 2.11 (m, 3H), 1.69 (m, 2H)

MS: m/z 606.00 [(M+1)$^+$]

Synthesis of Intermediate B3

At a temperature of −78° C., Intermediate B4 (1.06 g, 1.75 mmol) was mixed with 18 mL of tetrahydrofuran. n-MeLi (3.50 mmol) in n-hexane was slowly added dropwise thereto, and the reaction mixture was stirred at a temperature of −78° C. for 1 hour. Subsequently, PCl$_3$ (0.48 g, 1.75 mmol) was added thereto, followed by stirring at room temperature for 1 hour. After the completion of the reaction was confirmed, the reaction mixture was heated for 1 hour, and the resulting solution was cooled to room temperature, thereby obtaining a 0.44 g (49%) of a solid product, Intermediate B3. The obtained compound was used for the next reaction without being subjected to additional purification.

MS: m/z 463.98 [(M+1)$^+$]

Synthesis of Intermediate B2

At a temperature of 0° C., Intermediate B3 (0.44 g, 0.86 mmol) was mixed with 10 mL of tetrahydrofuran. CH$_3$MgBr (0.86 mmol) was slowly added dropwise thereto, and the reaction mixture was stirred at room temperature for 3 hours. After the completion of the reaction was confirmed, distilled water was added thereto, and an organic layer was extracted therefrom by using ethyl acetate, followed by addition of MgSO$_4$ to dry the organic layer. Next, a filtration process was performed thereon to obtain a filtrate. Then, ethyl acetate in the obtained filtrate was removed under reduced pressure. The residue obtained therefrom was purified by column chromatography with ethyl acetate:hexane=1:25 as an eluent to obtain 0.42 g (85%) of Intermediate B2. The obtained compound was confirmed by LCMS and $^1$H NMR.

$^1$H-NMR (CDCl$_3$) δ 8.26 (d, 1H), 8.03 (d, 1H), 7.80 (m, 3H), 7.55 (m, 4H), 7.23 (d, 1H), 6.90 (s, 1H), 5.89 (d, 1H), 4.01 (d, 1H), 3.52 (t, 1H), 2.51 (m, 1H), 2.13 (m, 3H), 2.01 (s, 3H), 1.70 (m, 2H)

MS: m/z 494.15 [(M+1)$^+$]

Synthesis of Intermediate B1

Intermediate B2 (0.42 g, 0.73 mmol) was mixed with 10 mL of ethanol, followed by slow addition of PPTS (1.84 g, 7.30 mmol). The reaction mixture was then stirred at a temperature of 70° C. for 8 hours. After the completion of the reaction was confirmed, distilled water was added thereto, and an organic layer was extracted therefrom by using ethyl acetate, followed by addition of MgSO$_4$ to dry the organic layer. Next, a filtration process was performed thereon to obtain a filtrate. Then, ethyl acetate in the obtained filtrate was removed under reduced pressure. The residue obtained therefrom was purified by column chromatography with ethyl acetate:hexane=1:25 as an eluent to obtain 0.27 g (91%) of Intermediate B1. The obtained compound was confirmed by LCMS and $^1$H NMR.

$^1$H-NMR (CDCl$_3$) δ 11.9 (br. s, 1H), 8.25 (d, 1H), 8.02 (d, 1H), 7.81 (m, 3H), 7.54 (m, 4H), 7.22 (d, 1H), 6.95 (s, 1H), 2.01 (s, 3H)

MS: m/z 410.09 [(M+1)$^+$]

Synthesis of Compound 7

Intermediate B1 (0.27 g, 0.66 mmol) and OsH$_4$(PPh$_3$)$_3$ (0.28 g, 0.29 mmol) were mixed with 5 mL of decahydronaphthalene, and then the reaction mixture was reacted at a temperature of 200° C. for 2 hours. Subsequently, the mixture was cooled to room temperature. The residual obtained under reduced pressure was purified by column chromatography with ethylacetate:hexane=1:10 as an eluent, thereby obtaining 64 mg (22%) of Compound 7. The obtained compound was confirmed by LCMS and $^1$H NMR.

$^1$H-NMR (CDCl$_3$) δ 8.25 (d, 2H), 7.99 (d, 2H), 7.81 (m, 6H), 7.62 (m, 4H), 7.50 (m, 2H), 7.38 (m, 4H), 6.97 (s, 2H), 2.00 (s, 6H)

MS: m/z 1009.12 [(M+1)$^+$]

Example 1

A glass substrate, on which an anode having a structure of ITO/Ag/ITO (70 Å/1000 Å/70 Å) was deposited, was cut to a size of 50 millimeters (mm)×50 mm×0.5 mm, sonicated in isopropyl alcohol and water for 5 minutes, respectively, and cleaned by exposure to ultraviolet rays for 30 minutes, and then ozone. The glass substrate was mounted on a vacuum-deposition device.

2-TNATA was deposited on the anode to form a hole injection layer having a thickness of 600 Å. 4,4'-bis[N-(1-naphthyl)-N-phenylamino]biphenyl (hereinafter, referred as "NPB") was deposited on the hole injection layer to form a hole transport layer having a thickness of 1,350 Å.

CBP (as a host) and Compound 1 (as a dopant) were co-deposited on the hole transport layer at a weight ratio of 94:6 to form an emission layer having a thickness of 400 Å. BCP was deposited on the emission layer to form a hole blocking layer having a thickness of 50 Å. Subsequently, Alq$_3$ was deposited on the hole blocking layer to form an electron transport layer having a thickness of 350 Å. LiF was deposited on the electron transport layer to form an electron injection layer having a thickness of 10 Å. MgAg was deposited on the electron injection layer at a weight ratio of 90:10 to form a cathode having a thickness of 120 Å, thereby completing the manufacture of an organic light-emitting device (which emits red light).

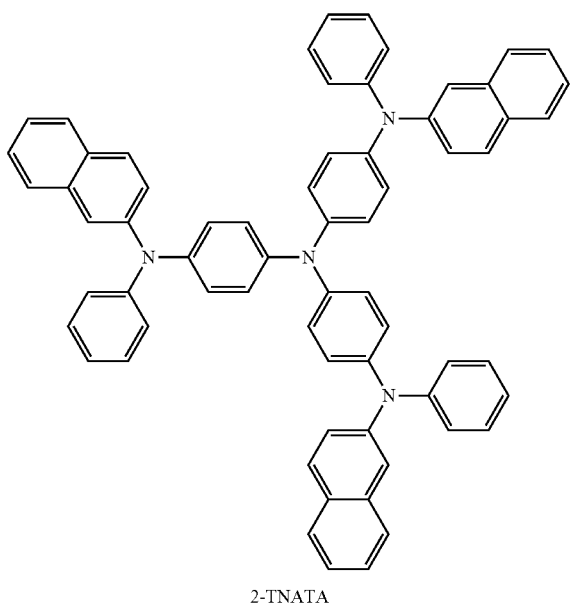

2-TNATA

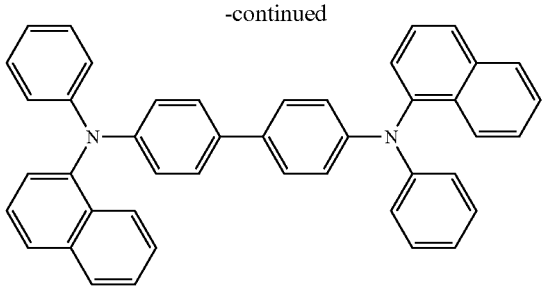

NPB

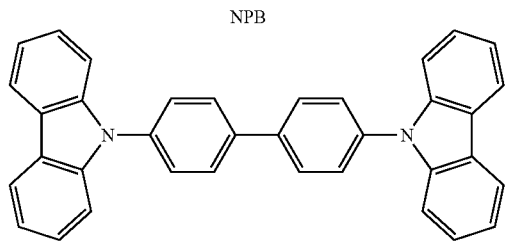

CBP

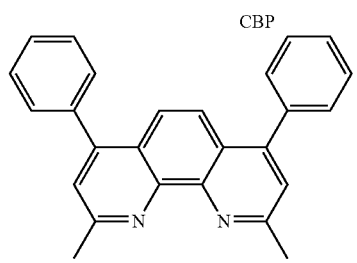

BCP

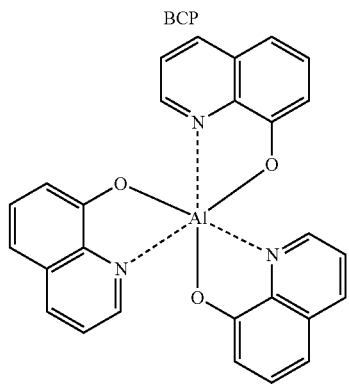

Alq3

Example 2 and Comparative Examples A and B

An organic light-emitting device (which emits red light) was manufactured in the same manner as in Example 1, except that in the formation of the emission layer, Compounds listed in Table 2 (wherein, in Compound B, "Ph" represents a phenyl group, and "Me" represents a methyl group) were used instead of Compound 1 as a dopant.

Evaluation Example 1: Evaluation of Characteristics of Organic Light-Emitting Device The driving voltage, luminescence efficiency, maximum emission wavelength ($\lambda_{max}$), external quantum efficiency (EQE), full width at half maximum (FWHM), and lifespan (LT$_{97}$) of the organic light-emitting devices of Examples 1 and 2 and Comparative Examples A and B were evaluated. The results thereof are shown in Table 2. A Keithley 2400 current voltmeter and a luminance meter (Minolta Cs-1000A) were used in the evaluation. The lifespan ($T_{97}$) (at 3,500 nit) refers to time required for the initial luminance of the organic light-emitting device to reduce by 97%.

TABLE 2

| | Dopant | Driving voltage (V) | Luminescence efficiency (cd/A) | $\lambda_{max}$ (nm) | EQE (%) | FWHM (nm) | $LT_{97}$ (hr) |
|---|---|---|---|---|---|---|---|
| Example 1 | Compound 1 | 5.5 | 14.1 | 643 | 21.3 | 55 | 230 |
| Example 2 | Compound 7 | 4.4 | 27.5 | 609 | 23.0 | 59 | 350 |
| Comparative Example A | Compound A | 6.4 | 18.3 | 550 | 5.2 | 93 | 45 |
| Comparative Example B | Compound B | 4.9 | 18.5 | 620 | 17.1 | 98 | 35 |

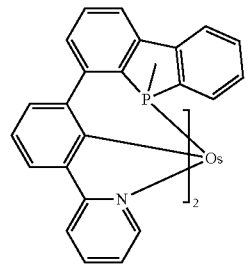

1

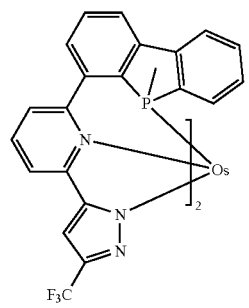

7

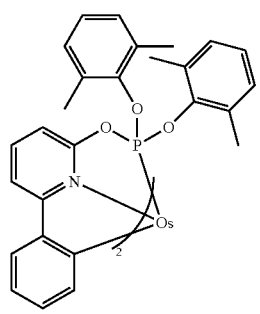

A

TABLE 2-continued

| | Dopant | Driving voltage (V) | Luminescence efficiency (cd/A) | $\lambda_{max}$ (nm) | EQE (%) | FWHM (nm) | $LT_{97}$ (hr) |
|---|---|---|---|---|---|---|---|

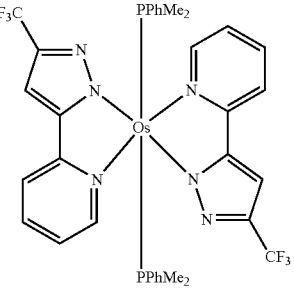

B

According to Table 2, it was found that the organic light-emitting devices of Examples 1 and 2 employing Compounds 1 and 7 having a robust tridentate ligand, in which a chromophore moiety is linked to a phosphine-containing moiety via $sp^2$ type with a less vibrational mode, have the same or improved luminescence efficiency, excellent EQE, excellent lifespan, and smaller FWHM, as compared with the organic light-emitting device of Comparative Example A having a tridentate ligand, in which a chromophore moiety is linked to the phosphine-containing moiety via O in $sp^3$ type.

In addition, according to Table 2, it was found that the organic light-emitting devices of Examples 1 and 2 employing Compounds 1 and 7 having a robust tridentate ligand have the same or improved luminescence efficiency, excellent EQE, excellent lifespan, and smaller FWHM, as compared with the organic light-emitting device of Comparative Example B employing Compound B having a monodentate phosphine-containing moiety and a bidentate chromophore moiety.

Without wishing to be bound by any particular theory, the improvement of EQE and lifespan characteristics of the organic light-emitting devices of Examples 1 and 2 may be resulted from the reduced non-emitting transition caused by the reduced vibrational mode of Compounds 1 and 7 due to the robust tridentate ligands of Compounds 1 and 7.

According to one or more embodiments, the organometallic compound has excellent electric characteristics and thermal stability, and thus, the organic light-emitting device including the organometallic compound may have excellent driving voltage, efficiency, electric power, color purity, and lifespan characteristics. In addition, the organometallic compound has excellent phosphorescent emission characteristics. In this regard, when the organometallic compound used for a diagnostic composition, the diagnostic composition may have a high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:
1. An organometallic compound represented by Formula 1:

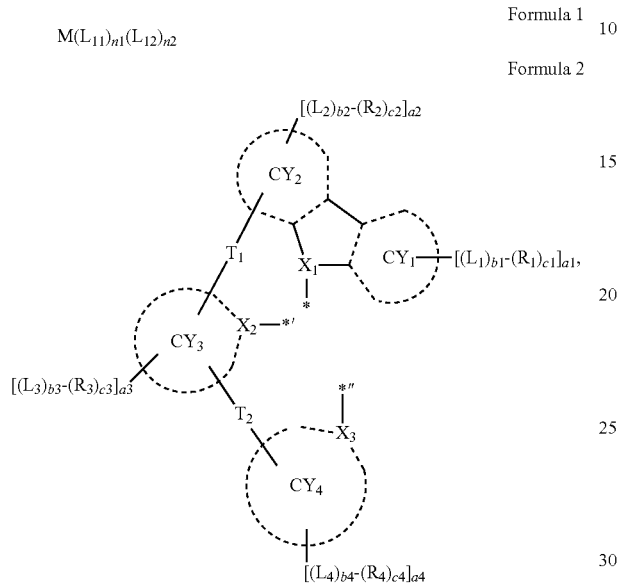

Formula 1
$$M(L_{11})_{n1}(L_{12})_{n2}$$

Formula 2 wherein, in Formulae 1 and 2,
M is a third row transition metal,
$L_{11}$ is a ligand represented by Formula 2,
n1 is 1 or 2, and when n1 is two, two groups $L_{11}$ are identical to or different from each other,
$L_{12}$ is an organic ligand,
n2 is 0, 1, 2, or 3, and when n2 is two or more, two or more of groups $L_{12}$ are identical to or different from each other,
$X_1$ is $B(R_7)$, $N(R_7)$, $P(R_7)$, or $As(R_7)$,
$X_2$ and $X_3$ are each N or C,
$CY_1$ to $CY_4$ are each independently selected from a $C_5$-$C_{30}$ carbocyclic group and a $C_1$-$C_{30}$ heterocyclic group,
provided that when $X_1$ is $N(R_7)$, $X_2$ is N, and $X_3$ is N, then $CY_4$ is not pyridine,
$T_1$ and $T_2$ are each independently selected from a single bond, a double bond, *—N[(L)$_{b5}$-(R$_5$)$_{c5}$]—*', *—B(R$_5$)—*', *—P(R$_5$)—*', *—C(R$_5$)(R$_6$)—*', *—Si(R$_5$)(R$_6$)—*', *—Ge(R$_5$)(R$_6$)—*', *—S—*', *—Se—*', *—O—*', *—C(=O)—*', *—S(=O)—*', *—S(=O)$_2$—*', *—C(R$_5$)=*', *=C(R$_5$)—*', *—C(R$_5$)=C(R$_6$)—*', *—C(=S)—*', and *—C≡C—*',
$L_1$ to $L_5$ are each independently selected from a single bond, a substituted or unsubstituted $C_5$-$C_{30}$ carbocyclic group, and a substituted or unsubstituted $C_1$-$C_{30}$ heterocyclic group,
b1 to b5 are each independently an integer of 1 to 5,
$R_5$ and $R_6$ are optionally linked via a single bond or a first linking group to form a substituted or unsubstituted $C_5$-$C_{30}$ carbocyclic group or a substituted or unsubstituted $C_1$-$C_{30}$ heterocyclic group,
$R_1$ to $R_7$ are each independently selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q)(Q$_9$),
c1 to c5 are each independently an integer of 1 to 5,
a1 to a4 are each independently an integer of 0 to 20,
two of a plurality of neighboring groups $R_1$ are optionally linked to form a substituted or unsubstituted $C_5$-$C_{30}$ carbocyclic group or a substituted or unsubstituted $C_1$-$C_{30}$ heterocyclic group,
two of a plurality of neighboring groups $R_2$ are optionally linked to form a substituted or unsubstituted $C_5$-$C_{30}$ carbocyclic group or a substituted or unsubstituted $C_1$-$C_3$ heterocyclic group,
two of a plurality of neighboring groups $R_3$ are optionally linked to form a substituted or unsubstituted $C_5$-$C_{30}$ carbocyclic group or a substituted or unsubstituted $C_1$-$C_3$ heterocyclic group,
two of a plurality of neighboring groups $R_4$ are optionally linked to form a substituted or unsubstituted $C_5$-$C_{30}$ carbocyclic group or a substituted or unsubstituted $C_1$-$C_{30}$ heterocyclic group,
two or more of neighboring $R_1$ to $R_4$ are optionally linked to form a substituted or unsubstituted $C_5$-$C_{30}$ carbocyclic group or a substituted or unsubstituted $C_1$-$C_{30}$ heterocyclic group,
*, *', and *" in Formula 2 each independently indicate a binding site to M of Formula 1,
at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, and a C$_1$-C$_{60}$ alkoxy group;

a C$_1$-C$_{60}$ alkyl group, a C$_2$-C$_{60}$ alkenyl group, a C$_2$-C$_{60}$ alkynyl group, and a C$_1$-C$_{60}$ alkoxy group, each substitute with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_3$-C$_{10}$ cycloalkyl group, a C$_1$-C$_{10}$ heterocycloalkyl group, a C$_3$—C cycloalkenyl group, a C$_1$-C$_{10}$ heterocycloalkenyl group, a C$_6$-C$_{60}$ aryl group, a C$_1$-C$_{60}$ aryloxy group, a C$_1$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), and —P(=O)(Q$_{18}$)(Q$_{19}$);

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a monovalent non-aromatic condensed polycyclic group, and a monovalent non-aromatic condensed heteropolycyclic group;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$alkenyl group, a C$_2$-C$_{60}$ alkynyl group, a C$_1$-C$_0$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), and —P(=O)(Q$_{28}$)(Q$_{29}$); and —N(Q$_{31}$)(Q$_{32}$), —Si(Q$_{33}$)(Q$_{34}$)(Q$_{35}$), —B(Q$_{36}$)(Q$_{37}$), and —P(=O)(Q$_{38}$)(Q$_{39}$), and Q$_1$ to Q$_9$, Q$_{11}$ to Q$_{19}$, Q$_{21}$ to Q$_{29}$, and Q$_{31}$ to Q$_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_1$-C$_{60}$ alkyl group substituted with at least one selected from deuterium, a C$_1$-C$_{60}$ alkyl group, and a C$_6$-C$_{60}$ aryl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryl group substituted with at least one selected from deuterium, a C$_1$-C$_{60}$ alkyl group, and a C$_1$-C$_{60}$ aryl group, a C$_1$-C$_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a monovalent non-aromatic condensed polycyclic group, and a monovalent non-aromatic condensed heteropolycyclic group.

2. The organometallic compound of claim 1, wherein M is Os and n1 is 1 or 2; or M is Pt, n1 and n2 are each 1, and L$_{12}$ is a monodentate organic ligand.

3. The organometallic compound of claim 1, wherein X$_1$ is P(R$_7$).

4. The organometallic compound of claim 1, wherein X$_2$ is N and X$_3$ is C; X$_2$ is C and X$_3$ is N; or X$_2$ and X$_3$ are each N.

5. The organometallic compound of claim 1, wherein
CY$_1$ to CY$_4$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a pyrrole group, a thiophene group, a furan group, an indole group, an isoindole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group.

6. The organometallic compound of claim 1, wherein $T_1$ and $T_2$ are each a single bond.

7. The organometallic compound of claim 1, wherein $R_1$ to $R_7$ are each independently selected from:
hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N($Q_1$)($Q_2$), —Si($Q_3$)($Q_4$)($Q_5$), —B($Q_6$)($Q_7$), and —P(=O)(Q)($Q_9$);

$Q_1$ to $Q_9$ are each independently be selected from: —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CH$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

8. The organometallic compound of claim 1, wherein $R_1$ to $R_7$ are each independently selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, groups represented by Formulae 9-1 to 9-19, groups represented by Formulae 10-1 to 10-139, —N(Q)(Q₂), —Si(Q₃)(Q₄)(Q₅), —B(Q₆)(Q₇), and —P(=O)(Q₈)(Q₉), wherein $Q_1$ to $Q_9$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_1$-$C_{60}$ aryl group, a $C_1$-$C_{60}$ aryloxy group, a $C_1$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group:

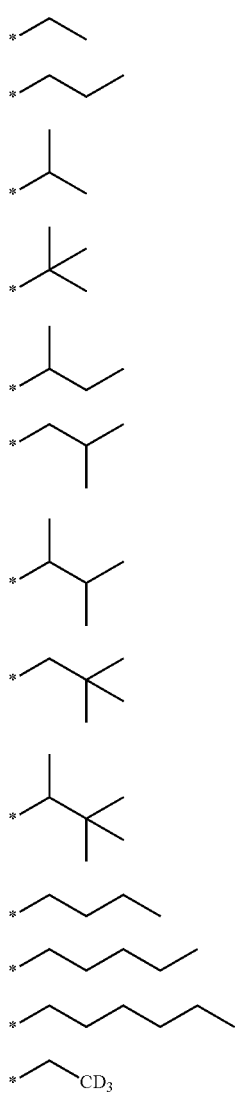
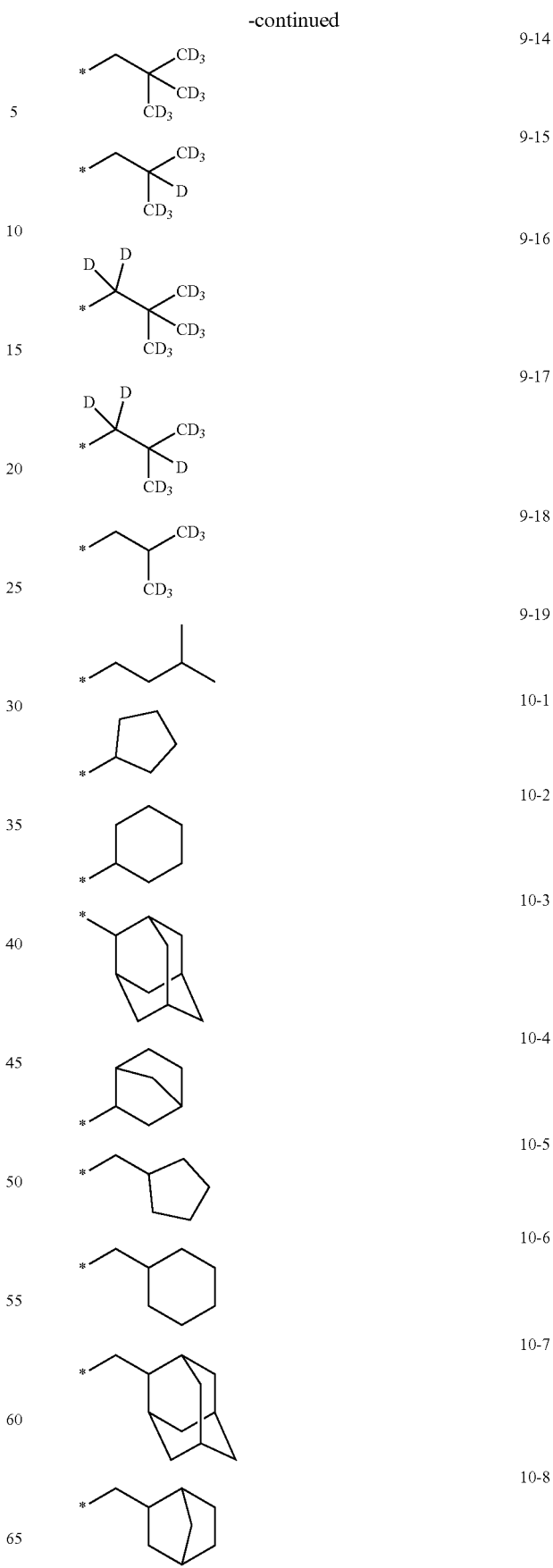

-continued
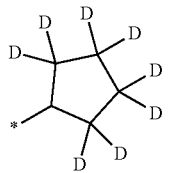 10-9
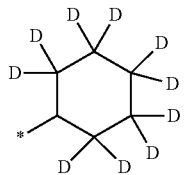 10-10
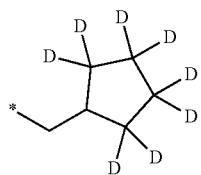 10-11
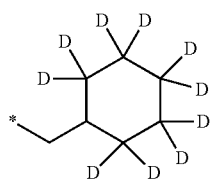 10-12
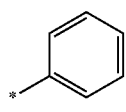 10-13
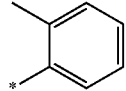 10-14
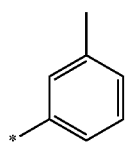 10-15
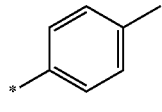 10-16
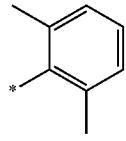 10-17
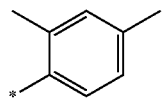 10-18
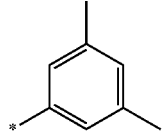 10-19
-continued
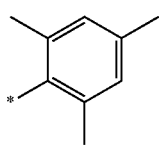 10-20
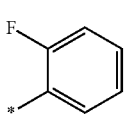 10-21
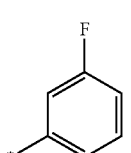 10-22
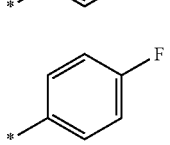 10-23
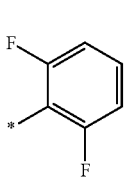 10-24
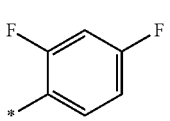 10-25
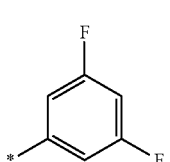 10-26
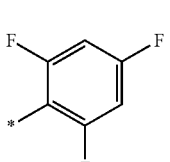 10-27
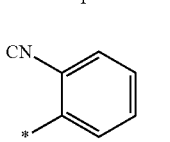 10-28
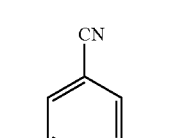 10-29
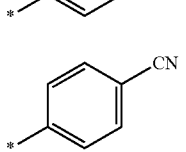 10-30

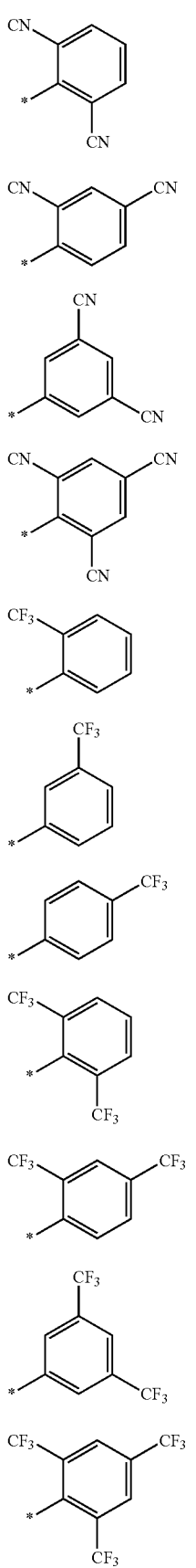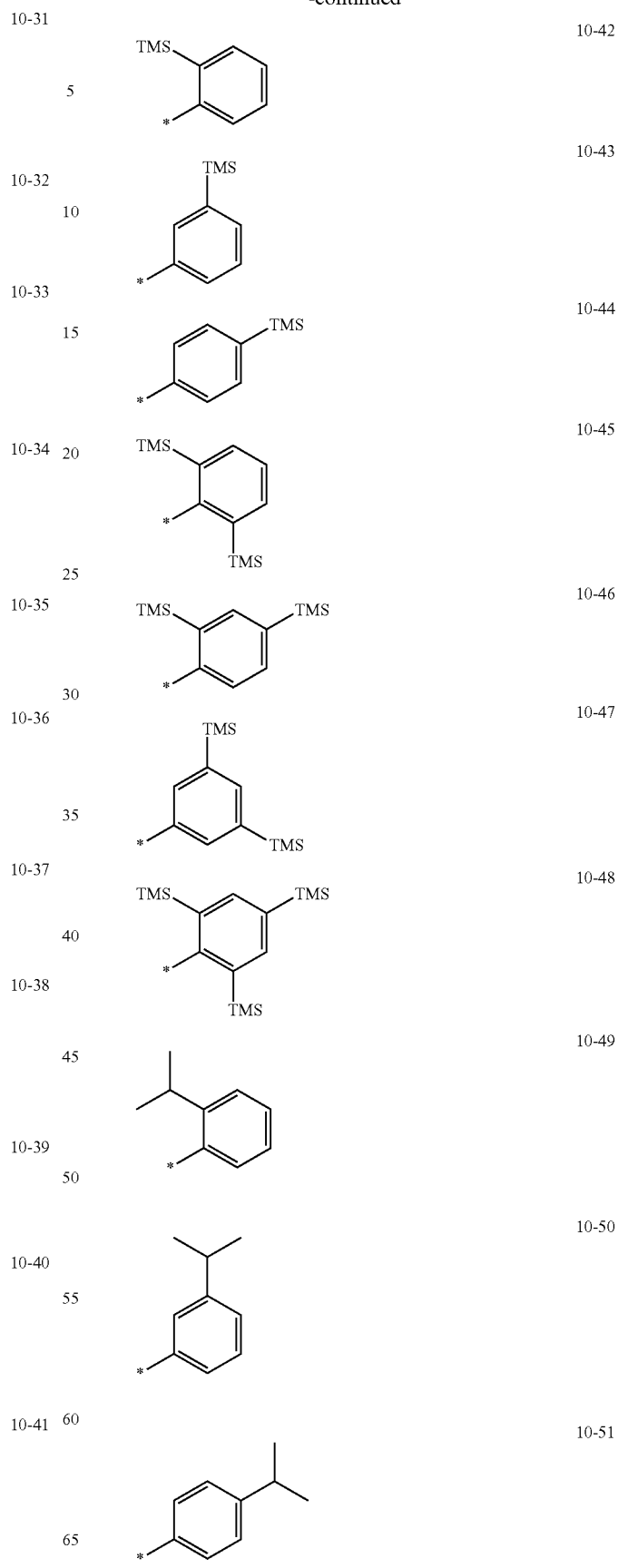

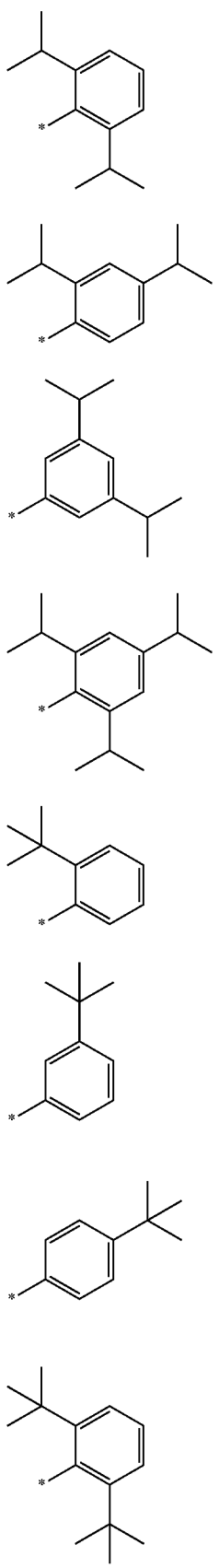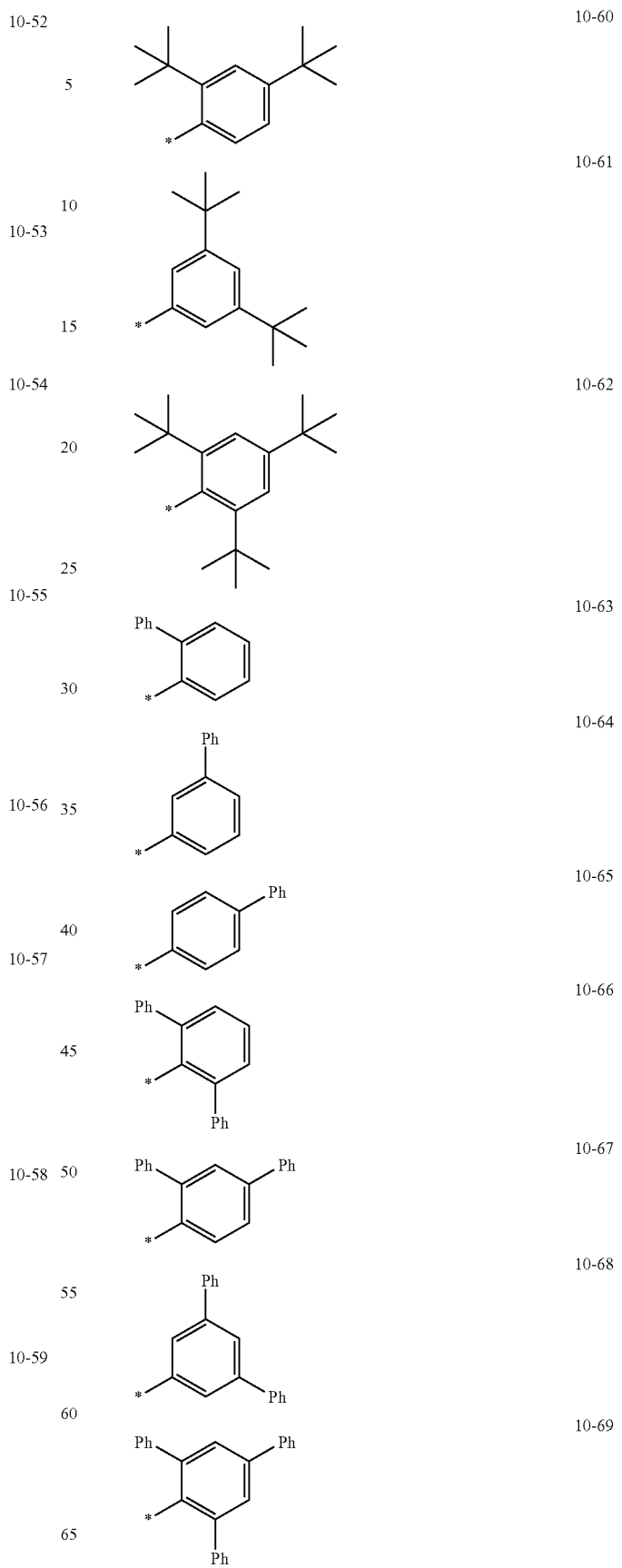

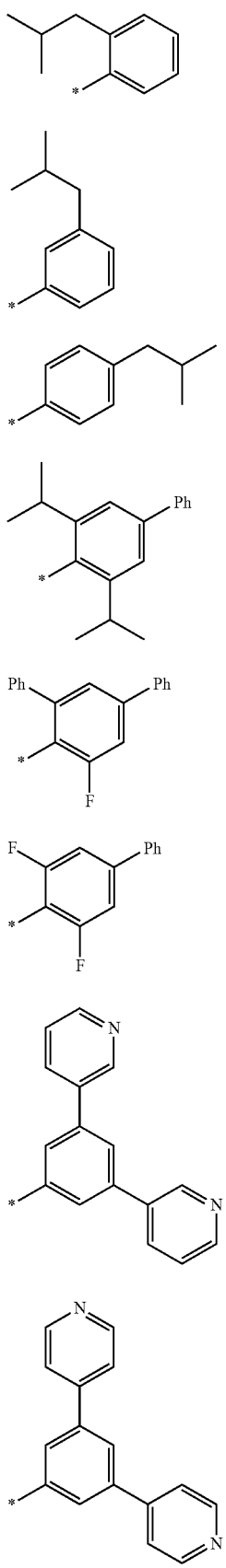
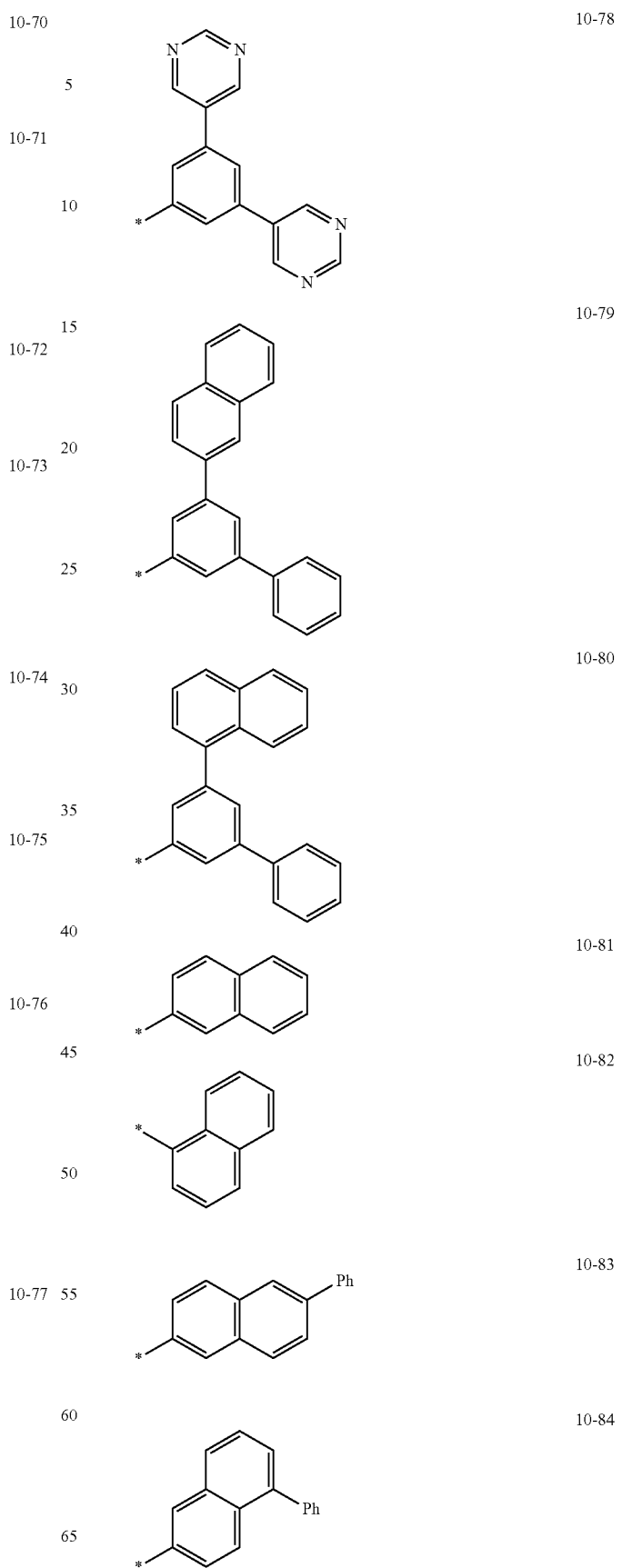

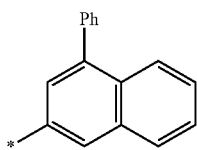
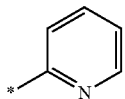
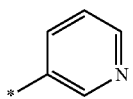
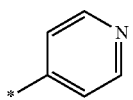
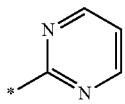
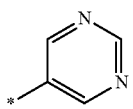
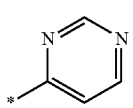
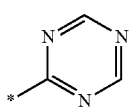
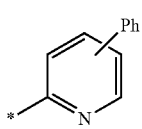
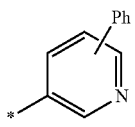
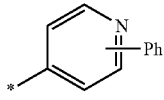
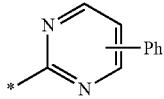
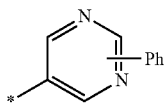
10-85
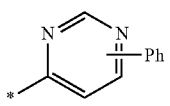
10-86
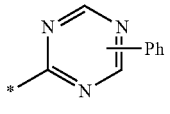
10-87
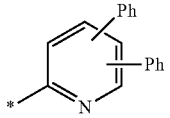
10-88
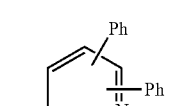
10-89
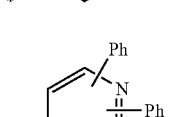
10-90
10-91
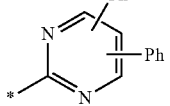
10-92
10-93
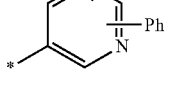
10-94
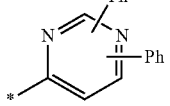
10-95
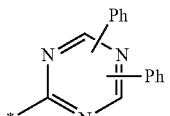
10-96
10-97
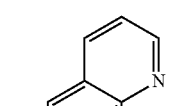
10-98
10-99
10-100
10-101
10-102
10-103
10-104
10-105
10-106
10-107
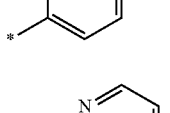
10-108
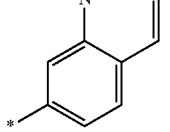

10-109 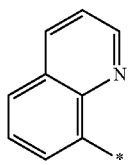
10-110 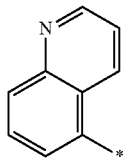
10-111 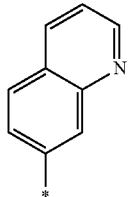
10-112 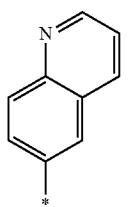
10-113 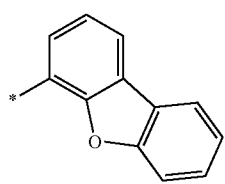
10-114 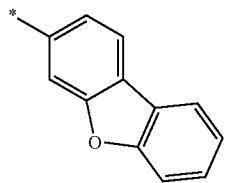
10-115 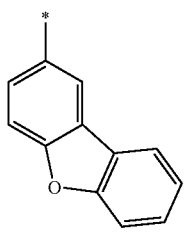
10-116 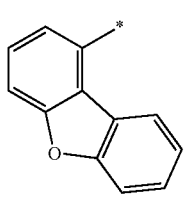
10-117 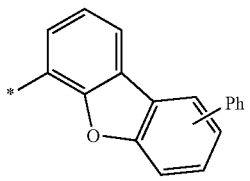
10-118 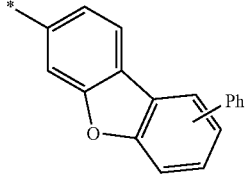
10-119 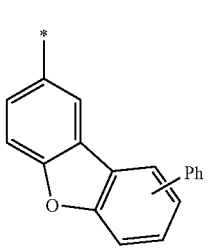
10-120 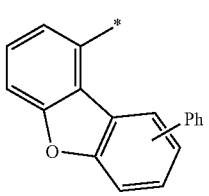
10-121 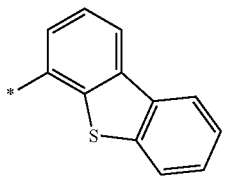
10-122 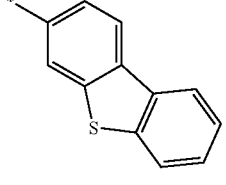
10-123 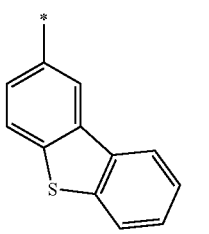
10-124 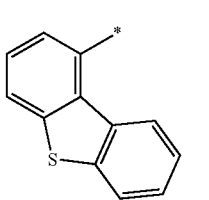

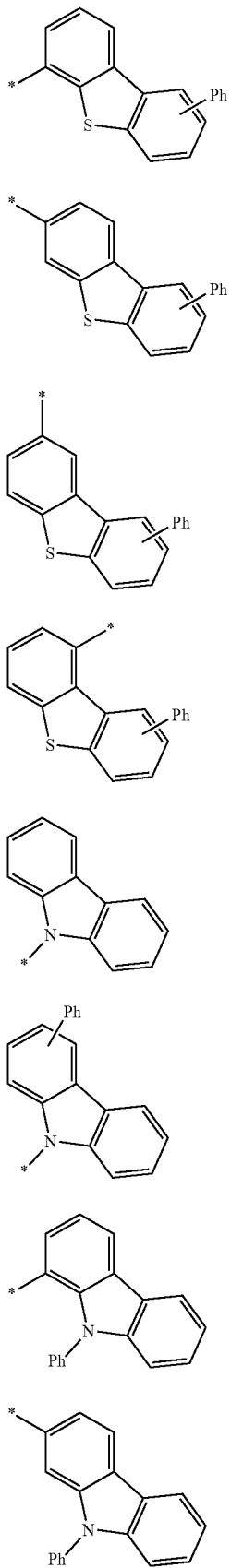
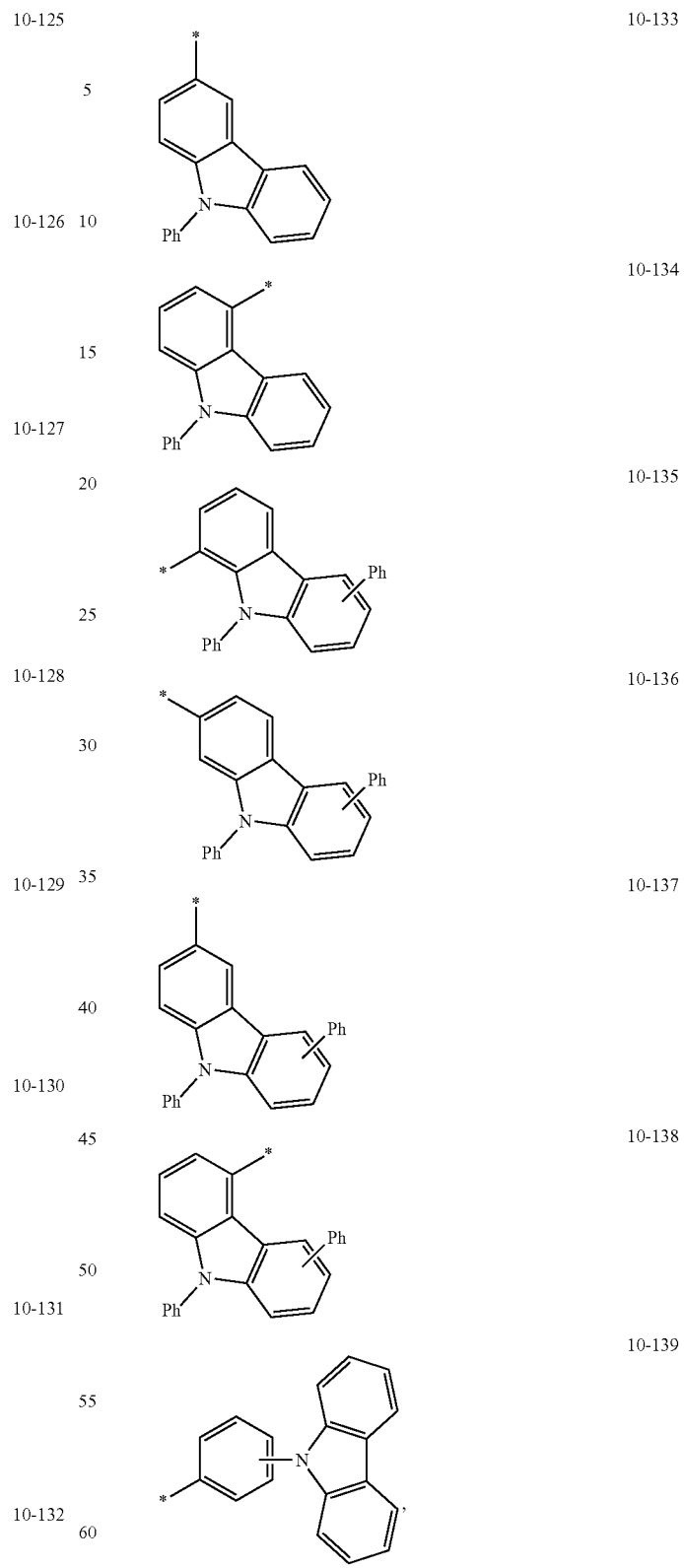
wherein, in Formulae 9-1 to 9-19 and 10-1 to 10-139, "Ph" indicates a phenyl group, "TMS" indicates a trimethylsilyl group, and "*" indicates a binding site to a neighboring atom.

9. The organometallic compound of claim 1, wherein a moiety represented by

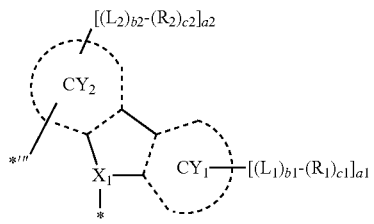

in Formula 2 is represented by one selected from Formulae CY1-1 to CY1-12:

CY1-1
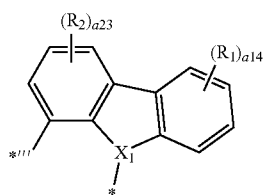

CY1-2
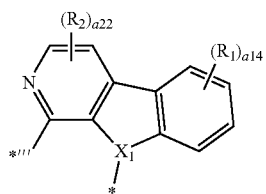

CY1-3
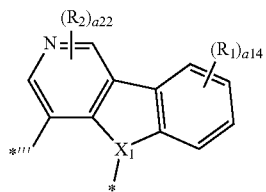

CY1-4
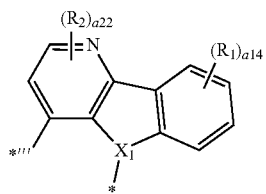

CY1-5
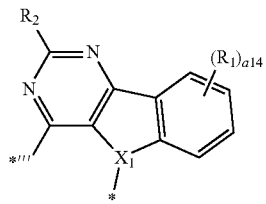

CY1-6
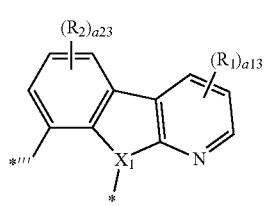

CY1-7
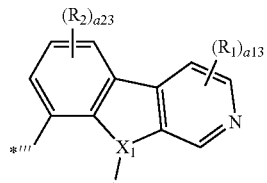

CY1-8
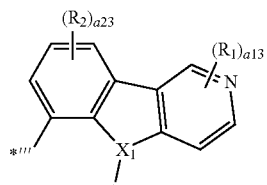

CY1-9
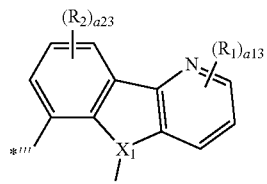

CY1-10
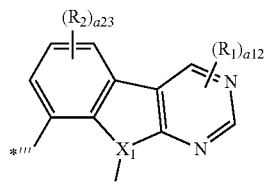

CY1-11
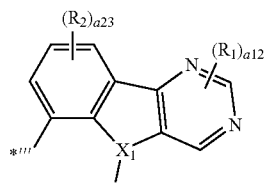

CY1-12
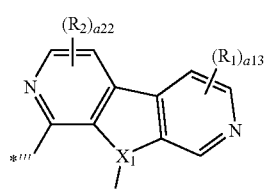

wherein, in Formulae CY1-1 to CY1-12, $X_1$, $R_1$, and $R_2$ are each independently the same as described in claim 1, a14 is an integer of 0 to 4, a13 and a23 are each an integer of 0 to 3, a12 and a22 are each an integer of 0 to 2,

* indicates a binding site to M of Formula 1, and

*''' indicates a binding site to a neighboring atom.

10. The organometallic compound of claim 1, wherein a moiety represented by

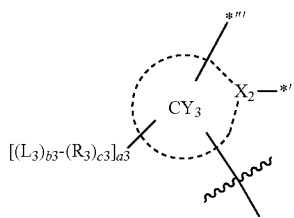

in Formula 2 is represented by one selected from Formulae CY3-1 to CY3-9:

CY3-1
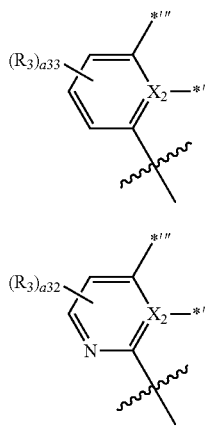

CY3-2

CY3-3
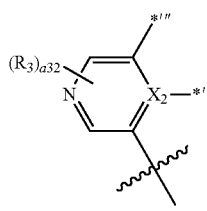

CY3-4

CY3-5
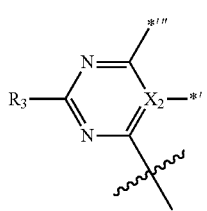

CY3-6
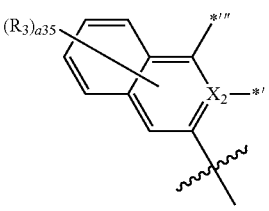

CY3-7
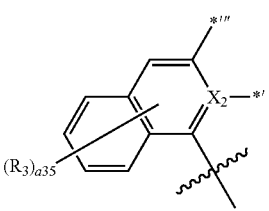

CY3-8
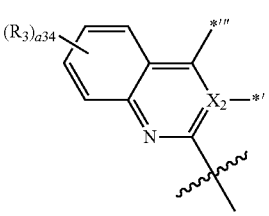

CY3-9
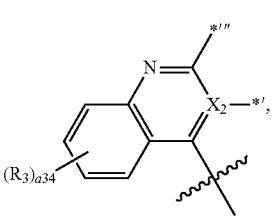

wherein, in Formulae CY3-1 to CY3-9, $X_2$ and $R_3$ are each the same as described in claim 1, a35 is an integer of 0 to 5, a34 is an integer of 0 to 4, a33 is an integer of 0 to 3, a32 is an integer of 0 to 2,

*' indicates a binding site to M of Formula 1,

*''' and

each indicate a binding site to a neighboring atom.

11. The organometallic compound of claim 1, wherein a moiety represented by

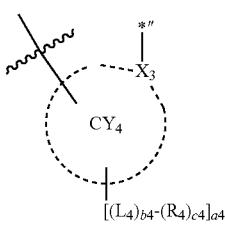

in Formula 2 is represented by one selected from Formulae CY4-1 to CY4-40:
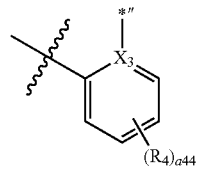 CY4-1
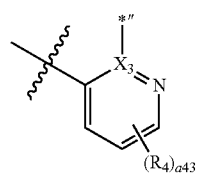 CY4-2
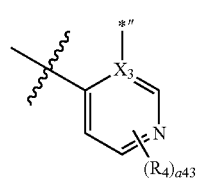 CY4-3
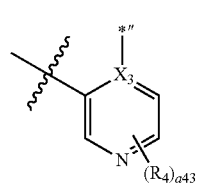 CY4-4
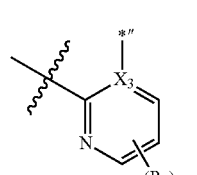 CY4-5
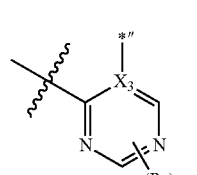 CY4-6
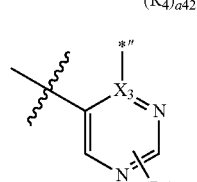 CY4-7
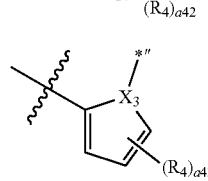 CY4-8
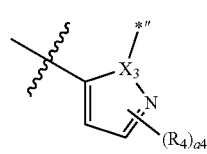 CY4-9
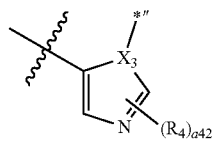 CY4-10
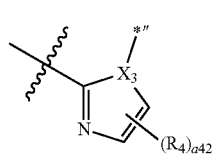 CY4-11
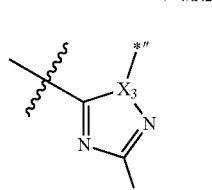 CY4-12
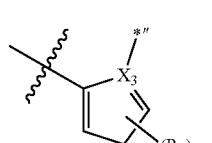 CY4-13
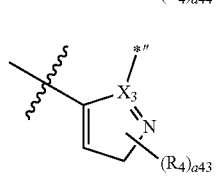 CY4-14
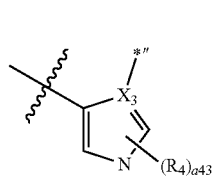 CY4-15
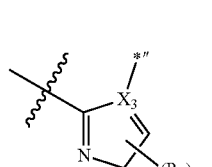 CY4-16
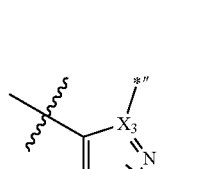 CY4-17
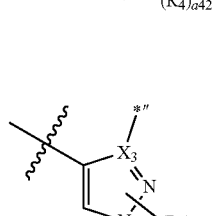 CY4-18

CY4-19
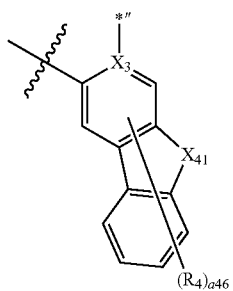
CY4-20
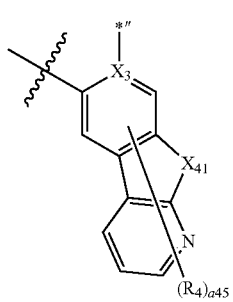
CY4-21
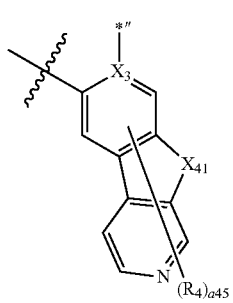
CY4-22
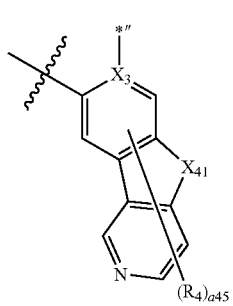
CY4-23
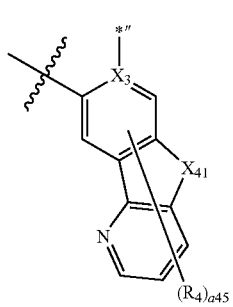
CY4-24
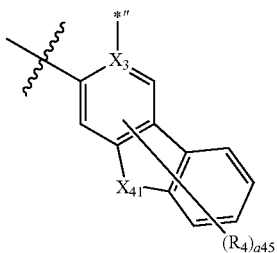
CY4-25
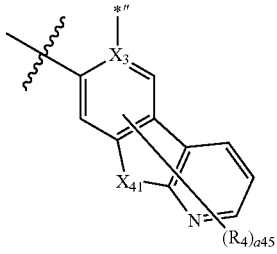
CY4-26
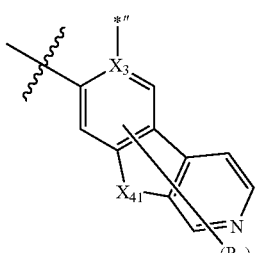
CY4-27
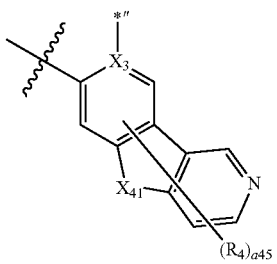
CY4-28
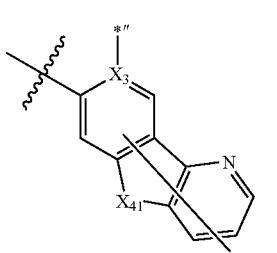
CY4-29
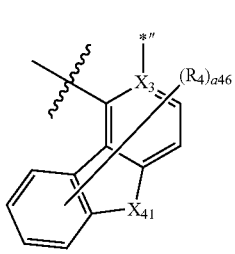

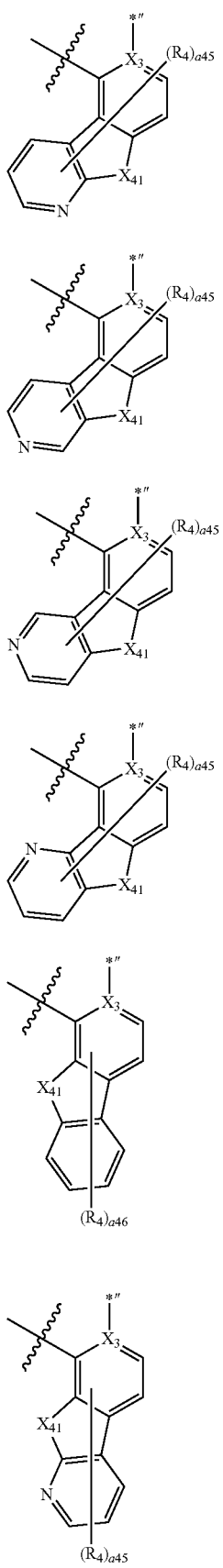
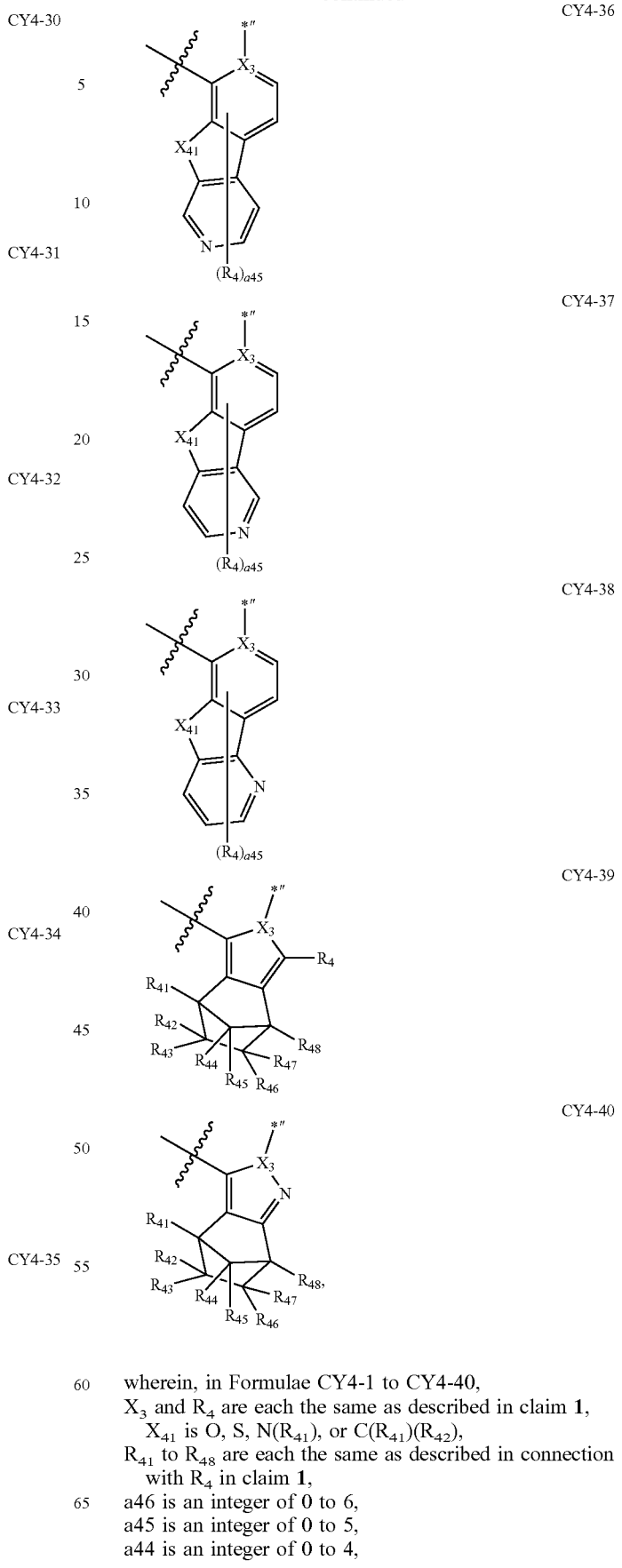
wherein, in Formulae CY4-1 to CY4-40,
X$_3$ and R$_4$ are each the same as described in claim 1,
X$_{41}$ is O, S, N(R$_{41}$), or C(R$_{41}$)(R$_{42}$),
R$_{41}$ to R$_{48}$ are each the same as described in connection with R$_4$ in claim 1,
a46 is an integer of 0 to 6,
a45 is an integer of 0 to 5,
a44 is an integer of 0 to 4, a43 is an integer of 0 to 3,
a42 is an integer of 0 to 2,
*''' indicates a binding site to M of Formula 1, and

indicates a binding site to a neighboring atom.

12. The organometallic compound of claim 1, wherein a moiety represented by

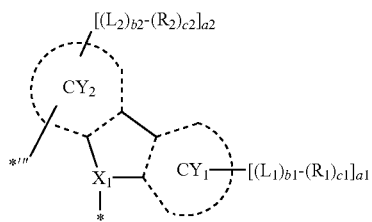

in Formula 2 is represented by Formula CY1(1),
a moiety represented by

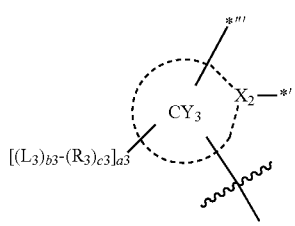

in Formula 2 is represented by one selected from Formula CY3(1) to CY3(11), and
a moiety represented by

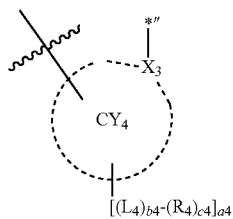

in Formula 2 is represented by one selected from Formulae CY4(1) to CY4(23):

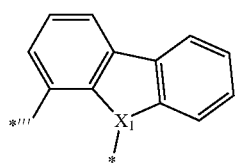
CY1(1)

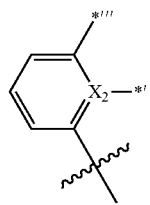
CY3(1)

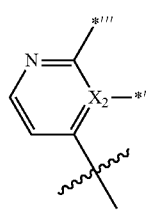
CY3(2)

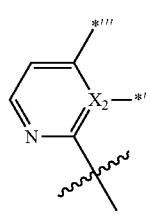
CY3(3)

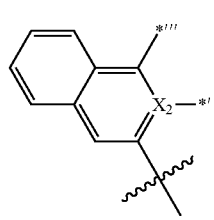
CY3(4)

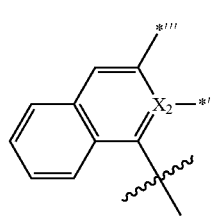
CY3(5)

CY3(6)

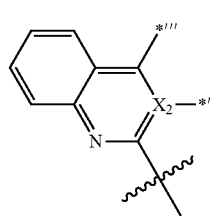
CY3(7)

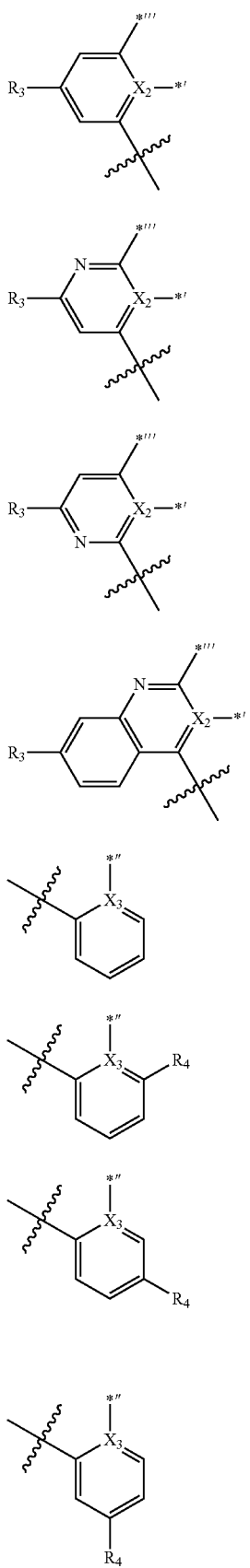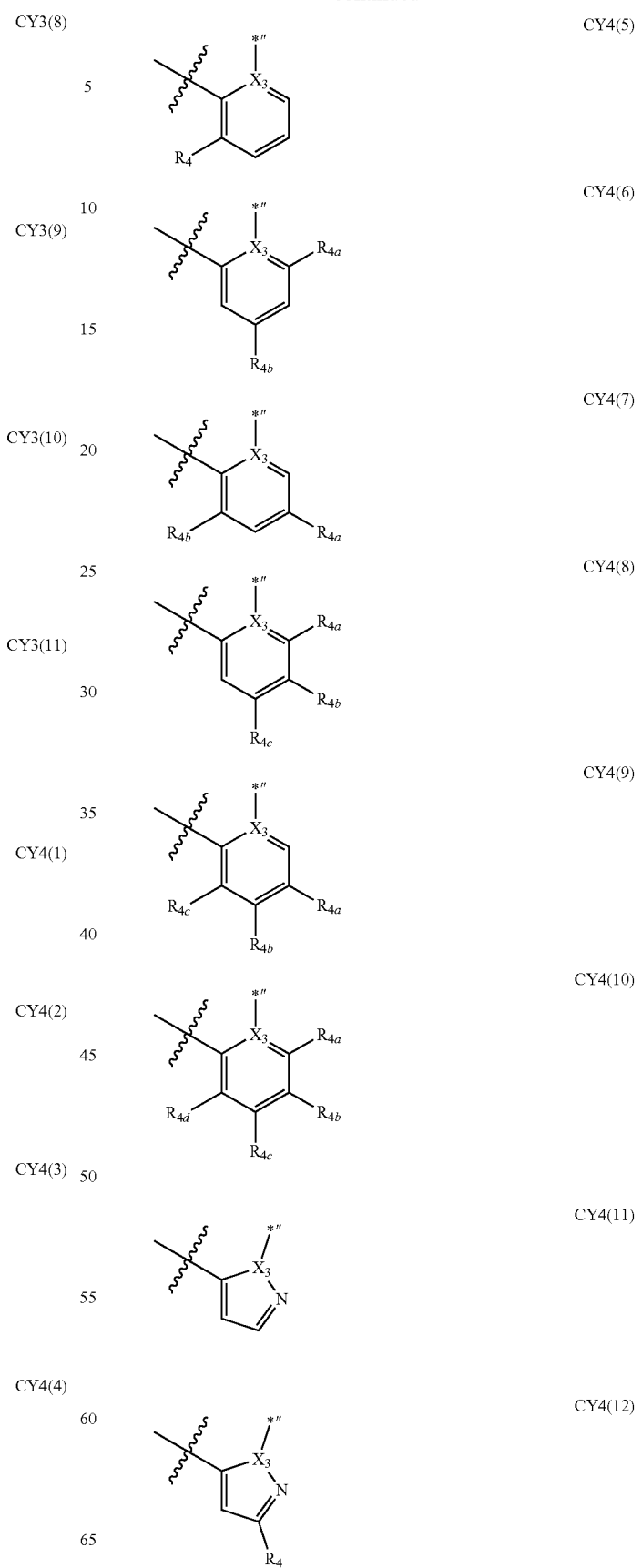

CY4(13) 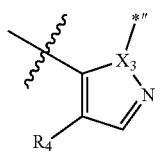

CY4(14) 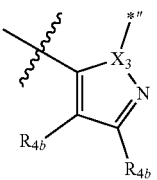

CY4(15) 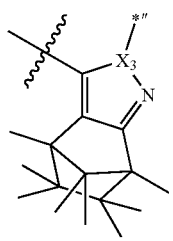

CY4(16) 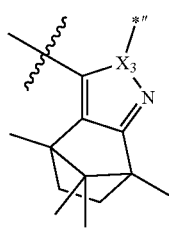

CY4(17) 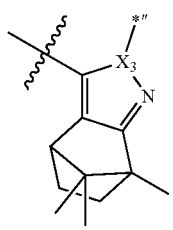

CY4(18) 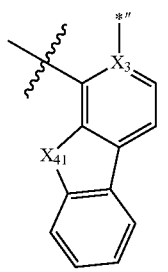

CY4(19) 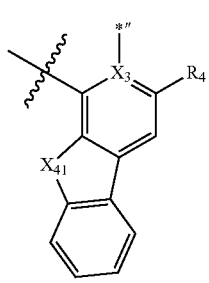

CY4(20) 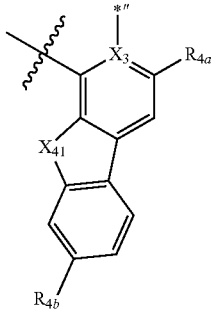

CY4(21) 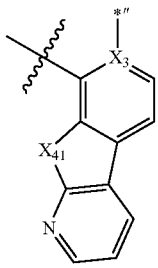

CY4(22) 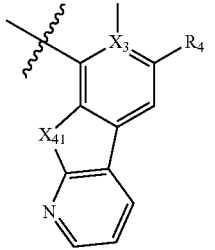

CY4(23) 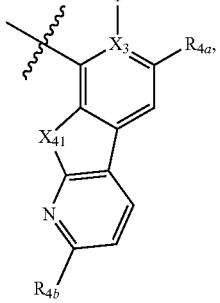

wherein, in Formulae CY1(1), CY3(1) to CY3(11), and CY4(1) to CY4(23), $X_1$ to $X_3$, $R_3$, and $R_4$ are each the same as described in claim 1, $X_{41}$ is O, S, N($R_{41}$), or C($R_{41}$)($R_{42}$), $R_{4a}$ to $R_{4d}$, $R_{41}$, and $R_{42}$ are each independently the same as described in connection with $R_4$, provided that, $R_3$, $R_4$, $R_{4a}$ to $R_{4d}$, $R_{41}$, and $R_{42}$ are not each independently hydrogen,

*, *', and *" each independently indicate a binding site to M of Formula 1, and

*''' and

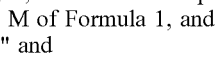

each indicate a binding site to a neighboring atom.

13. The organometallic compound of claim 1, wherein $L_{12}$ in Formula 1 is selected from ligands represented by Formulae 3A to 3D and 6-1:

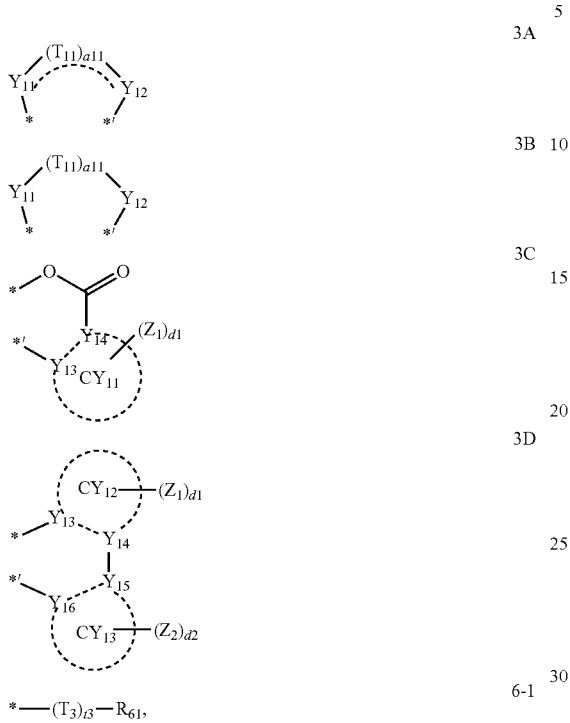

14. The organometallic compound of claim 1, wherein $L_{12}$ in Formula 1 is selected from ligands represented by Formulae 13-1 to 13-47 and 14-1 to 14-28:

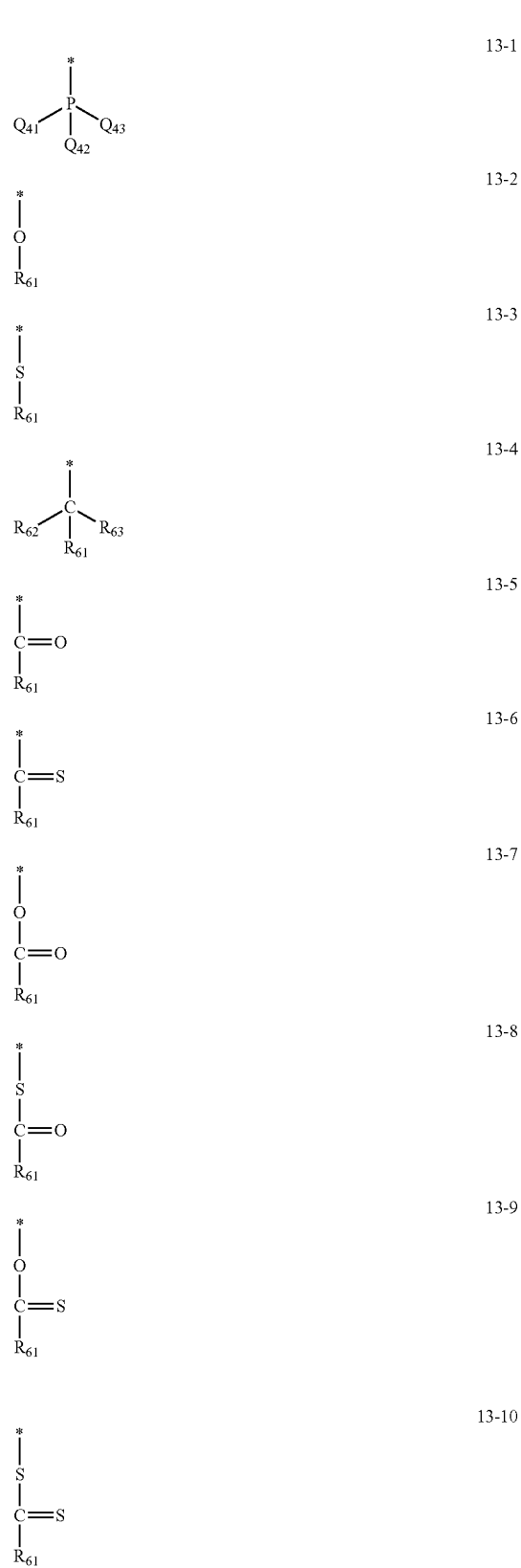

wherein, in Formulae 3A to 3D,
$Y_{11}$ is selected from O, N, N(Z1), $P(Z_1)(Z_2)$, and $As(Z_1)(Z_2)$,
$Y_{12}$ is selected from O, N, $N(Z_3)$, $P(Z_3)(Z_4)$, and $As(Z_3)(Z_4)$,
$T_{11}$ is selected from a single bond, a double bond, *—C$(Z_{11})(Z_{12})$—*', *—C$(Z_{11})$=C$(Z_{12})$—*', *=C$(Z_{11})$—*', *—C$(Z_{11})$=*', *=C(Z)—C$(Z_{12})$=C$(Z_3)$—*', *—C$(Z_{11})$=C$(Z_{12})$—C$(Z_{13})$=*', *—N$(Z_{11})$—*', and a substituted or unsubstituted $C_6$-$C_{30}$ arylene group,
a11 is an integer of 1 to 5,
$Y_{13}$ to $Y_{16}$ are each independently be C or N,
a bond between $Y_{13}$ and $Y_{14}$ is single bond or a double bond, and a bond between $Y_{15}$ and $Y_{16}$ is a single bond or a double bond,
$CY_{11}$ to $CY_{13}$ are each independently selected from a $C_5$-$C_{30}$ carbocyclic group and a $C_2$-$C_{30}$ heterocyclic group,
$Z_1$ to $Z_4$ and $Z_{11}$ to $Z_{13}$ are each independently the same as described in connection with $R_1$ in claim 1,
d1 and d2 are each independently an integer of 0 to 10,
* and *' each indicate a binding site to M of Formula 1,
in Formula 6-1,
$T_3$ is selected from a single bond, *—O—*', *—S—*', *—C$(R_{62})(R_{63})$—*', *—C$(R_{62})$=*', *=C$(R_{62})$—*', *—C$(R_{62})$=C$(R_{63})$—*', *—C(=O)—*', *—C(=S)—*', *—C≡C—*', and *—N$(R_{62})$—*',
t3 is an integer of 1 to 5,
$R_{61}$ to $R_{63}$ are each independently the same as described in connection with $R_1$ in claim 1, or are each independently —$P(Q_{41})(Q_{42})(Q_{43})$,
$Q_{41}$ to $Q_{43}$ are each independently the same as described in connection with $R_1$ in claim 1, and
* indicates a binding site to M of Formula 1.

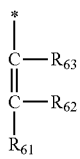
13-11
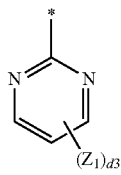
13-19
13-12
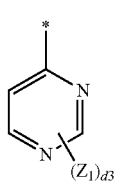
13-20
13-13
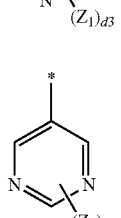
13-21
13-14
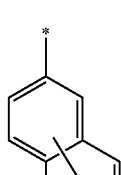
13-22
13-15
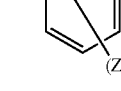
13-23
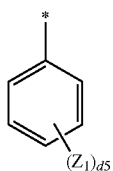
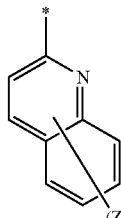
13-23
13-16
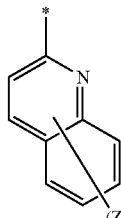
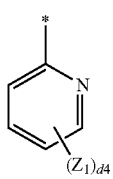
13-17
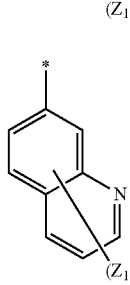
13-24
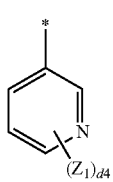
13-18
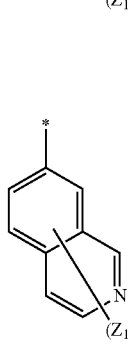
13-25
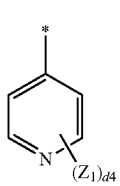

13-26 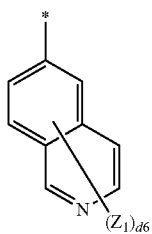
13-27 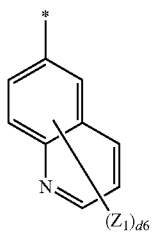
13-28 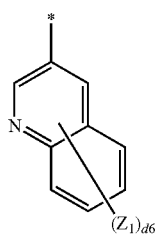
13-29 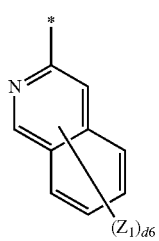
13-30 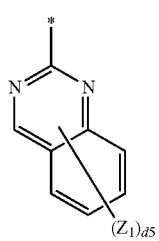
13-31 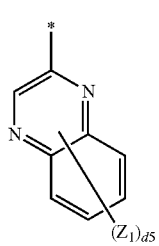
13-32 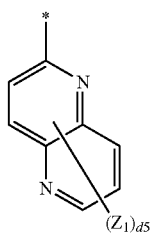
13-33 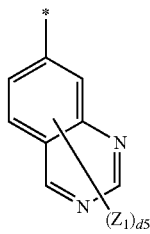
13-34 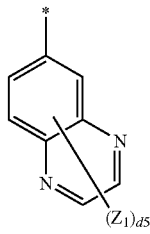
13-35 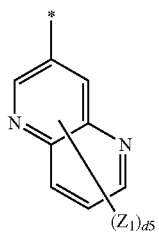
13-36 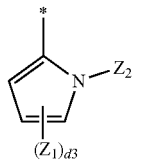
13-37 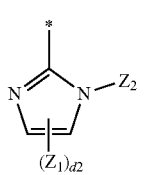
13-38 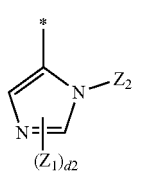

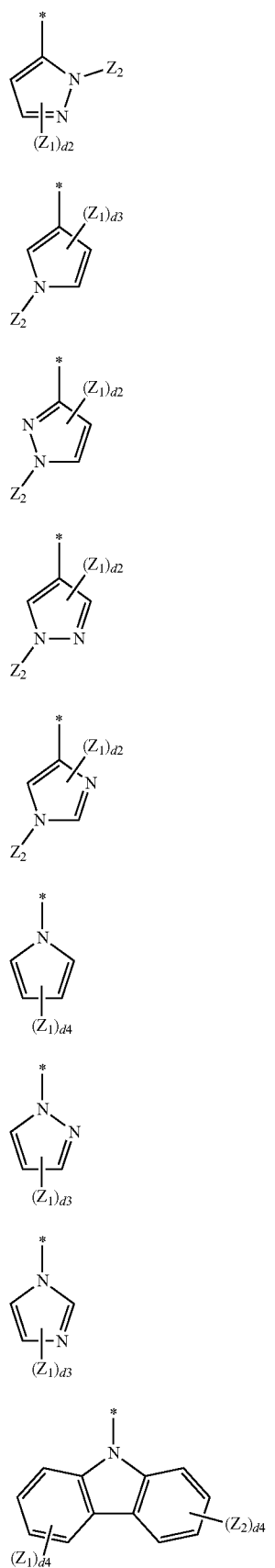
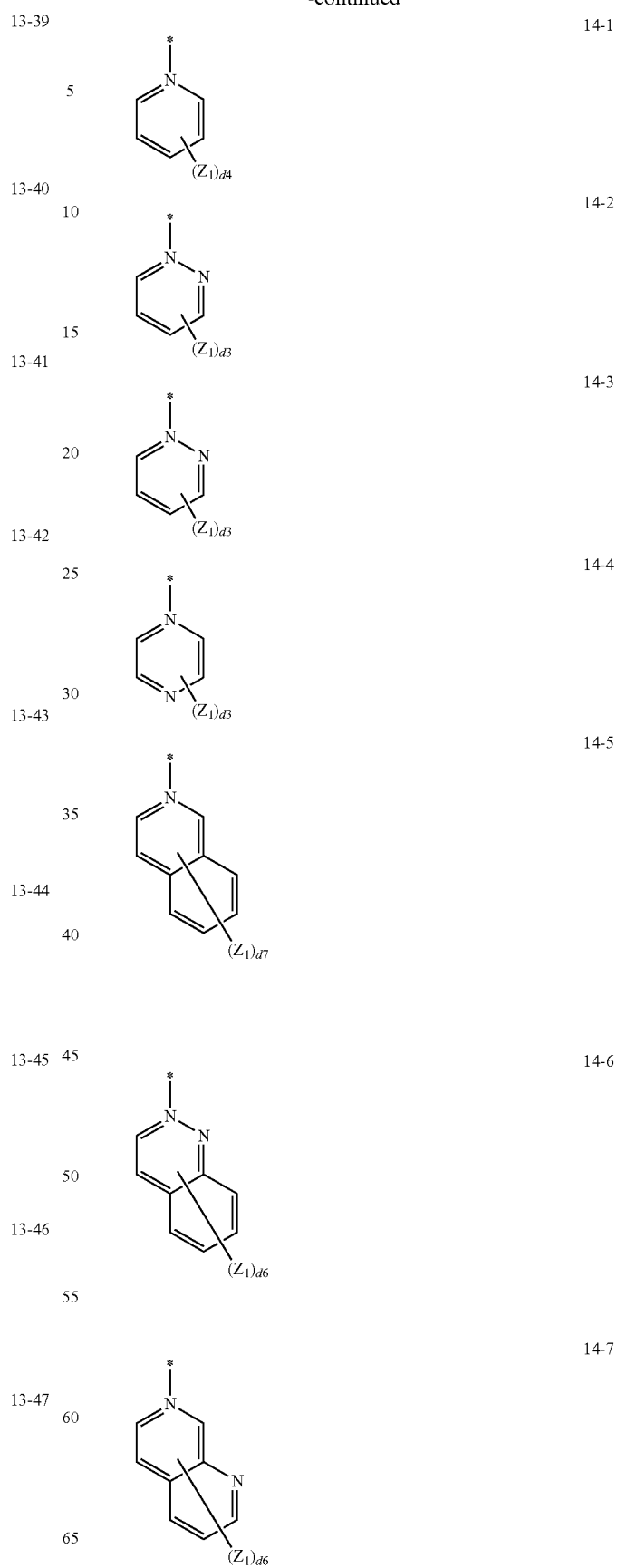

173
-continued
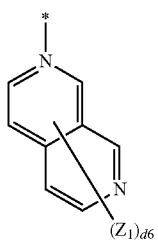
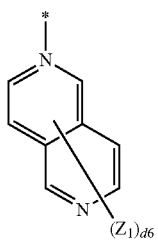
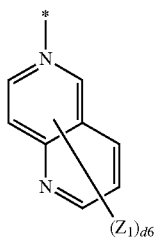
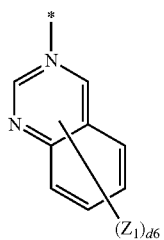
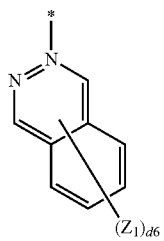
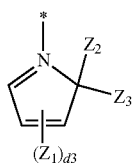
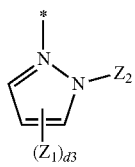
174
-continued
14-8
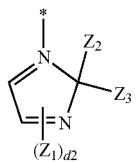
14-9
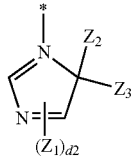
14-10
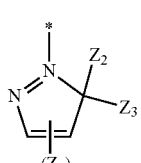
14-11
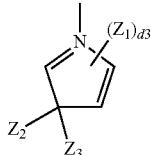
14-12
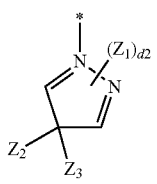
14-13
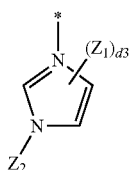
14-14
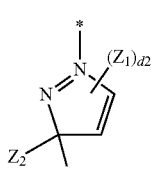
14-15
14-16
14-17
14-18
14-19
14-20
14-21
14-22
14-23
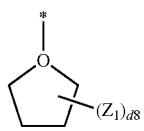

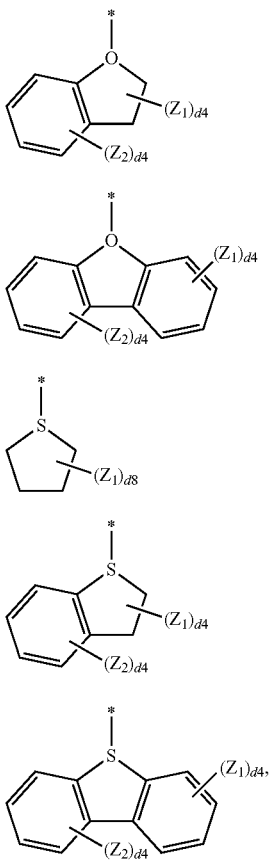

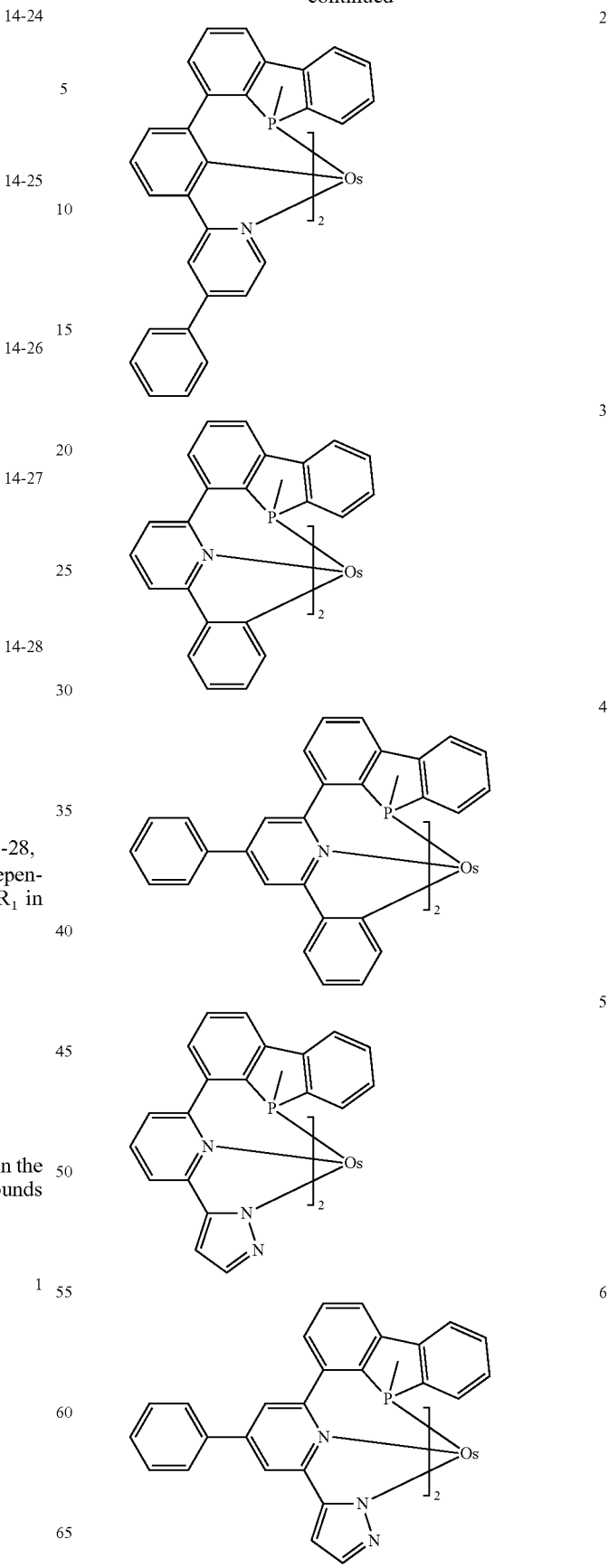

wherein, in Formulae 13-1 to 13-47 and 14-1 to 14-28,
R₆₁ to R₆₃, Q₄₁ to Q₄₃, and Z₁ to Z₃ are each independently the same as described in connection with R₁ in claim 1,
d2 is an integer of 0 to 2,
d3 is an integer of 0 to 3,
d4 is an integer of 0 to 4,
d5 is an integer of 0 to 5,
d6 is an integer of 0 to 6,
d7 is an integer of 0 to 7,
d8 is an integer of 0 to 8, and
* indicates a binding site to M of Formula 1.

15. The organometallic compound of claim 1, wherein the organometallic compound is one selected from Compounds 1 to 46:

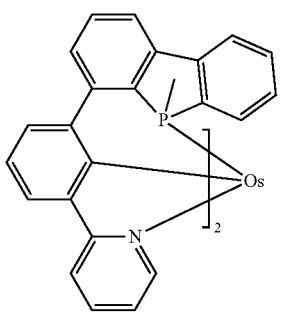

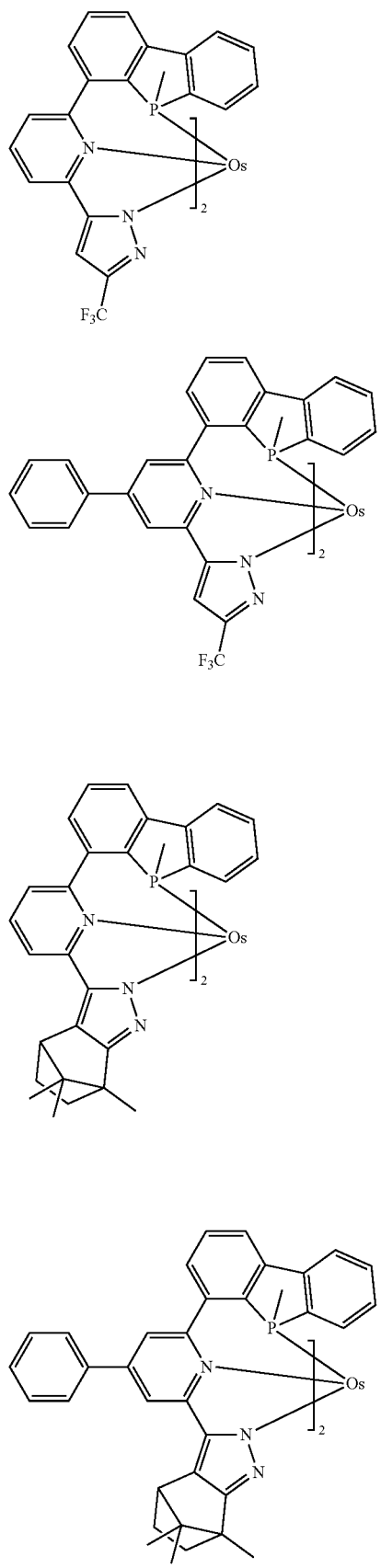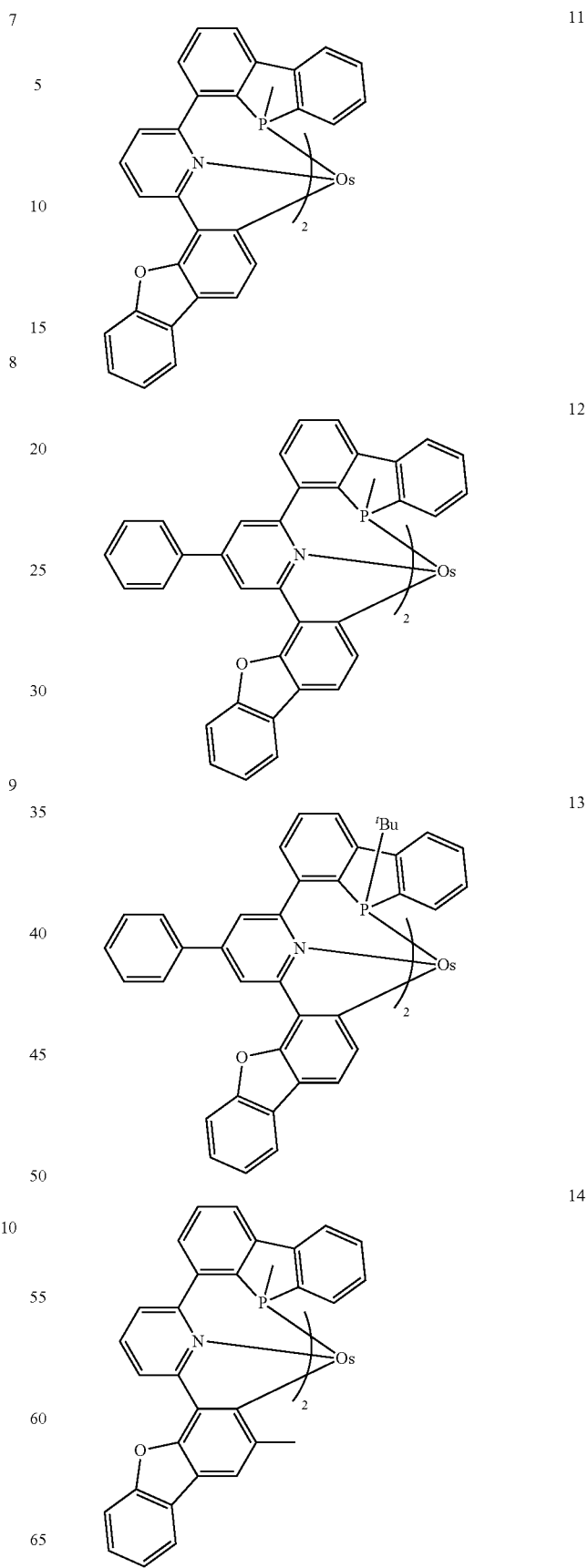

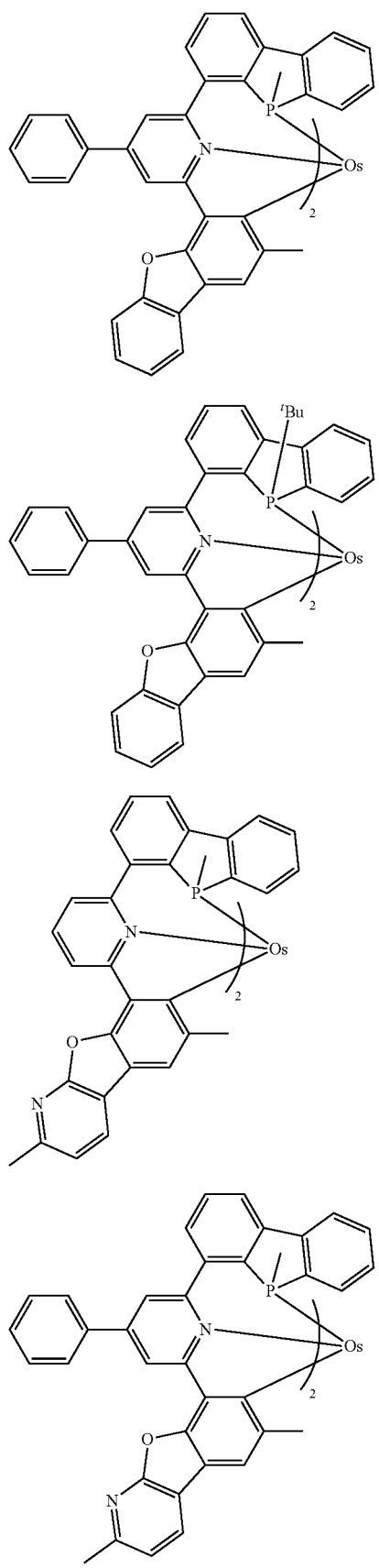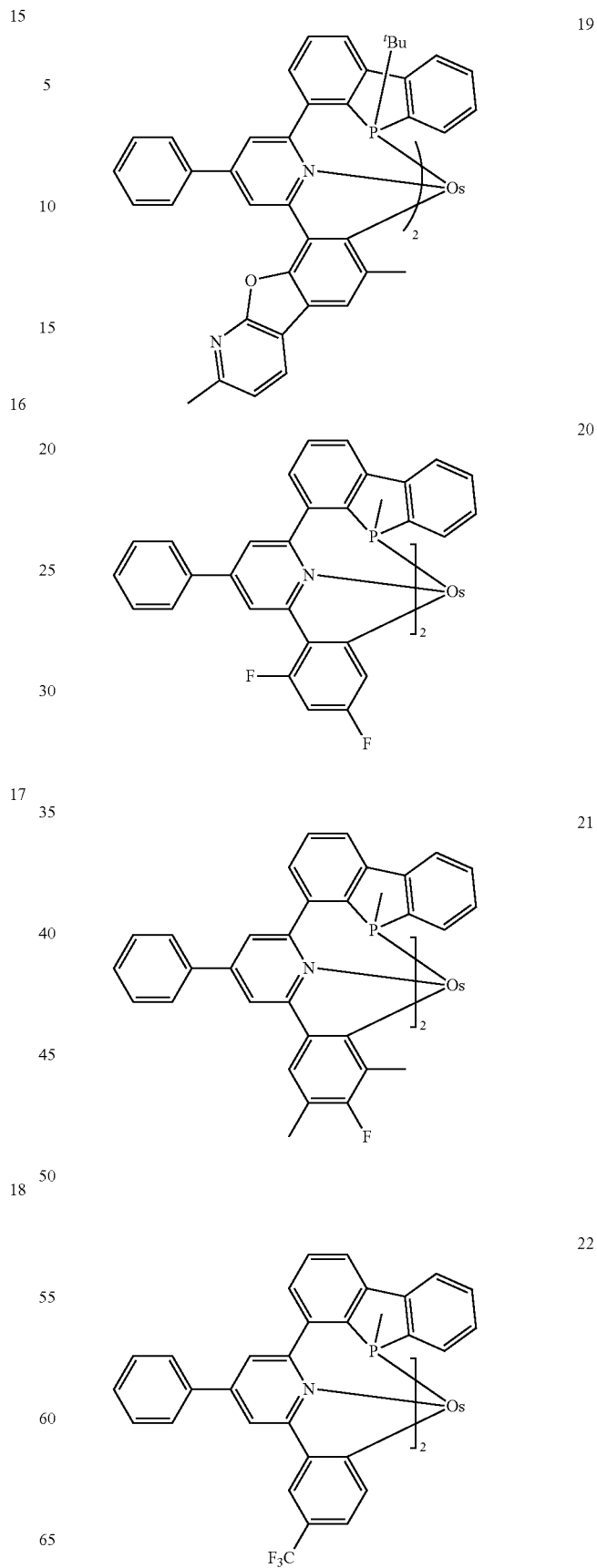

-continued
23
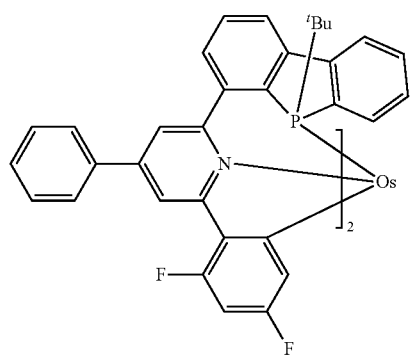
24
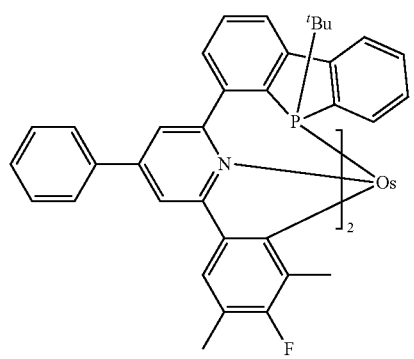
25
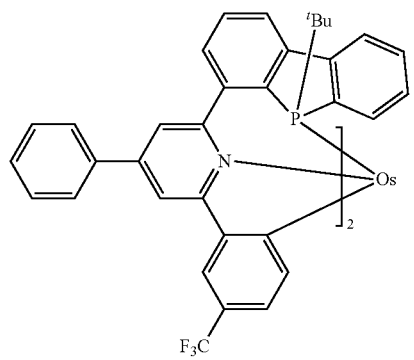
26
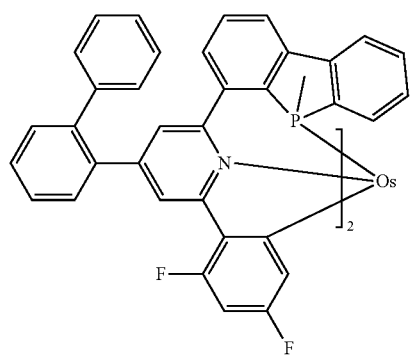
-continued
27
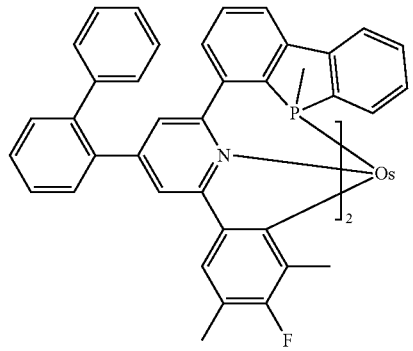
28
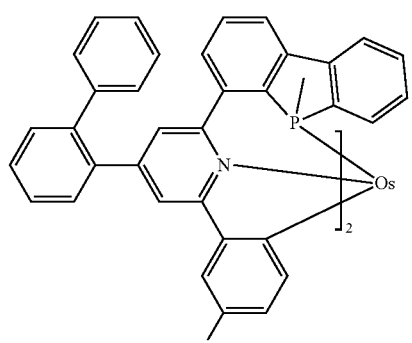
29
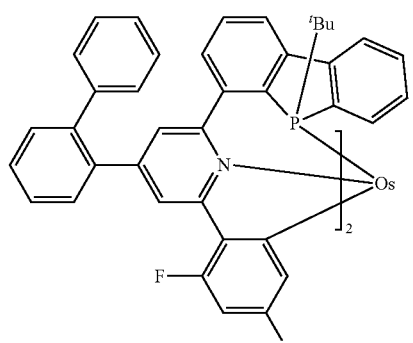
30
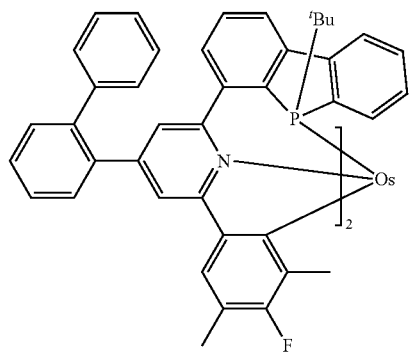

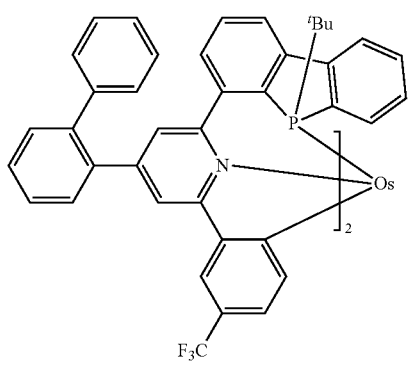
31
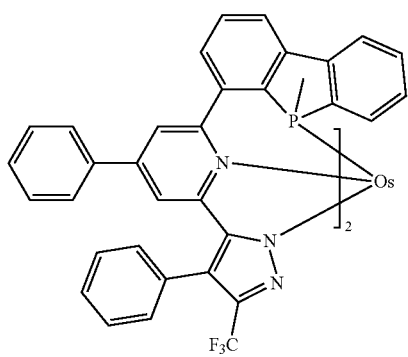
32
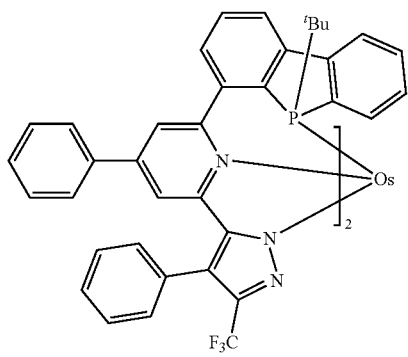
33
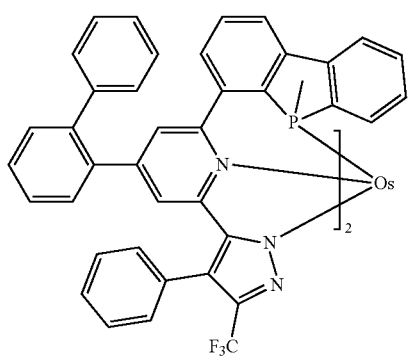
34
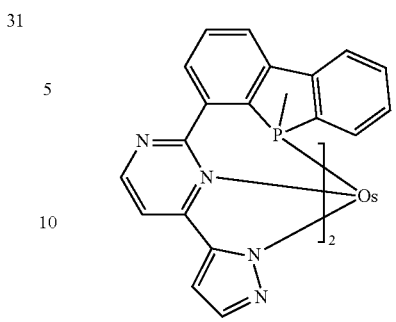
35
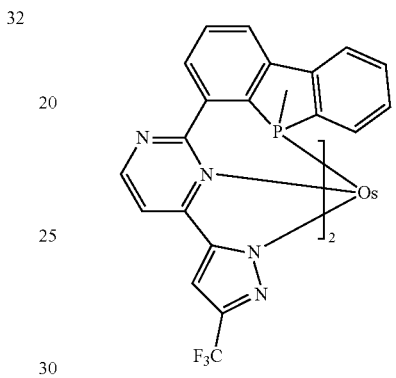
36
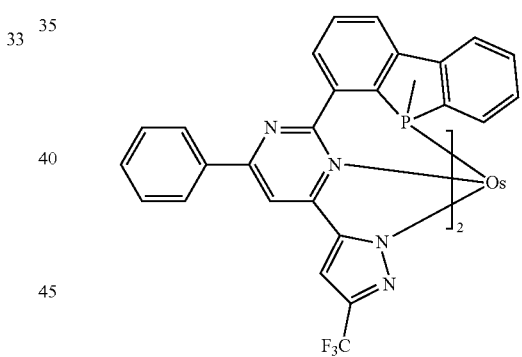
37
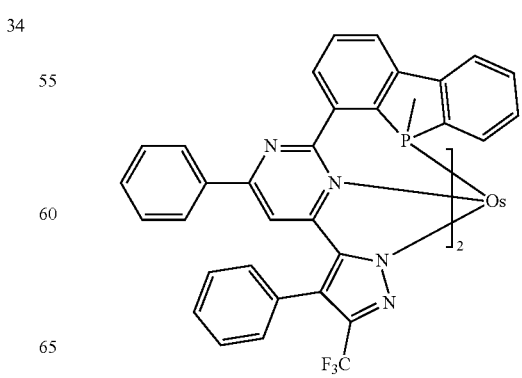
38

39 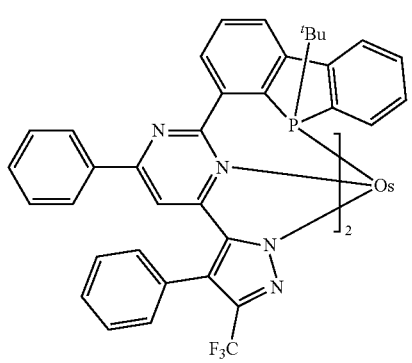
40 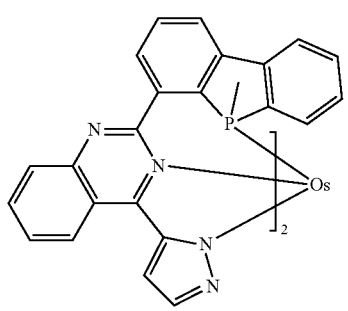
41 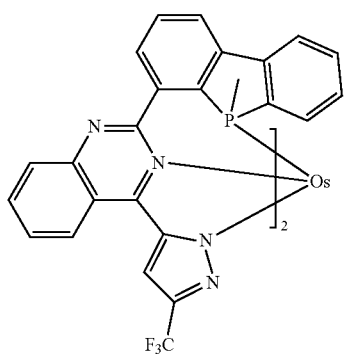
42 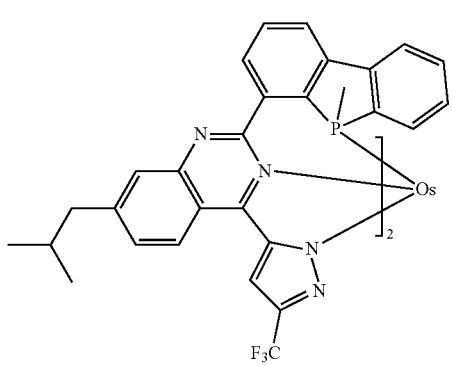
43 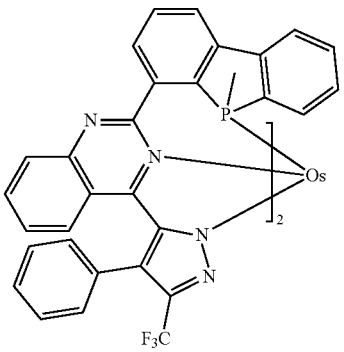
44 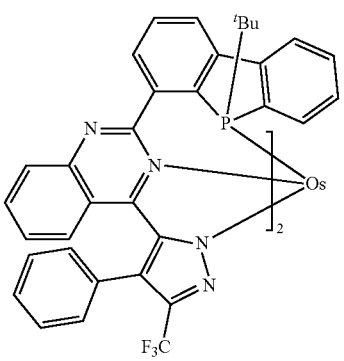
45 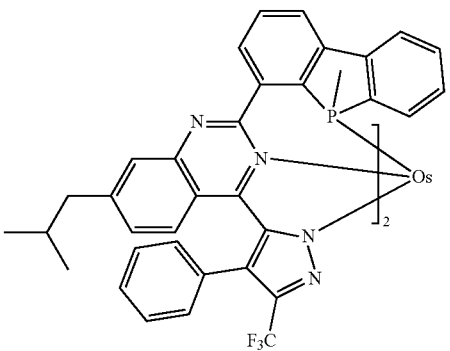
46 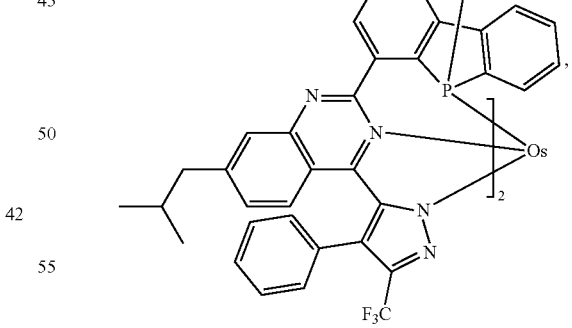
wherein, in Compounds 1 to 46, "$^t$Bu" indicates a tert-butyl group.
16. An organic light-emitting device, comprising:
a first electrode,
a second electrode, and
an organic layer disposed between the first electrode and the second electrode,
wherein the organic layer comprises an emission layer and at least one organometallic compound of claim 1.

17. The organic light-emitting device of claim 16, wherein
the first electrode is an anode,
the second electrode is a cathode, and
the organic layer further comprises a hole transport region disposed between the first electrode and the emission layer and an electron transport region disposed between the emission layer and the second electrode,
wherein the hole transport region comprises a hole injection layer, a hole transport layer, an electron blocking layer, or any combination thereof, and
wherein the electron transport region comprises a hole blocking layer, an electron transport layer, an electron injection layer, or any combination thereof.

18. The organic light-emitting device of claim 16, wherein the emission layer comprises the organometallic compound.

19. The organic light-emitting device of claim 18, wherein the emission layer further comprises a host, and wherein an amount of the host is greater than that of the organometallic compound.

20. A diagnostic composition comprising at least one of the organometallic compound of claim 1.

\* \* \* \* \*